United States Patent
Watanabe et al.

(10) Patent No.: US 6,384,169 B1
(45) Date of Patent: *May 7, 2002

(54) STYRENE POLYMER, CHEMICALLY AMPLIFIED POSITIVE RESIST COMPOSITION AND PATTERNING PROCESS

(75) Inventors: Osamu Watanabe; Shimada Junji; Nagura Shigehiro; Takeda Takanobu, all of Nakakubiki-gun (JP)

(73) Assignee: Shin-Etsu Chemical Co., Ltd., Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/167,559

(22) Filed: Oct. 7, 1998

(30) Foreign Application Priority Data

Oct. 8, 1997 (JP) ................................................ 9-291677

(51) Int. Cl.$^7$ ........................ C08F 212/14; C08F 210/00
(52) U.S. Cl. ........................ 526/346; 526/89; 526/347.1; 525/210; 525/216; 525/219; 525/221; 525/338; 430/270
(58) Field of Search .................. 430/270; 525/210, 525/216, 219, 221, 238; 526/346, 347.1, 89

(56) References Cited

U.S. PATENT DOCUMENTS

| | | | |
|---|---|---|---|
| 4,491,628 A | 1/1985 | Ito et al. | 430/270.1 |
| 4,603,101 A | 7/1986 | Crivello | 430/325 |
| 5,252,435 A | 10/1993 | Tani et al. | 430/270 |
| 5,310,619 A | 5/1994 | Crivello et al. | 526/313 |
| 5,324,804 A | 6/1994 | Steinmann | 526/313 |
| 5,714,559 A | 2/1998 | Schacht et al. | 526/313 |
| 5,741,629 A * | 4/1998 | Chandross et al. | 430/326 |
| 5,976,759 A * | 11/1999 | Urano et al. | 430/270.1 |
| 6,033,826 A * | 3/2000 | Urano et al. | 430/270.1 |

FOREIGN PATENT DOCUMENTS

| | | |
|---|---|---|
| EP | 0 718 316 | 6/1996 |
| EP | 0 738 744 | 10/1996 |
| JP | 62-115440 | 5/1987 |
| JP | 63-27829 | 5/1988 |
| JP | 2-27660 | 6/1990 |
| JP | 3-223858 | 10/1991 |
| JP | 4-211258 | 8/1992 |
| JP | 6-100488 | 4/1994 |
| JP | 8-253534 | 10/1996 |
| JP | 8-305025 | 11/1996 |

OTHER PUBLICATIONS

Database WPI, Section Ch. Week 9743, Derwent Pub. Ltd., Class A89, AN 97–461797 XP002090333.

Database WPI, Section Ch, Week 9735, Derwent Pub. Ltd., Class A89, AN 97–376752 XP002090334.

Patent Abstracts of Japan, vol. 095, No. 007, Aug. 31, 1995.

* cited by examiner

*Primary Examiner*—David W. Wu
*Assistant Examiner*—Tanya Zalukaeva
(74) *Attorney, Agent, or Firm*—Millen, White, Zelano & Branigan, P.C.

(57) ABSTRACT

A styrene polymer represented by formula (1), terminated with P, and having a weight average molecular

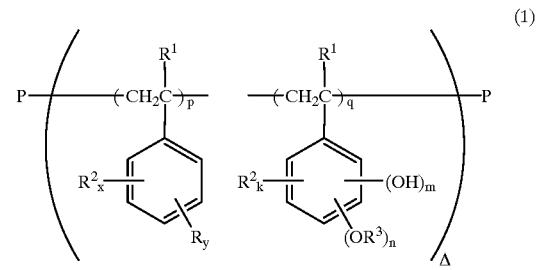

wherein R is OH or $OR^3$ $R^1$ is H or $CH_3$, $R^2$ is alkyl, $R^3$ is acid labile group, $x \geq 0$, $y > 0$, $k \geq 0$, $m \geq 0$, $n > 0$, $0 < q \leq 0.8$, $p+q=1$, P is H, alkyl, alkenyl, aromatic, carboxyl, OH, $-R^4(COR^5)_r$, $-R^4O(OH)_r$ or $-R^4(OR^5)_r$. A chemically amplified positive resist composition comprising the polymer as a base resin has high sensitivity and resolution and forms resist patterns having plasma etching resistance, heat resistance, and reproducibility.

19 Claims, No Drawings

STYRENE POLYMER, CHEMICALLY AMPLIFIED POSITIVE RESIST COMPOSITION AND PATTERNING PROCESS

BACKGROUND OF THE INVENTION

1. Field of the Invention

The present invention relates to a novel polymer having at least one type of acid labile group, terminally modified, and optionally crosslinked within a molecule and/or between molecules with crosslinking groups having C—O—C linkages. It also relates to a resist composition comprising the polymer as the base resin and a patterning process using the resist composition. This resist composition provides a much improved alkali dissolution contrast before and after exposure, high sensitivity, and high resolution, and in particular, is well reproducible as a micropatterning material for VLSI fabrication.

2. Prior Art

Deep-ultraviolet lithography, one of a number of recent efforts that are being made to achieve a finer pattern rule in the drive for higher integration and operating speeds in LSI devices, is thought to hold particular promise as the next generation in microfabrication technology. Deep-UV lithography is capable of achieving a minimum feature size of 0.5 $\mu$m or less and, when a resist having low light absorption is used, can form patterns with sidewalls that are nearly perpendicular to the substrate.

Recently developed acid-catalyzed chemically amplified positive resists, such as those described in JP-B 27660/1990, JP-A 27829/1988, U.S. Pat. No. 4,491,628 and U.S. Pat. No. 5,310,619, utilize a high-intensity KrF excimer laser as the deep-UV light source. These resists, with their excellent properties such as high sensitivity, high resolution, and good dry etching resistance, are especially promising for deep-UV lithography.

Such chemically amplified positive resists include two-component systems comprising a base resin and a photoacid generator, and three-component systems comprising a base resin, a photoacid generator, and a dissolution regulator having acid labile groups.

For example, JP-A 115440/1987 describes a resist comprising poly-4-tert-butoxystyrene and a photoacid generator, and JP-A 223858/1991 describes a similar two-component resist comprising a resin bearing tert-butoxy groups within the molecule, in combination with a photoacid generator. JP-A 211258/1992 describes a two-component resist which is comprised of polyhydroxystyrene bearing methyl, isopropyl, tert-butyl, tetrahydropyranyl, and trimethylsilyl groups, together with a photoacid generator.

JP-A 100488/1994 discloses a resist comprised of a polydihydroxystyrene derivative, such as poly[3,4-bis(2-tetrahydropyranyloxy)styrene], poly[3,4-bis(tert-butoxycarbonyloxy)styrene] or poly[3,5-bis(2-tetrahydropyranyloxy)styrene], and a photoacid generator.

However, when the base resin in these resists bears acid labile groups on side chains and these acid labile groups are groups such as tert-butyl and tert-butoxycarbonyl which are cleaved by strong acids, the resin reacts with air-borne basic compounds and loses some of its activity, as a result of which cleavage of the acid labile groups arises less readily and the resist pattern tends to take on a T-top profile. By contrast, alkoxyalkyl groups such as ethoxyethyl are cleaved by weak acids, and so are little affected by air-borne basic compounds. Yet, their use also has its drawbacks, such as considerable narrowing of the pattern configuration as the time interval between exposure and heat treatment increases. Moreover, the presence of bulky groups on the side chains lowers the thermal stability of the resin, making it impossible to achieve a satisfactory sensitivity and resolution. These problems have hitherto prevented the practical implementation of either approach, and workable solutions have been sought.

The polymers described in JP-A 305025/1996 represent an attempt to resolve the foregoing problems, but characteristics of the production process render difficult the design of substituent ratios for acid labile groups and crosslinking groups. An additional shortcoming is that the production of these compounds results in the incidental formation of the crosslinking groups mentioned in JP-A 253534/1996. That is, in the design of resist compositions, polymers having various alkali dissolution rates are required, depending on the types and amounts of photoacid generators and additives selected, in addition to which the production of these polymers must be a reproducible process. However, the production methods described in the above prior-art references are subject to inherent limitations in the selection of acid labile groups and crosslinking groups, and in their substituent ratios.

SUMMARY OF THE INVENTION

It is, therefore, an object of the present invention to provide a novel and improved polymer which can be used as the base resin to formulate a chemically amplified positive working resist composition which is superior to prior-art resists in sensitivity, resolution, exposure latitude, process flexibility and reproducibility, and which forms a resist pattern having excellent plasma etching resistance and outstanding thermal stability. Another object of the invention is to provide a chemically amplified positive working resist composition comprising the polymer and a patterning process using the resist composition.

We have found that a novel polymer bearing at least one type of acid labile group, modified at terminals, and optionally crosslinked within a molecule and/or between molecules with a crosslinking group having a C—O—C linkage can be produced by a method to be described later and is useful as a base resin. By blending this novel polymer as a base resin with a photoacid generator and optionally, a dissolution regulator and a basic compound, there is obtained a chemically amplified positive resist composition which is improved in that the dissolution contrast of a resist film is increased, especially a dissolution rate after exposure is increased. By further blending an aromatic compound having a group ≡C—COOH in a molecule, there is obtained a chemically amplified positive resist composition which is improved in that the resist is improved in PED stability and edge roughness on a nitride film substrate is improved. By further blending an acetylene alcohol derivative, the resist composition is improved in coating and storage stability, forms resists having high resolution, improved latitude of exposure, and improved process flexibility, and is well suited for practical use and advantageously used in precise microfabrication, especially in VLSI manufacture.

In a first aspect, the invention provides a styrene polymer represented by the following general formula (1), terminated with P, and having a weight average molecular weight of 1,000 to 500,000.

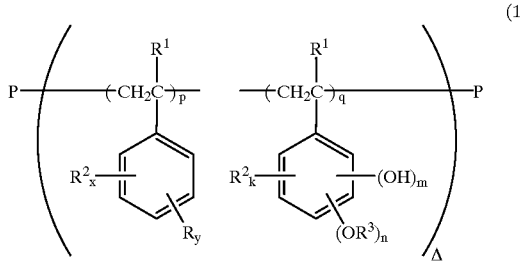
(1)

Herein, R is hydroxyl or $OR^3$ groups, at least one of R groups being hydroxyl, $R^1$ is hydrogen or methyl, $R^2$ is a normal, branched or cyclic alkyl group of 1 to 30 carbon atoms, $R^3$ is an acid labile group, letter x is 0 or a positive integer, y is a positive integer, satisfying $x+y \leq 5$, k is 0 or a positive integer, m is 0 or a positive integer, n is a positive integer, satisfying $k+m+n \leq 5$, p and q are positive numbers satisfying $0<q \leq 0.8$ and $p+q=1$, with the proviso that the $R^3$ groups may be the same or different when n is at least 2, $\Delta$ is such a number that the polymer may have a weight average molecular weight of 1,000 to 500,000, P is hydrogen, normal, branched or cyclic alkyl or alkenyl groups of 1 to 30 carbon atoms, aromatic hydrocarbon groups of 6 to 50 carbon atoms, carboxyl, hydroxyl, or groups of the following general formula (2), (3) or (4), all the terminal groups are not hydrogen at the same time,

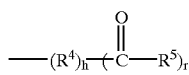
(2)

$$—R^4\!—\!(OH)_r \quad (3)$$

$$—R^4\!—\!(OR^{5a})_r \quad (4)$$

wherein $R^4$ is (r+1)-valence aliphatic hydrocarbon groups or alicyclic saturated hydrocarbon groups of 1 to 30 carbon atoms, or aromatic hydrocarbon groups of 6 to 50 carbon atoms, $R^5$ is normal, branched or cyclic alkyl groups of 1 to 30 carbon atoms, aromatic hydrocarbon groups of 6 to 50 carbon atoms, alkoxy groups of 1 to 30 carbon atoms, or hydroxyl, $R^{5a}$ is normal, branched or cyclic alkyl groups of 1 to 30 carbon atoms or aromatic hydrocarbon groups of 6 to 50 carbon atoms, letter h is 0 or 1, and letter r is a positive integer of 1 to 3.

The polymer of formula (1) may be crosslinked within a molecule and/or between molecules with a crosslinking group having a C—O—C linkage resulting from reaction of at least one of the phenolic hydroxyl groups represented by R in formula (1), the hydroxyl groups represented by $R^5$ in formula (2), and the hydroxyl groups in formula (3) with an alkenyl ether compound or halogenated alkyl ether compound, and the amount of the acid labile group and the crosslinking group combined is on the average from more than 0 mol % to 80 mol % of the entirety of hydrogen atoms in the phenolic hydroxyl groups in formula (1), the hydroxyl groups represented by $R^5$ in formula (2), and the hydroxyl groups in formula (3).

In one preferred embodiment, the polymer is represented by the following general formula (5):

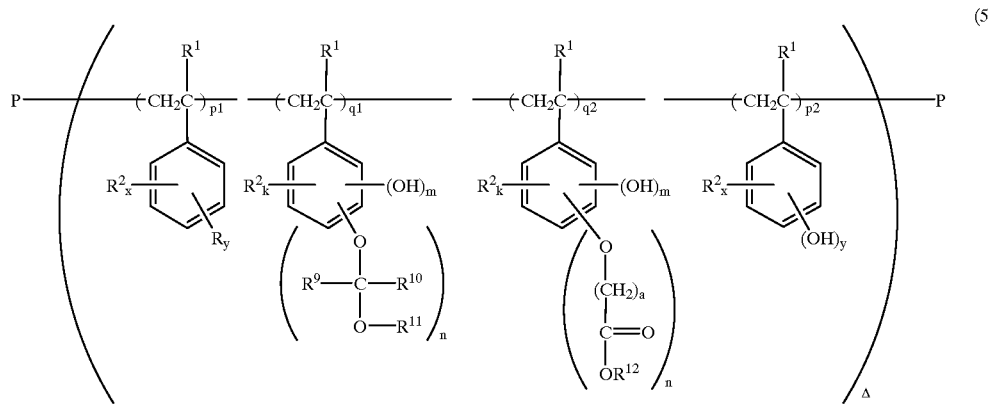
(5)

wherein R is hydroxyl or $OR^3$ groups, at least one of the R groups being hydroxyl, $R^1$ is hydrogen or methyl, $R^2$ is a normal, branched or cyclic alkyl group of 1 to 30 carbon atoms, $R^3$ is an acid labile group, $R^9$ and $R^{10}$ are hydrogen or normal, branched or cyclic alkyl groups of 1 to 8 carbon atoms, $R^{11}$ is a monovalent hydrocarbon group of 1 to 18 carbon atoms which may have a hetero atom, or $R^9$ and $R^{10}$, $R^9$ and $R^{11}$, and $R^{10}$ and $R^{11}$, taken together, may form a ring, and each of $R^9$, $R^{10}$ and $R^{11}$ is a normal or branched alkylene group of 1 to 18 carbon atoms when they form a ring, $R^{12}$ is a tertiary alkyl group of 4 to 20 carbon atoms, a trialkylsilyl group whose alkyl groups each have 1 to 6 carbon atoms, an oxoalkyl group of 4 to 20 carbon atoms, or a group represented by —CR⁹R¹⁰OR¹¹, letter a is an integer of 0 to 6, p1 and p2 are positive numbers, q1 and q2 are 0 or positive numbers, satisfying 0<p1/(p1+q1+p2+q2)≦0.8, 0≦q1/(p1+q1+p2+q2)≦0.8, 0≦q2/(p1+q1+p2+q2)≦0.8, and p1+q1+p2+q2=1, q1 and q2 are not equal to 0 at the same time, x, y, k, m, n, Δ, and P are as defined above. In this embodiment, a hydrogen atom may be eliminated from at least one of the phenolic hydroxyl groups represented by R in formula (5), the hydroxyl groups represented by R⁵ in formula (2), and the hydroxyl groups in formula (3) to leave an oxygen atom which is crosslinked with a crosslinking group having a C—O—C linkage of the following general formula (6a) or (6b) within a molecule and/or between molecules, and the amount of the acid labile group and the crosslinking group combined is on the average from more than 0 mol % to 80 mol % of the entirety of hydrogen atoms in the phenolic hydroxyl groups represented by R in formula (5), the hydroxyl groups represented by R⁵ in formula (2), and the hydroxyl groups in formula (3),

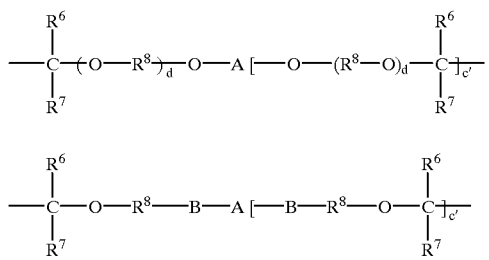

wherein R⁶ and R⁷ each are hydrogen or a normal, branched or cyclic alkyl group of 1 to 8 carbon atoms, or R⁶ and R⁷, taken together, may form a ring, with the proviso that each of R⁶ and R⁷ is a normal or branched alkylene group of 1 to 8 carbon atoms when they form a ring, R⁸ is a normal, branched or cyclic alkylene group of 1 to 10 carbon atoms, letter d is 0 or an integer of 1 to 10, A is a c-valent aliphatic or alicyclic saturated hydrocarbon group, aromatic hydrocarbon group or heterocyclic group of 1 to 50 carbon atoms, which may have an intervening hetero atom and in which the hydrogen atom attached to a carbon atom may be partially replaced by a hydroxyl group, carboxyl group, acyl group or halogen atom, B is —CO—O—, —NHCO—O— or —NHCONH—, letter c is an integer of 2 to 8, and c' is an integer of 1 to 7.

More preferably, in formula (1) or (5), R³ is at least one member selected from the group consisting of a group of the following general formula (7) or (8), a tertiary alkyl group of 4 to 20 carbon atoms, a trialkylsilyl group whose alkyl groups each have 1 to 6 carbon atoms, and an oxoalkyl group of 4 to 20 carbon atoms,

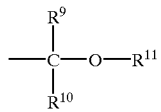

(7)

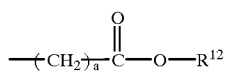

(8)

wherein R⁹ and R¹⁰ are independently hydrogen or normal, branched or cyclic alkyl groups of 1 to 8 carbon atoms, R¹¹ is a monovalent hydrocarbon group of 1 to 18 carbon atoms which may have a hetero atom, or R⁹ and R¹⁰, R⁹ and R¹¹, and R¹⁰ and R¹¹, taken together, may form a ring, and each of R⁹, R¹⁰ and R¹¹ is a normal or branched alkylene group of 1 to 18 carbon atoms when they form a ring, R¹² is a tertiary alkyl group of 4 to 20 carbon atoms, a trialkylsilyl group whose alkyl groups each have 1 to 6 carbon atoms, an oxoalkyl group of 4 to 20 carbon atoms, or a group represented by formula (7), and letter a is an integer of 0 to 6.

In the polymer according to the preferred embodiment, the crosslinking group having a C—O—C linkage represented by the general formula (6a) or (6b) is typically represented by the following general formula (6a') or (6b'):

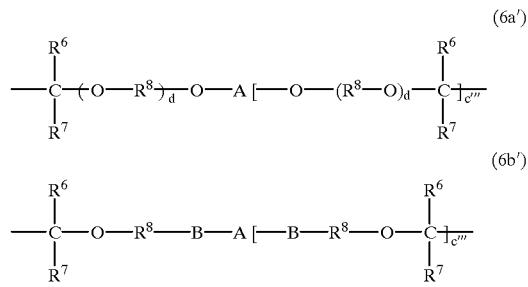

wherein R⁶ and R⁷ each are hydrogen or a normal, branched or cyclic alkyl group of 1 to 8 carbon atoms, or R⁶ and R⁷, taken together, may form a ring, with the proviso that each of R⁶ and R⁷ is a normal or branched alkylene group of 1 to 8 carbon atoms when they form a ring, R⁸ is a normal, branched or cyclic alkylene group of 1 to 10 carbon atoms, letter d is 0 or an integer of 1 to 5, A is a c"-valent normal, branched or cyclic alkylene, alkyltriyl or alkyltetrayl group of 1 to 20 carbon atoms or an arylene group of 6 to 30 carbon atoms, which may have an intervening hetero atom and in which the hydrogen atom attached to a carbon atom may be partially replaced by a hydroxyl group, carboxyl group, acyl group or halogen atom, B is —CO—O—, —NHCO—O— or —NHCONH—, letter c" is an integer of 2 to 4, and c'" is an integer of 1 to 3.

In a second aspect, the invention provides a chemically amplified positive resist composition comprising (A) an organic solvent, (B) a base resin in the form of the polymer of any one of claims 1 to 4, and (C) a photoacid generator.

The resist composition may further include (D) another base resin in the form of a polymer comprising recurring units of the following general formula (9), some of the hydrogen atoms of phenolic hydroxyl groups therein being replaced by acid labile groups of at least one type in an average proportion of 0 mol % to 80 mol % of the entirety, said polymer having a weight average molecular weight of 3,000 to 300,000.

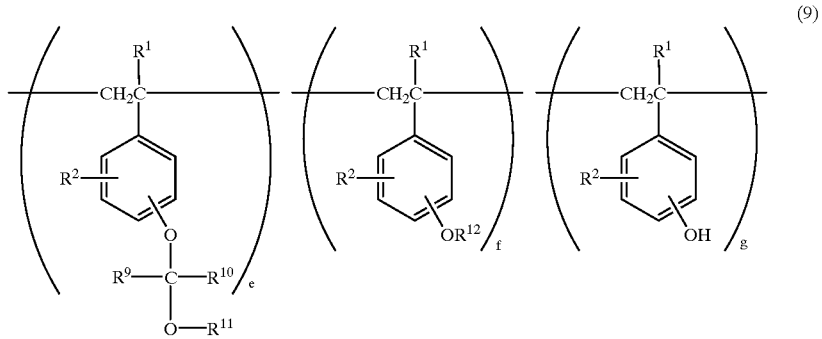

(9)

Herein, $R^1$, $R^2$, $R^9$, $R^{10}$, and $R^{11}$ are as defined above, $R^{12}$ is an acid labile group different from the —$CR^9R^{10}OR^{11}$, e and f are 0 or positive numbers, g is a positive number, satisfying $e+f+g=1$, $0 \leq e/(e+f+g) \leq 0.5$, and $0.4 \leq g/(e+f+g) \leq 0.9$. The polymer of formula (9) may be crosslinked within a molecule and/or between molecules with crosslinking groups having C—O—C linkages resulting from reaction of phenolic hydroxyl groups therein with an alkenyl ether compound or halogenated alkyl ether compound, and the amount of the acid labile group and the crosslinking group combined is on the average from more than 0 mol % to 80 mol % of the entirety of hydrogen atoms in the phenolic hydroxyl groups in formula (9) wherein $e=0$, $f=0$ and $g=1$.

The resist composition may further include one or more of the following components: (E) a dissolution regulator, (F) a basic compound, (G) an aromatic compound having a group: ≡C—COOH in a molecule, (H) a UV absorber, and (I) an acetylene alcohol derivative.

In a third aspect, the invention provides a process for forming a resist pattern comprising the steps of:
  (i) applying a chemically amplified positive resist composition as set forth above onto a substrate,
  (ii) heat treating the coated film and then exposing it to actinic radiation having a wavelength of up to 300 nm or electron beams through a photo mask, and
  (iii) optionally heat treating the exposed film and developing it with a developer.

The polymer of the invention is characterized by the terminal modification of polyhydroxystyrene derivatives. When the terminally modified polymer is blended as the base resin in a chemically amplification type positive resist composition, the properties of the composition are improved over conventional base resins owing to the effects of the end groups of the polymer. For example, termination of the polymer with carboxylic acid leads to an improvement in environmental stability. By terminating with alcohol, the polymer becomes hydrophilic and improved in adhesion to the substrate. Additionally, the dissolution rate of over-exposed areas is increased over conventional base resins, leading to a further increase of alkali dissolution rate contrast before and after exposure.

Like side chains, end groups of the polymer may be crosslinked with crosslinking groups having C—O—C linkages. When terminals of polyhydroxystyrene are crosslinked, there results linear crosslinking, which contributes to a further increase in the dissolution rate of over-exposed areas over conventional base resins, leading to a yet further increase of alkali dissolution rate contrast before and after exposure.

More particularly, in the case of a polymer in which alkoxyalkyl groups alone have been added to the phenolic hydroxyl groups on side chains, a T-top profile does not readily arise because the elimination reaction proceeds in weak acid. However, since the polymer is very sensitive to acids as noted above, the pattern profile narrows dramatically with the lapse of time between exposure and heat treatment. Moreover, because of low alkali dissolution inhibiting effects, a highly substituted polymer must be used to achieve an acceptable dissolution contrast, but this results in a poor thermal stability. On the other hand, when a polymer in which phenolic hydroxyl groups on side chains are protected with tert-butoxycarbonyl groups is included in the resist composition, the alkali dissolution inhibiting effects improve, as a result of which dissolution contrast is achieved at a low substitution ratio and the thermal stability is good. However, deprotection to render the polymer alkali soluble requires a photoacid generator which generates a strong acid such as trifluoromethane-sulfonic acid. Unfortunately, the use of such a strong acid tends to result in the T-top profile mentioned earlier.

As opposed to the above-described two types of polymers, a polymer which is terminally modified and optionally, crosslinked within a molecule and/or between molecules with crosslinking groups having C—O—C linkages and resulting from the reaction of at least one of the phenolic hydroxyl groups in the polymer, the hydroxyl groups represented by $R^5$ in formula (2), and the hydroxyl groups in formula (3) with an alkenyl ether compound or a halogenated alkyl ether compound provides a solution to both the low heat resistance of the polymers having side chains protected with acetal groups as well as the tendency of the polymers protected with tert-butoxycarbonyl groups to form a T-top profile.

The polymer used in the chemically amplified positive resist composition according to the invention has further advantages. When the inventive polymer is crosslinked with a crosslinking group having an acid labile C—O—C linkage and protected with an acid labile group, unexposed areas of a resist film remain unchanged with respect to weight average molecular weight and solubility in alkaline developer whereas the weight average molecular weight of exposed areas is restored to the weight average molecular weight of alkali soluble base resin prior to the protection with the crosslinking and acid labile groups, through cleavage by the generated acid and further through elimination of the acid labile group. Then the rate of alkali dissolution in the exposed areas is significantly increased as compared with the unexposed areas, resulting in an increased dissolution contrast. As a consequence, high resolution is achieved. Especially when the polymer is crosslinked at terminals, the dissolution rate of over-exposed areas is increased, leading to a further increase of alkali dissolution rate contrast before and after exposure.

When the crosslinking groups having C—O—C linkages are cleaved by the acid, alcohol compounds (including diol, triol and polyol compounds) are formed. The hydrophilic groups of the alcohol compounds increase the affinity of the resist to the alkali developer, which also helps to achieve a higher resolution.

Further, on the design of a resist composition, a variety of polymers having a varying alkali dissolution rate are required so as to comply with the type and amount of a particular photoacid generator and additive. It is also required to prepare such polymers in a reproducible manner. The use of the inventive polymer allows a freedom of design by eliminating the limit on the selection of an acid labile group and crosslinking group and the limit on a degree of substitution.

More specifically, a chemically amplified positive resist composition using the inventive polymer as a base resin minimizes the problems of T-top profile forming tendency, pattern configuration thinning and low heat resistance found in the prior art and increases the dissolution contrast of a resist film. As a consequence, the chemically amplified positive resist composition has high sensitivity, high resolution, allows the size and configuration of a pattern to be controlled in terms of composition, and offers improved process adaptability and reproducibility.

DETAILED DESCRIPTION OF THE INVENTION

Polymer

The novel polymer of the present invention is a high molecular weight compound which has at least one type of acid labile group, modified at terminals, and has a weight average molecular weight of 1,000 to 500,000. It may be crosslinked within a molecule and/or between molecules with a crosslinking group having a C—O—C linkage.

The styrene polymer of the invention has recurring units of the following general formula (1-i) and is terminated with P. That is, the polymer is represented by the following general formula (1).

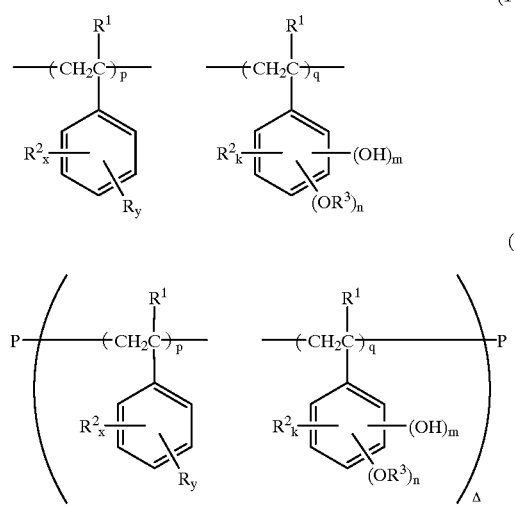

In the formulas, R is hydroxyl or $OR^3$ groups, at least one of R groups being hydroxyl, $R^1$ is hydrogen or methyl, $R^2$ is a normal, branched or cyclic alkyl group of 1 to 30 carbon atoms, $R^3$ is an acid labile group, letter x is 0 or a positive integer, y is a positive integer, satisfying x+y≦5, k is 0 or a positive integer, m is 0 or a positive integer, n is a positive integer, satisfying k+m+n≦5, p and q are positive numbers satisfying 0<q≦0.8 and p+q=1, with the proviso that the $R^3$ groups may be the same or different when n is at least 2, Δ is such a number that the polymer may have a weight average molecular weight of 1,000 to 500,000, and P is hydrogen, normal, branched or cyclic alkyl or alkenyl groups of 1 to 30 carbon atoms, aromatic hydrocarbon groups of 6 to 50 carbon atoms, carboxyl, hydroxyl, or groups of the following general formula (2), (3) or (4), with the proviso that all the end groups are not hydrogen at the same time.

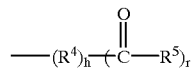 (2)

—$R^4$—(OH)$_r$ (3)

—$R^4$—(OR$^{5a}$)$_r$ (4)

In the formulas, $R^4$ is (r+1)-valence aliphatic hydrocarbon groups or alicyclic saturated hydrocarbon groups of 1 to carbon atoms, or aromatic hydrocarbon groups of 6 to 50 carbon atoms, $R^5$ is normal, branched or cyclic alkyl groups of 1 to 30 carbon atoms, aromatic hydrocarbon groups of 6 to 50 carbon atoms, alkoxy groups of 1 to 30 carbon atoms, or hydroxyl, $R^{5a}$ is normal, branched or cyclic alkyl groups of 1 to 30 carbon atoms or aromatic hydrocarbon groups of 6 to 50 carbon atoms, letter h is 0 or 1, and letter r is a positive integer of 1 to 3.

The polymer of formula (1) may be crosslinked within a molecule and/or between molecules with a crosslinking group having a C—O—C linkage resulting from reaction of at least one of the phenolic hydroxyl groups represented by R in formula (1), the hydroxyl groups represented by $R^5$ in formula (2), and the hydroxyl groups in formula (3) with an alkenyl ether compound or halogenated alkyl ether compound. The amount of the acid labile group and the crosslinking group combined is on the average from more than 0 mol % to 80 mol % of the entirety of hydrogen atoms in the phenolic hydroxyl groups in formula (1), the hydroxyl groups represented by $R^5$ in formula (2), and the hydroxyl groups in formula (3).

In formula (1), R is hydroxyl or $OR^3$ groups, and at least one R group is hydroxyl. $R^1$ is hydrogen or methyl. $R^2$ represents normal, branched or cyclic alkyl groups of 1 to 30 carbon atoms, preferably 1 to 15 carbon atoms, more preferably 1 to 8 carbon atoms. Examples of the normal, branched or cyclic alkyl group include methyl, ethyl, propyl, isopropyl, n-butyl, isobutyl, tert-butyl, cyclohexyl and cyclopentyl. $R^3$ is an acid labile group. Letter x is 0 or a positive integer, y is a positive integer, satisfying x+y≦5. Preferably, y is 1 to 3, more preferably 1 or 2. Letter k is 0 or a positive integer, m is 0 or a positive integer, n is a positive integer, satisfying k+m+n≦5. Preferably, n is 1 or 2 and m is 0 or 1. The $R^3$ groups may be the same or different when n is 2 or more. Letters p and q are positive numbers satisfying 0<q≦0.8 and p+q=1.

P is hydrogen, normal, branched or cyclic alkyl or alkenyl groups of 1 to 30 carbon atoms, preferably 1 to 15 carbon atoms, more preferably 1 to 8 carbon atoms, aromatic hydrocarbon groups of 6 to 50 carbon atoms, preferably 6 to 30 carbon atoms, more preferably 6 to 20 carbon atoms, carboxyl, hydroxyl, or groups of the general formula (2), (3) or (4), with the proviso that all the end groups P are not hydrogen at the same time.

Examples of the normal, branched or cyclic alkyl or alkenyl groups include methyl, ethyl, n-propyl, isopropyl, n-butyl, isobutyl, sec-butyl, tert-butyl, pentyl, hexyl, octyl, nonanyl, decyl, undecyl, dodecyl, tridecyl, pentadecyl, heptadecyl, nonadecyl, docosanyl, heptacosanyl, 2,2-dimethylbutyl, 2,3-dimethylbutyl, 2,2,3-trimethylbutyl, hexamethylethyl, decahydronaphthyl, cyclohexyl, dicyclohexyl, norbornyl, norpinyl, adamantyl, 1,3-dimethyladamantyl, cyclopentyl, vinyl, allyl, butenyl, hexenyl, and cyclohexenyl.

Examples of the aromatic hydrocarbon groups include phenyl, benzyl, tert-butylbenzyl, diphenyl, triphenyl, naphthyl, anthranyl, 1,2,3-tripentylbenzyl, and hexapentylbenzyl.

Examples of the (r+1)-valence aliphatic hydrocarbon groups or alicyclic saturated hydrocarbon groups represented by $R^4$ in formulas (2) to (4) include methylene, ethylene, n-propylene, isopropylene, n-butylene, isobutylene, sec-butylene, tert-butylene, pentylene, hexylene, octylene, nonanylene, decylene, undecylene, dodecylene, tridecylene, pentadecylene, heptadecylene, nonadecylene, docosanylene, heptacosanylene, 2,2-dimethylbutylene, 2,3-dimethylbutylene, 2,2,3-trimethylbutylene, hexamethylethylene, decahydronaphthalene, cyclohexavinylene, cyclohexylene, cyclohexenylene, dicyclohexylene, norbornylene, adamantylene, 1,3-dimethyladamantylene, cyclopentylene, and trivalent and tetravalent groups obtained by further eliminating one or two hydrogen atoms from the foregoing groups.

Examples of the (r+1)-valence aromatic hydrocarbon groups represented by $R^4$ include phenylene, benzylene, tert-butylbenzylene, diphenylene, triphenylene, naphthylene, anthranylene, 1,2,3-tripentylbenzylene, hexapentylbenzylene, and trivalent and tetravalent groups obtained by further eliminating one or two hydrogen atoms from the foregoing groups.

Examples of the normal, branched or cyclic alkyl groups and aromatic hydrocarbon groups represented by $R^5$ are the same as described above. Examples of the alkoxy groups represented by $R^5$ include methoxy, ethoxy, propoxy, isopropoxy, n-butoxy, isobutoxy, sec-butoxy, tert-butoxy, pentyloxy, hexyloxy, octyloxy, nonanyloxy, decyloxy, undecyloxy, dodecyloxy, tridecyloxy, pentadecyloxy, heptadecyloxy, nonadecyloxy, docosanyloxy, heptacosanyloxy, 2,2-dimethylbutoxy, 2,3-dimethylbutoxy, 2,2,3-trimethylbutoxy, hexamethylethoxy, cyclohexyloxy, decahydronaphthyloxy, dicyclohexyloxy, norbornyloxy, norpinyloxy, adamantyloxy, 1,3-dimethyladamantyloxy, and cyclopentyloxy.

The acid labile group represented by $R^3$ may be selected from a variety of acid labile groups, preferably from groups of the following formulas (7) and (8), tert-alkyl groups of 4 to 20 carbon atoms, trialkylsilyl groups whose alkyl groups each have 1 to 6 carbon atoms, and oxoalkyl groups of 4 to 20 carbon atoms.

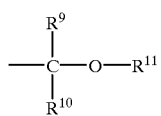

(7)

-continued

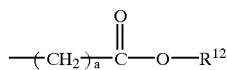

(8)

In formulas (7) and (8), $R^9$ and $R^{10}$ each are hydrogen or a normal, branched or cyclic alkyl group having 1 to 8 carbon atoms, preferably 1 to 6 carbon atoms, more preferably 1 to 5 carbon atoms. $R^{11}$ is a monovalent hydrocarbon group of 1 to 18 carbon atoms, preferably 1 to 10 carbon atoms, more preferably 1 to 8 carbon atoms, which may have a hetero atom such as oxygen. Alternatively, $R^9$ and $R^{10}$, $R^9$ and $R^{11}$, or $R^{10}$ and $R^{11}$, taken together, may form a ring, with the proviso that $R^9$, $R^{10}$ and $R^{11}$ each are a normal or branched alkylene group having 1 to 18 carbon atoms, preferably 1 to 10 carbon atoms, more preferably 1 to 8 carbon atoms, when they form a ring. $R^{12}$ is a tertiary alkyl group having 4 to 20 carbon atoms, preferably 4 to 15 carbon atoms, more preferably 4 to 10 carbon atoms, a trialkylsilyl group whose alkyl groups each have 1 to 6 carbon atoms, an oxoalkyl group of 4 to 20 carbon atoms, preferably 4 to 15 carbon atoms, more preferably 4 to 10 carbon atoms, or a group of formula (6). Letter a is an integer of 0 to 6.

Examples of the normal, branched or cyclic alkyl group of 1 to 8 carbon atoms represented by $R^9$ and $R^{10}$ are as described for $R^2$.

Examples of the hydrocarbon group represented by $R^{11}$ include normal, branched or cyclic alkyl groups, substituted or unsubstituted aryl groups such as phenyl, p-methylphenyl, p-ethylphenyl, and alkoxyphenyl groups (e.g., p-methoxyphenyl), and aralkyl groups such as benzyl and phenethyl, as well as modified ones of these groups, for example, alkyl groups in which an oxygen atom intervenes, the hydrogen atom attached to a carbon atom is replaced by a hydroxyl group, or two hydrogen atoms are replaced by an oxygen atom to form a carbonyl group, as shown below.

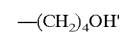

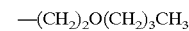

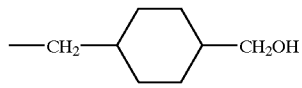

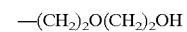

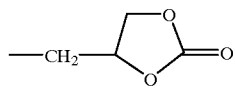

Examples of the tertiary alkyl group represented by $R^{12}$ include tert-butyl, 1-methylcyclohexyl, 2-(2-methyl) adamantyl and tert-amyl groups.

Examples of the trialkylsilyl group represented by $R^{12}$ include those wherein alkyl moieties each have 1 to 6 carbon atoms such as trimethylsilyl, triethylsilyl and dimethyl-tert-butylsilyl groups. Examples of the oxoalkyl group represented by $R^{12}$ include 3-oxocyclohexyl and groups of the following formulas.

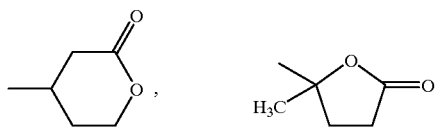

Examples of the acid labile group of formula (7) include normal or branched acetal groups such as 1-methoxyethyl, 1-ethoxyethyl, 1-n-propoxyethyl, 1-iso-propoxyethyl, 1-n-butoxyethyl, 1-iso-butoxyethyl, 1-sec-butoxyethyl, 1-tert-butoxyethyl, 1-tert-amyloxyethyl, 1-ethoxy-n-propyl, 1-cyclohexyloxyethyl, methoxypropyl, ethoxypropyl, 1-methoxy-1-methylethyl, and 1-ethoxy-1-methylethyl; and cyclic acetal groups such as tetrahydrofuranyl and tetrahydropyranyl, with the ethoxyethyl, butoxyethyl and ethoxypropyl groups being preferred. Examples of the acid labile group of formula (8) include tert-butoxycarbonyl, tert-butoxycarbonylmethyl, tert-amyloxycarbonyl, tert-amyloxycarbonylmethyl, 1-ethoxyethoxycarbonylmethyl, 2-tetrahydropyranyloxycarbonylmethyl, and 2-tetrahydrofuranyloxycarbonylmethyl groups.

In the invention, the P-terminated polymer of formula (1) may be crosslinked within a molecule and/or between molecules with crosslinking groups having C—O—C linkages resulting from reaction of one or more of the phenolic hydroxyl groups represented by R in formula (1), the hydroxyl groups represented by $R^5$ in formula (2), and the hydroxyl groups in formula (3) with an alkenyl ether compound or halogenated alkyl ether compound to be described later. The amount of the acid labile groups and the crosslinking groups combined is on the average from more than 0 mol % to 80 mol % of the entirety of hydrogen atoms in the phenolic hydroxyl groups in formula (1), the hydroxyl groups represented by $R^5$ in formula (2), and the hydroxyl groups in formula (3).

The crosslinking group having a C—O—C linkage is exemplified by groups of the following general formulas (6a) and (6b), preferably formulas (6a') and (6b').

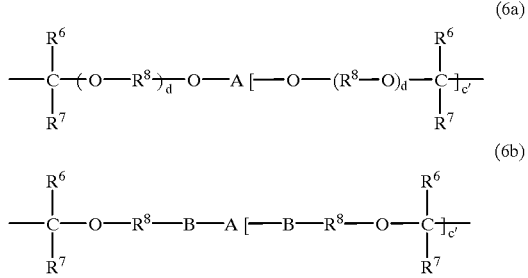

Herein, $R^6$ and $R^7$ each are hydrogen or a normal, branched or cyclic alkyl group of 1 to 8 carbon atoms, or $R^6$ and $R^7$, taken together, may form a ring, with the proviso that each of $R^6$ and $R^7$ is a normal or branched alkylene group of 1 to 8 carbon atoms when they form a ring. $R^8$ is a normal, branched or cyclic alkylene group of 1 to 10 carbon atoms. Letter d is 0 or an integer of 1 to 10. A is a c-valent aliphatic or alicyclic saturated hydrocarbon group, aromatic hydrocarbon group or heterocyclic group of 1 to 50 carbon atoms, which may have an intervening hetero atom and in which the hydrogen atom attached to a carbon atom may be partially replaced by a hydroxyl group, carboxyl group, acyl group or halogen atom. B is —CO—O—, —NHCO—O— or —NHCONH—. Letter c is an integer of 2 to 8, and c' is an integer of 1 to 7.

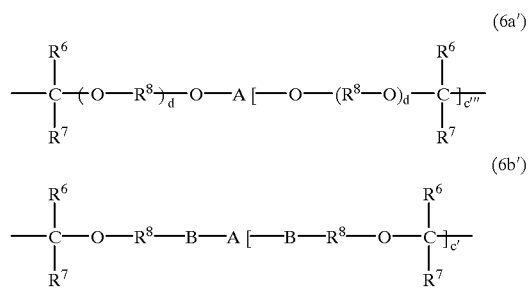

Herein, $R^6$ and $R^7$ each are hydrogen or a normal, branched or cyclic alkyl group of 1 to 8 carbon atoms, or $R^6$ and $R^7$, taken together, may form a ring, with the proviso that each of $R^6$ and $R^7$ is a normal or branched alkylene group of 1 to 8 carbon atoms when they form a ring. $R^8$ is a normal, branched or cyclic alkylene group of 1 to 10 carbon atoms. Letter d is 0 or an integer of 1 to 5. A is a c'-valent normal, branched or cyclic alkylene, alkyltriyl or alkyltetrayl group of 1 to 20 carbon atoms or an arylene group of 6 to 30 carbon atoms, which may have an intervening hetero atom and in which the hydrogen atom attached to a carbon atom may be partially replaced by a hydroxyl group, carboxyl group, acyl group or halogen atom such as fluorine atom. B is —CO—O—, —NHCO—O— or —NHCONH—. Letter c" is an integer of 2 to 4, and c''' is an integer of 1 to 3.

The normal, branched or cyclic alkyl groups of 1 to 8 carbon atoms are as exemplified above. Examples of the group represented by A are described later. These crosslinking groups of formulas (6a) and (6b) originate from alkenyl ether compounds and halogenated alkyl ether compounds to be described later.

As understood from the value of c' in formula (6a) or (6b), the crosslinking group is not limited to a divalent one and trivalent to octavalent groups are acceptable. For example, the divalent crosslinking group is exemplified by groups of the following formulas (6a") and (6b") and the trivalent crosslinking group is exemplified by groups of the following formulas (6a''') and (6b''').

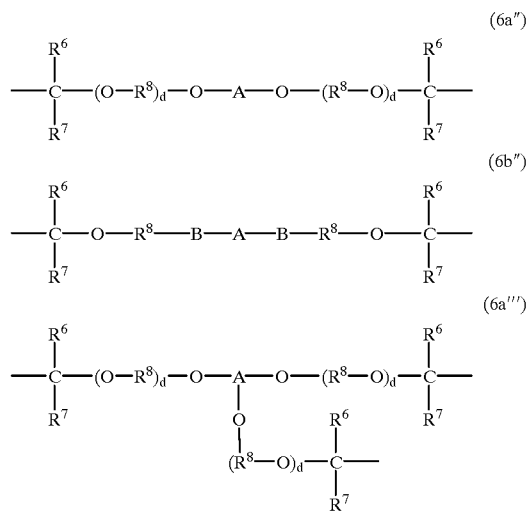

-continued

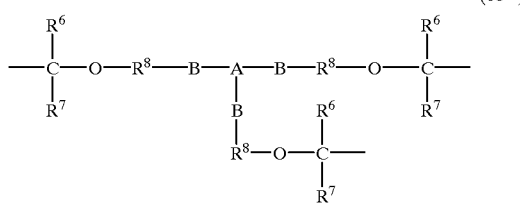

(6b''')

More specifically, the polymer according to the invention is a polymer of the following general formula (5) having recurring units of the following general formula (5-i) and terminated with P, especially a crosslinked polymer of the following general formula (5) having recurring units of the following general formula (5-i) and terminated with P, which polymer is crosslinked within a molecule and/or between molecules through the mechanism that hydrogen atoms are eliminated from phenolic hydroxyl groups represented by R and/or the hydroxyl groups represented by $R^5$ in formula (2) and/or the hydroxyl groups in formula (3) to leave oxygen atoms which are connected by a crosslinking group having a C—O—C linkage of the general formula (6a) or (6b).

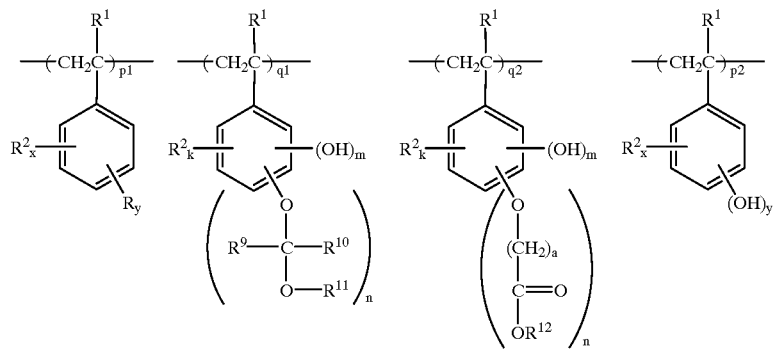

(5-i)

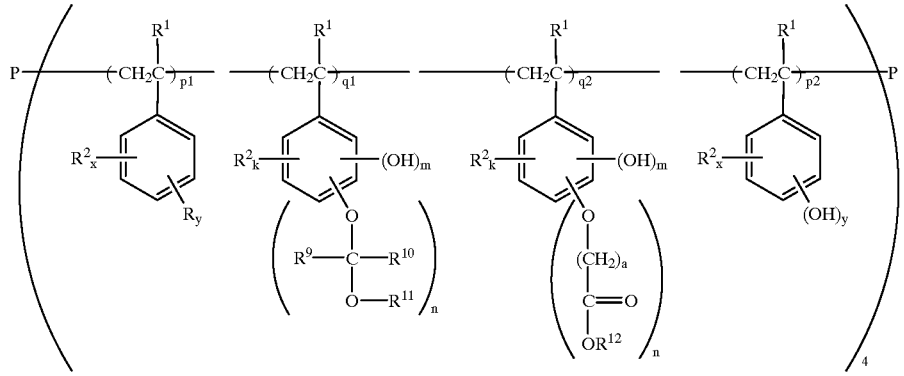

(5)

In the formulas, R represents hydroxyl or $OR^3$ groups, and at least one R group is hydroxyl. $R^1$ is hydrogen or methyl. $R^2$ is a normal, branched or cyclic alkyl group of 1 to 30 carbon atoms. $R^3$ is an acid labile group. $R^9$ and $R^{10}$ are hydrogen or normal, branched or cyclic alkyl groups of 1 to 8 carbon atoms. $R^{11}$ is a monovalent hydrocarbon group of 1 to 18 carbon atoms which may have a hetero atom. Alternatively, $R^9$ and $R^{10}$, $R^9$ and $R^{11}$, and $R^{10}$ and $R^{11}$, taken together, may form a ring, and each of $R^9$, $R^{10}$ and $R^{11}$ is a normal or branched alkylene group of 1 to 18 carbon atoms when they form a ring. $R^{12}$ is a tertiary alkyl group of 4 to 20 carbon atoms, a trialkylsilyl group whose alkyl groups each have 1 to 6 carbon atoms, an oxoalkyl group of 4 to 20 carbon atoms, or a group represented by $-CR^9R^{10}OR^{11}$. Letter a is an integer of 0 to 6. Letters p1 and p2 are positive numbers, q1 and q2 are 0 or positive numbers, satisfying $0<p1/(p1+q1+p2+q2)\leq0.8$, $0\leq q1/(p1+q1+p2+q2)\leq0.8$, $0\leq q2/(p1+q1+p2+q2)\leq0.8$, and $p1+q1+p2+q2=1$, q1 and q2 are not equal to 0 at the same time; x, y, k, m, n, Δ, and P are as defined above; and p1+p2=p and q1+q2=q.

Illustrative examples and preferred ranges for R, $R^1$ to $R^3$, $R^9$ to $R^{12}$, x, y, k, m, n, a, and P here are the same as those mentioned above.

Letters p1 and p2 are positive numbers and q1 and q2 are 0 or positive numbers, satisfying $0<p1/(p1+q1+q2+p2) \leq 0.8$, $0 \leq q1/(p1+q1+q2+p2) \leq 0.8$, $0 \leq q2/(p1+q1+q2+p2) \leq 0.8$, and $p1+q1+q2+p2=1$, provided that q1 and q2 are not both 0. Preferred values for p1, p2, q1, and q2 are given below.

$0<p1/(p1+q1+p2+q2) \leq 0.4$,
especially $0.002 \leq p1/(p1+q1+p2+q2) \leq 0.2$ $0 \leq q1/(p1+q1+p2+q2) \leq 0.6$,
especially $0 \leq q1/(p1+q1+p2+q2) \leq 0.4$ $0 \leq q2/(p1+q1+p2+q2) \leq 0.6$,
especially $0 \leq q2/(p1+q1+p2+q2) \leq 0.4$ $0.4 \leq p2/(p1+q1+p2+q2) \leq 1$,
especially $0.5 \leq p2/(p1+q1+p2+q2) \leq 0.9$ $0 \leq (q1+q2)/(p1+q1+p2+q2) \leq 0.6$,
especially $0.1 \leq (q1+q2)/(p1+q1+p2+q2) \leq 0.4$ Also, $q1/(q1+q2)$ is preferably 0 to 1, more preferably 0.5 to 1, and most preferably 0.7 to 1.

Also in this polymer, the amount of the acid labile groups and the crosslinking groups combined is on the average from more than 0 mol % to 80 mol % of the entirety of hydrogen atoms in the phenolic hydroxyl groups in formula (5), the hydroxyl groups represented by $R^5$ in formula (2), and the hydroxyl groups in formula (3).

Illustrative examples of the polymer include the polymers having recurring units of the following formulas (5'-1) to (5'-7) and terminated with P.

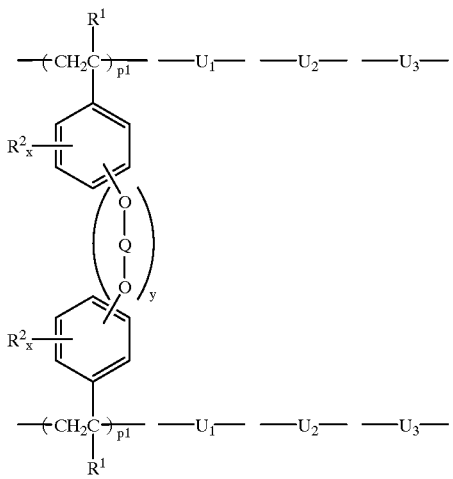
(5'-1)

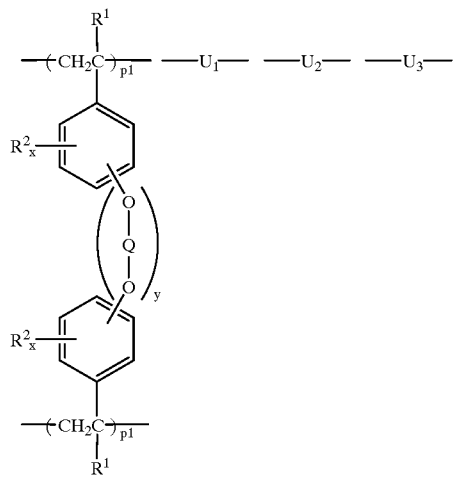
(5'-2)

(5'-3)

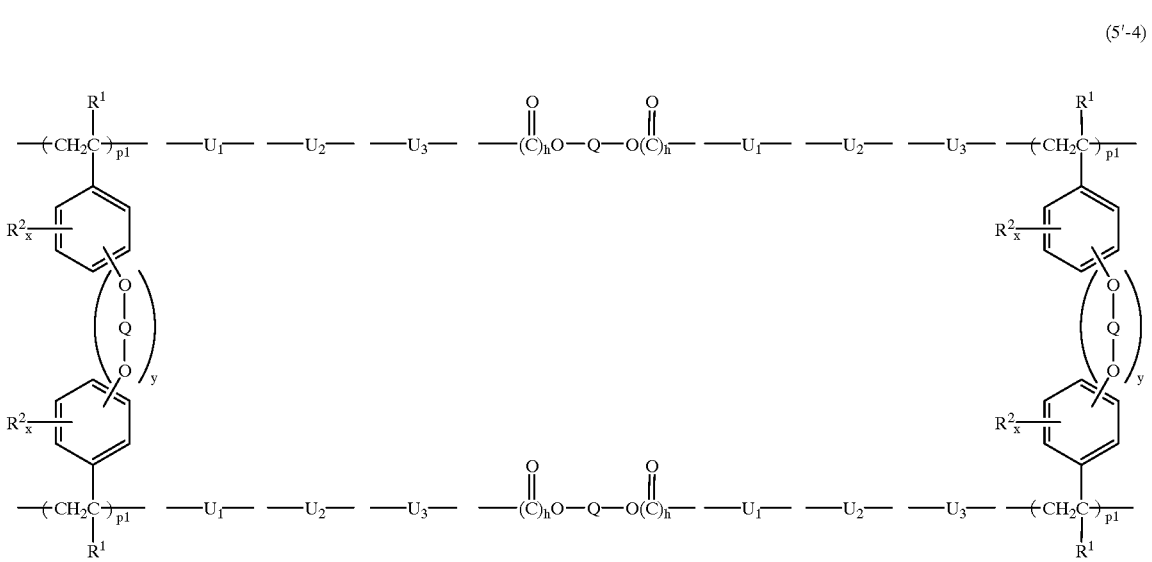
(5'-4)

(5'-5)
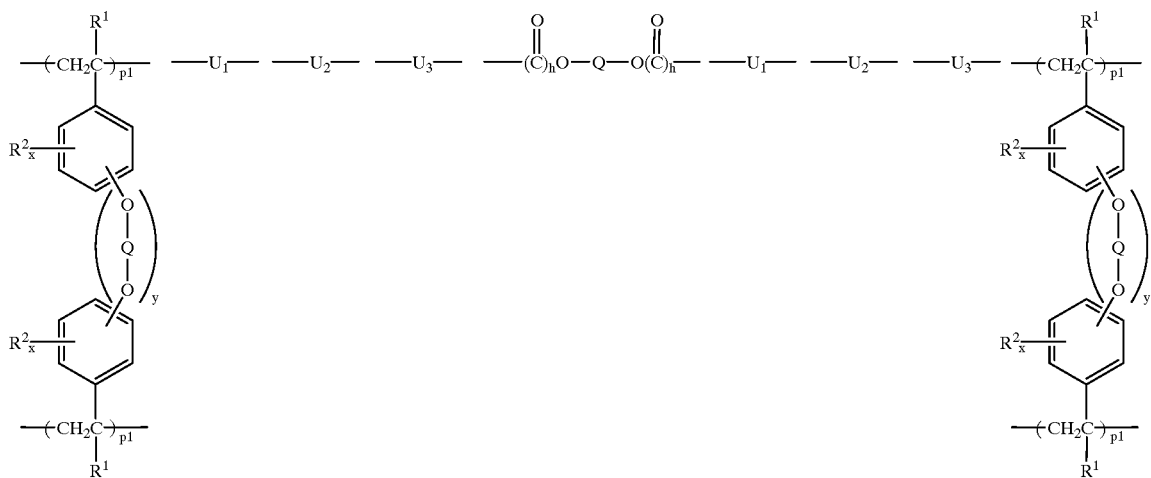
(5'-6)
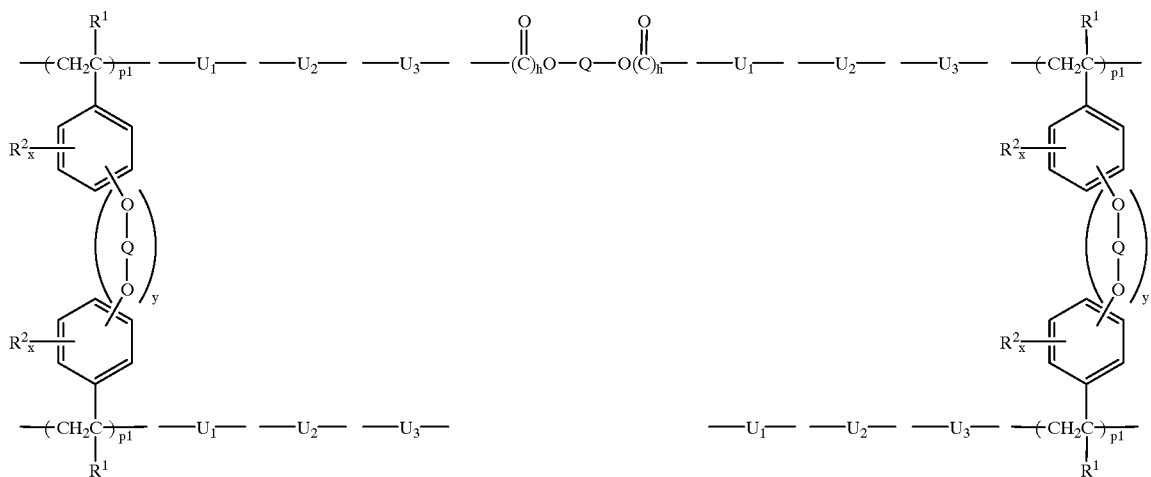
(5'-7)
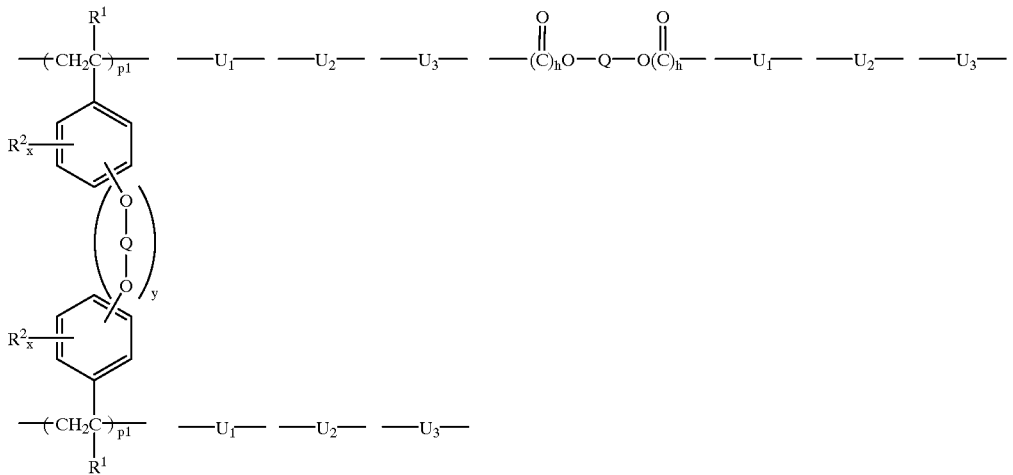

In the above formulas, h is equal to 0 or 1, y is an integer of 1 to 3, $U_1$, $U_2$, and $U_3$ represents the following units.

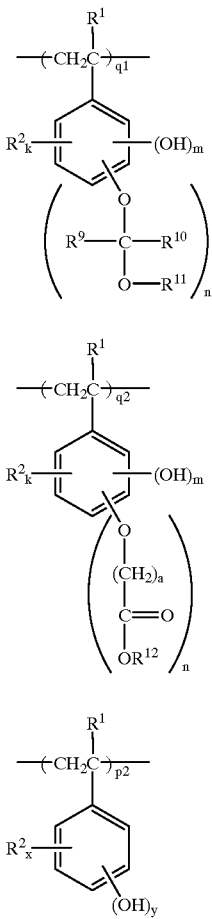

Also herein, P is hydrogen, normal, branched or cyclic alkyl or alkenyl groups of 1 to 30 carbon atoms, aromatic hydrocarbon groups of 6 to 50 carbon atoms, carboxyl, hydroxyl, or groups of general formula (2), (3) or (4), and all the end groups P are not hydrogen at the same time. Q is a crosslinking group having a C—O—C linkage, typically a crosslinking group of formula (6a) or (6b) above, especially a crosslinking group of formula (6a"), (6b"), (6a'''), or (6b'''). In cases where the crosslinking group has a valence of 3 or more, Q in above formula (5) is attached to three or more of the following units.

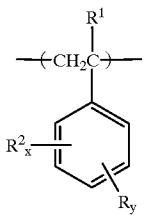

It is noted that formulas (5'-2) and (5'-5) show an intramolecular linkage and the remaining formulas show an intermolecular linkage. They may be present alone or in admixture.

In the crosslinked embodiment of the present invention, the polymer is crosslinked within a molecule and/or between molecules with a crosslinking group having a C—O—C linkage resulting from reaction of some of the phenolic hydroxyl groups therein and/or the hydroxyl groups represented by $R^5$ in formula (2) and/or the hydroxyl groups in formula (3) with an alkenyl ether compound or halogenated alkyl ether compound. It is preferred herein that the amount of the acid labile groups and the crosslinking groups combined be on the average from more than 0 mol % to 80 mol %, especially 2 to 50 mol %, of the entirety of hydrogen atoms in the phenolic hydroxyl groups in formula (1) and/or the hydroxyl groups represented by $R^5$ in formula (2) and/or the hydroxyl groups in formula (3).

In this regard, the average proportion of the crosslinking group having a C—O—C linkage is from more than 0 mol % to 80 mol %, especially from 0.2 to 20 mol % of the entirety of hydrogen atoms in the hydroxyl groups. With 0 mol %, no benefits of the crosslinking group are obtained, resulting in a reduced contrast of alkali dissolution rate and low resolution. With more than 80 mol %, a too much crosslinked polymer will gel, become insoluble in alkali, induce a film thickness change, internal stresses or bubbles upon alkali development, and lose adhesion to the substrate due to less hydrophilic groups.

The average proportion of the acid labile group is from more than 0 mol % to 80 mol %, especially from 10 to 50 mol % of the entirety of hydrogen atoms in the hydroxyl groups. With 0 mol %, no benefits of the acid labile group are obtained, resulting in a reduced contrast of alkali dissolution rate and low resolution. With more than 80 mol %, alkali solubility will be lost and the affinity to an alkaline developer becomes low, resulting in low resolution.

By properly selecting the amounts of the crosslinking group having a C—O—C linkage and the acid labile group within the above-defined ranges, the size and configuration of a resist pattern can be controlled as desired. In the polymer according to the invention, the contents of the crosslinking group having a C—O—C linkage and the acid labile group have substantial influence on the dissolution rate contrast of a resist film and govern the properties of a resist composition relating to the size and configuration of a resist pattern.

The polymer of the invention should have a weight average molecular weight of 1,000 to 500,000, preferably 3,000 to 50,000. With a weight average molecular weight of less than 1,000, resists would be less resistant to heat. With a weight average molecular weight of more than 500,000, alkali solubility and resolution lowers.

It is understood that prior to crosslinking, a polymer having a wide molecular weight dispersity (Mw/Mn) contains more polymers of low molecular weight and high molecular weight. Such a wide dispersity obstructs the design of the number of crosslinks and it is rather difficult to produce resist materials having the same properties. The influence of a molecular weight and its dispersity becomes greater as the pattern rule becomes finer. In order that a resist material be advantageously used in patterning features to a finer size, the polymer should preferably be a monodisperse one having a molecular weight dispersity of 1.0 to 1.5, especially 1.0 to 1.3. However, the invention is not limited thereto, and it is, of course, acceptable to use a polymer having a dispersity of more than 1.5.

Next, the method for preparing the polymer of the invention is described.

The crosslinked polymer according to the preferred embodiment of the invention may be prepared in various ways, for example, by a method of introducing acid labile groups of formula (7) into phenolic hydroxyl groups of a polymer having recurring units of formula (1-i), isolating the polymer, and reacting it with an alkenyl ether compound or halogenated alkyl ether compound whereby the polymer is crosslinked within a molecule and/or between molecules with a crosslinking group having a C—O—C linkage; a method of reacting the starting polymer with an alkenyl ether compound or halogenated alkyl ether compound whereby the polymer is crosslinked within a molecule and/or between molecules with a crosslinking group having a C—O—C linkage, isolating the polymer, and introducing acid labile groups of formula (7) therein; or a method of carrying out reaction with an alkenyl ether compound or halogenated alkyl ether compound and introduction of acid labile groups of formula (7) together. The last-mentioned combination method is preferred. It is possible to further introduce into the thus obtained polymer acid labile groups of formula (8), tert-alkyl, trialkylsilyl or oxoalkyl groups, if necessary.

In order that the polymer having recurring units of formula (1-i) be modified at terminals with hydrogen, normal, branched or cyclic alkyl or alkenyl groups of 1 to 30 carbon atoms, aromatic hydrocarbon groups of 6 to 50 carbon atoms, carboxyl, hydroxyl, or groups of formula (2), (3) or (4), synthesis is carried out while changing conventional stoppers used in living anion polymerization into various specific stoppers. For example, when the terminals of a polymer are hydrogen atoms, water or alcohols may be used as the stopper. When the terminals are normal, branched or cyclic alkyl or alkenyl groups of 1 to 30 carbon atoms, alkyl halides such as methyl iodide, ethyl bromide and butyl bromide may be used as the stopper. When the terminals are aromatic hydrocarbon groups, halogenated aromatic hydrocarbon groups such as 4-chlorobenzene, chlorobenzyl, 4-naphthalene bromide, 4-chlorobiphenyl, and anthracene bromide may be used as the stopper. When the terminals of a polymer are carboxyl groups, carbonic acid or the like may be used as the stopper. In the case of hydroxyl groups, a combination of trimethoxyboron and hydrogen peroxide may be used.

When the terminals of a polymer are groups of formula (2), the stopper is selected from, for example, methylcarbonyl chloride, methoxycarbonyl chloride, ethoxycarbonyl chloride, butoxycarbonyl chloride, cyclopropanecarbonyl chloride, 1-adamantanecarbonyl chloride, cyclohexanecarbonyl chloride, benzyloxycarbonyl chloride, methylcarbonylmethyl chloride, methoxycarbonylethyl chloride, tert-butoxycarbonylmethyl chloride, butoxycarbonylbenzyl chloride, cyclohexyloxycarbonyl chloride, cyclopentanecarbonyl chloride, cyclopentanecarbonylmethyl chloride, 1-adamantanecarbonylhexyl chloride, cyclohexanecarbonylmethyl chloride, and benzyloxycarbonyl chloride.

When the terminals of a polymer are groups of formula (3), the stopper is selected from, for example, ethylene oxide, propylene oxide, styrene oxide, chloromethylvinylether, 2-bromoethylvinylether, 2-chloroethylvinylether, methyl ethyl ketone, cyclohexanone, pentanone, 3-acetylnoradamantane, formaldehyde, acetaldehyde, trimethylaldehyde, methyl formate, and methyl acetate.

When the terminals of a polymer are groups of formula (4), the stopper is selected from, for example, chloromethyl methyl ether, 2-bromoethyl methyl ether, chloromethyl octyl ether, chloromethyl cyclohexyl ether, and chloromethyl benzyl ether.

In these cases, the amount of the stopper added is preferably at least equimolar to the initiator.

Now, the methods of preparing the crosslinked polymers of the invention are described. Included are a first method using a polymer comprising recurring units of formula (1') and terminated with P, an alkenyl ether compound of formula (I) or (II), and a compound of formula (7a) and a second method using a polymer comprising recurring units of formula (1') and terminated with P, a halogenated alkyl ether compound of formula (VI) or (VII), and a compound of formula (7b).

First method

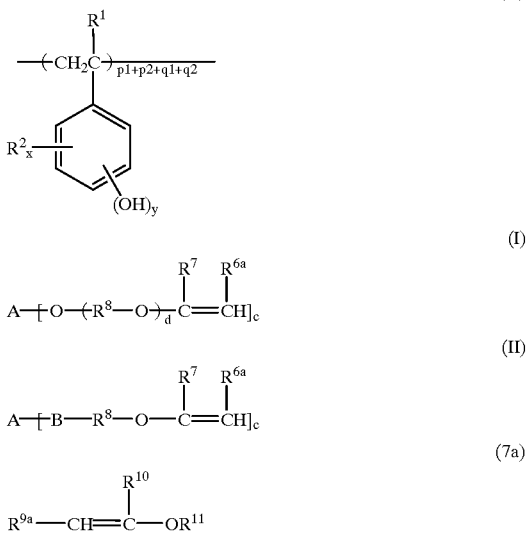

Here, $R^1$, $R^2$, $R^8$, $R^9$, x, y, p1, p2, q1, and q2 are as defined above, and p1+p2+q1+q2=1. $R^5$ and $R^6$ are as defined above, $R^{9a}$ and $R^{6a}$ each are hydrogen or a normal, branched or cyclic alkyl group of 1 to 7 carbon atoms.

In formula (I) or (II) representing the vinyl ether compound, A is a c-valent aliphatic saturated hydrocarbon, alicyclic saturated hydrocarbon, aromatic hydrocarbon or heterocyclic group having 1 to 50 carbon atoms, which may contain an intervening hetero atom, and in which some of the hydrogen atoms attached to the carbon atoms may be substituted with hydroxyl, carboxyl, acyl, or fluorine. B is —CO—O—, —NHCO—O— or —NHCONH—. Letter c is an integer of 2 to 8, and d is 0 or an integer of 1 to 10.

The c-valent (divalent to octavalent) hydrocarbon groups represented by A include hydrocarbon groups, for example, substituted or unsubstituted alkylene groups having 1 to 50 carbon atoms, especially 1 to 40 carbon atoms, substituted or unsubstituted arylene groups having 6 to 50 carbon atoms, especially 6 to 40 carbon atoms, a combination of an alkylene group and an arylene group, and c"-valent groups obtained by eliminating one hydrogen atom attached to a carbon atom from the foregoing groups wherein c" is an integer of 3 to 8; and c-valent heterocyclic groups, and a combination of such a heterocyclic group with any one of the foregoing hydrocarbon groups. In the alkylene and arylene groups, a hetero-atom such as O, NH, N(CH$_3$), S and SO$_2$ may intervene and where substituted, the substituent is a hydroxyl, carboxyl, acyl group or fluorine atom.

Illustrative examples of A are given below.

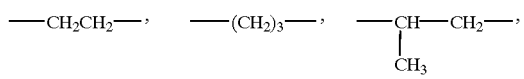

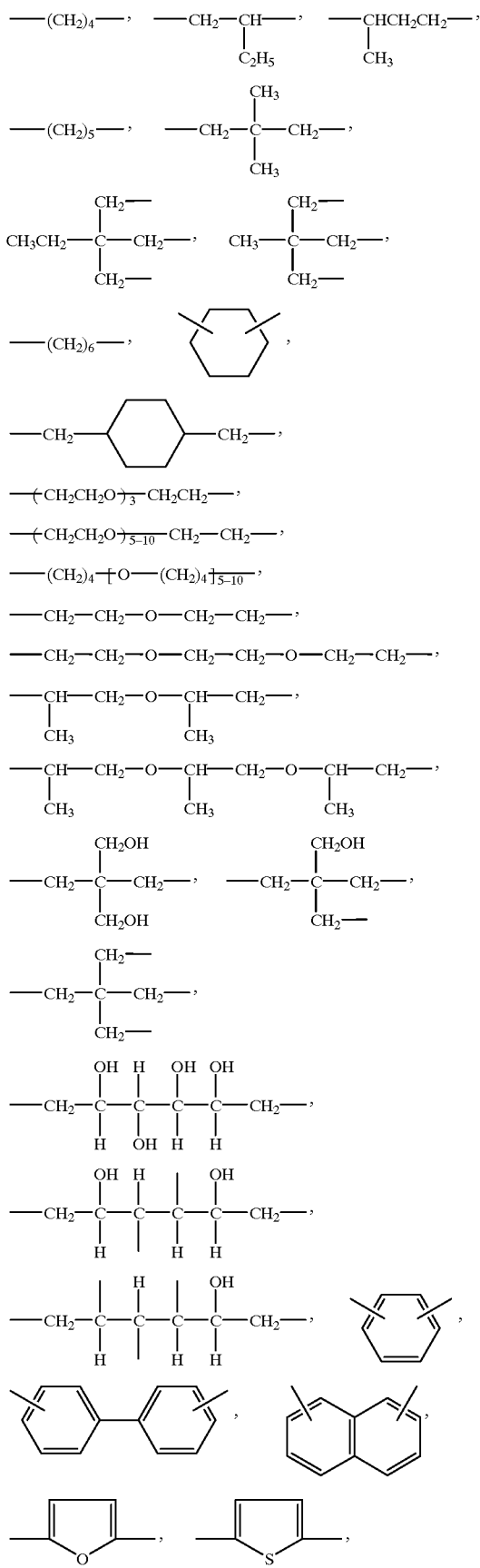
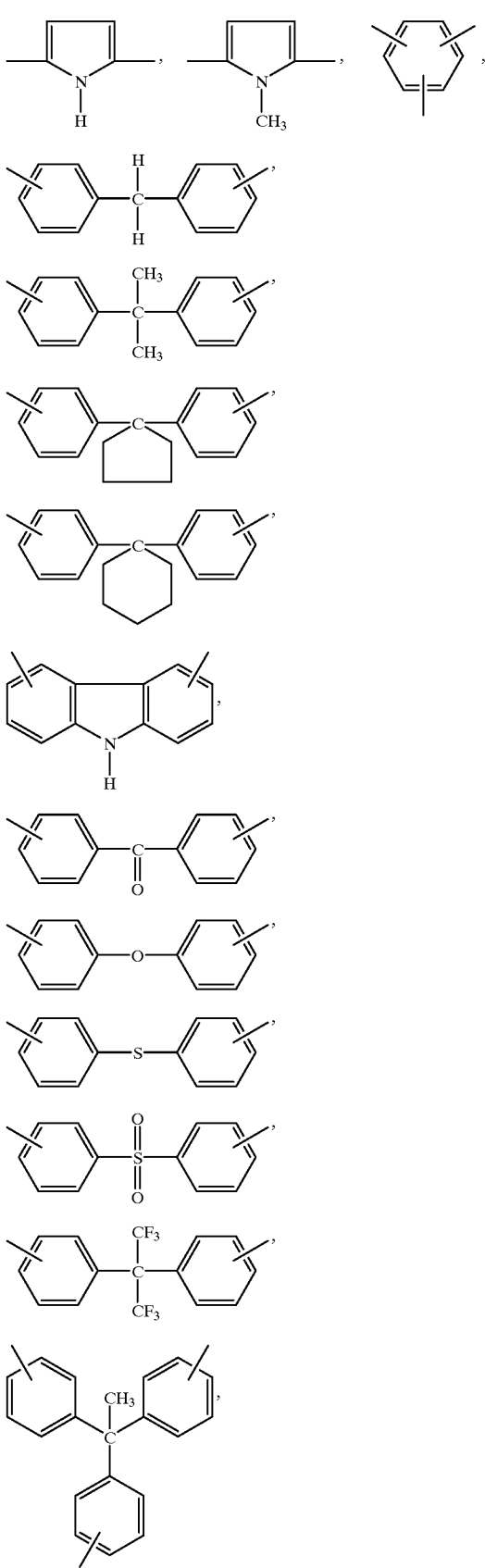

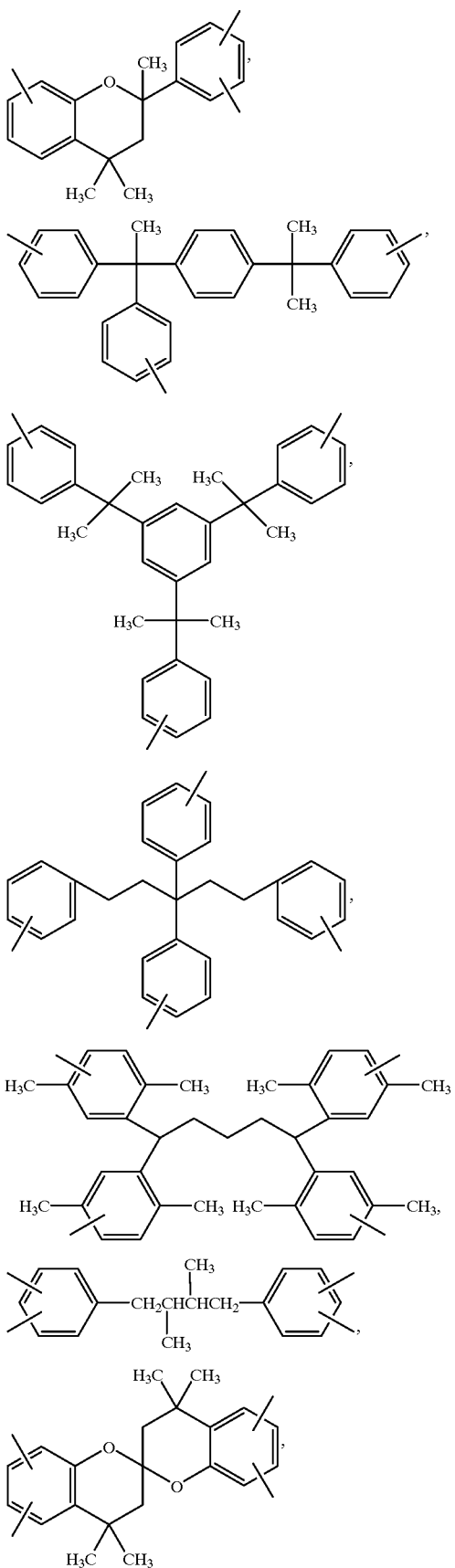

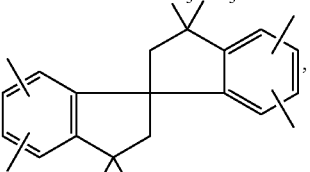

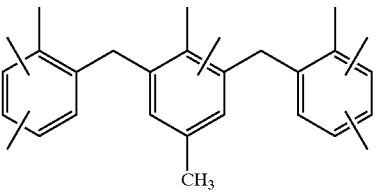

A method such as that described by Stephen C. Lapin in Polymers Paint Colour Journal, 179 (4237), 321 (1988) may be used to prepare the compounds of general formula (I). This method involves synthesis via the reaction of a polyhydric alcohol or a polyhydric phenol with acetylene, or the reaction of a polyhydric alcohol or polyhydric phenol with a halogenated alkyl vinyl ether.

Illustrative, non-limiting examples of compounds having formula (I) include ethylene glycol divinyl ether, triethylene glycol divinyl ether, 1,2-propanediol divinyl ether, 1,3-propanediol divinyl ether, 1,3-butanediol divinyl ether, 1,4-butanediol divinyl ether (tetramethylene glycol divinyl ether), neopentyl glycol divinyl ether, trimethylolpropane trivinyl ether, trimethylolethane trivinyl ether, hexanediol divinyl ether, 1,4-cyclohexanediol divinyl ether, 1,4-divinyloxymethyl cyclohexane, tetraethylene glycol divinyl ether, pentaerythritol divinyl ether, pentaerythritol trivinyl ether, pentaerythritol tetravinyl ether, sorbitol tetravinyl ether, sorbitol pentavinyl ether, ethylene glycol diethylene vinyl ether, triethylene glycol diethylene vinyl ether, ethylene glycol dipropylene vinyl ether, triethylene glycol diethylene vinyl ether, trimethylolpropane triethylene vinyl ether, trimethylolpropane diethylene vinyl ether, pentaerythritol diethylene vinyl ether, pentaerythritol triethylene vinyl ether, pentaerythritol tetraethylene vinyl ether, and compounds of the formulas (I-1) to (I-31) given below.

(I-1)

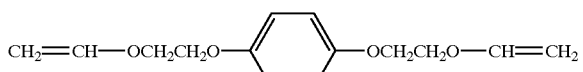

(I-2)

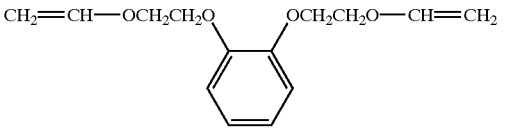

(I-3)

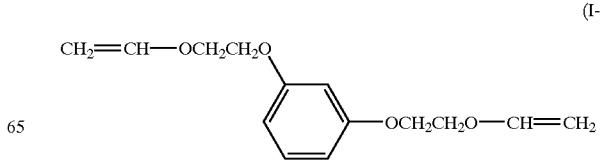

(I-4)
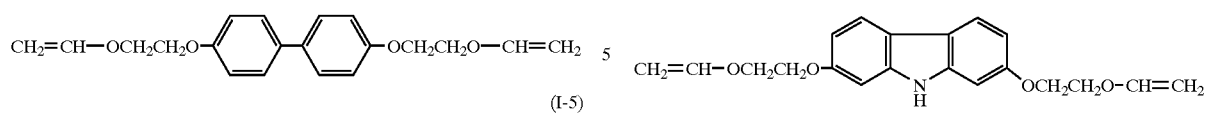
(I-5)
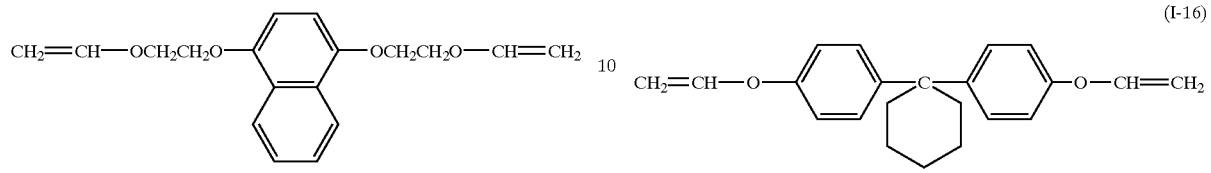
(I-6)
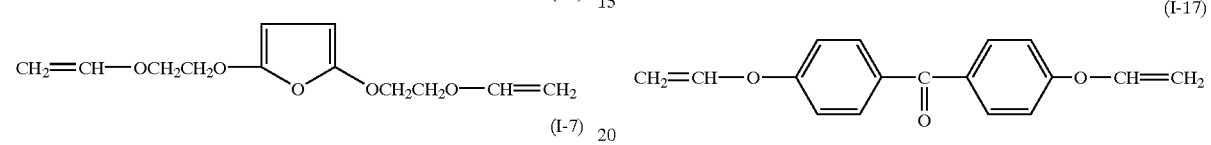
(I-7)
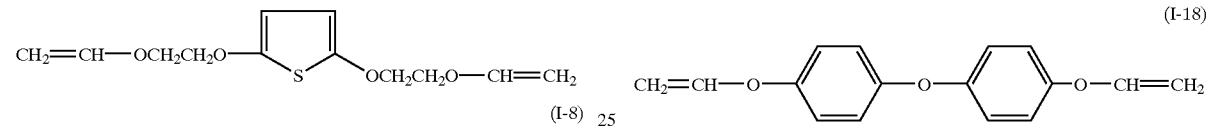
(I-8)
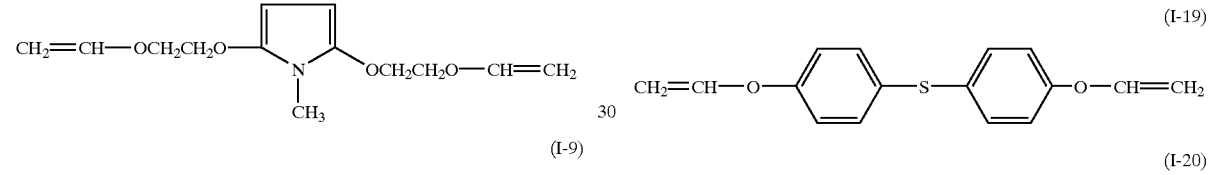
(I-9)
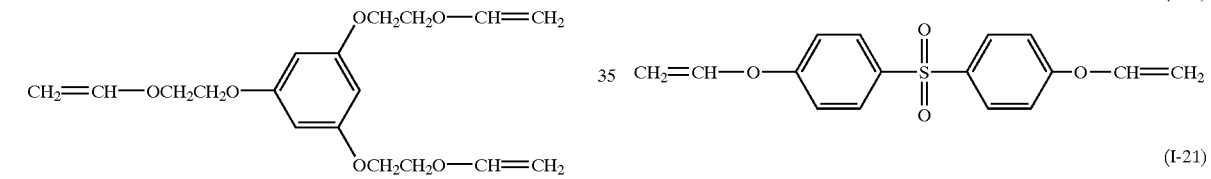
(I-10)
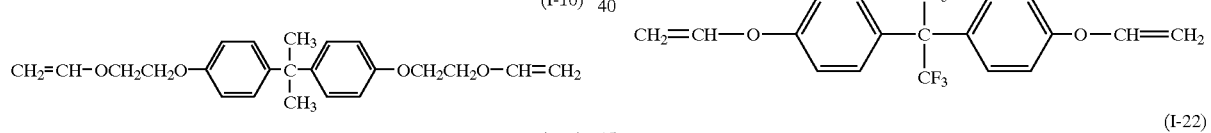
(I-11)
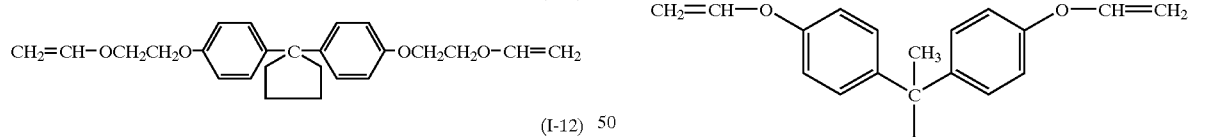
(I-12)
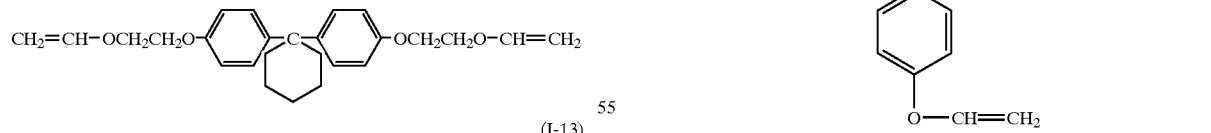
(I-13)
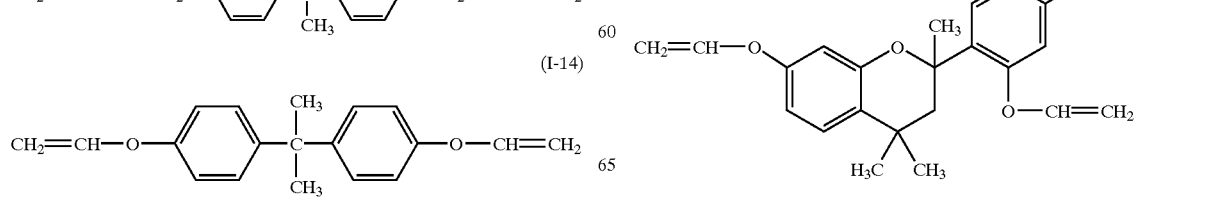
(I-14)
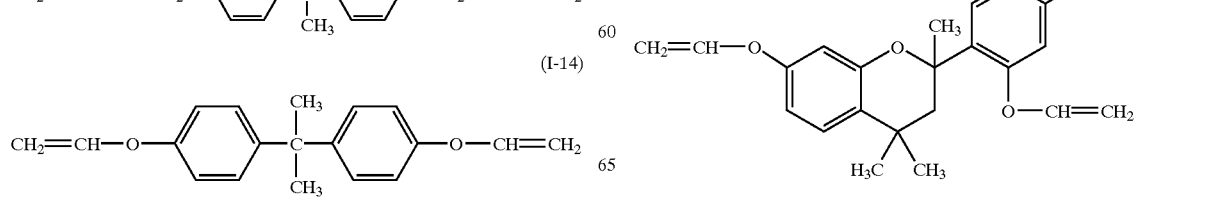
(I-15)
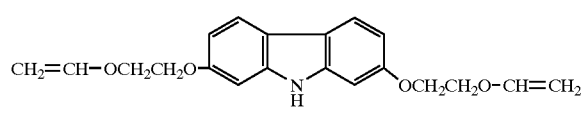
(I-16)
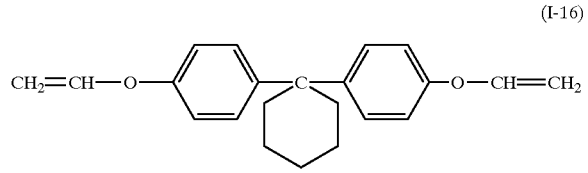
(I-17)
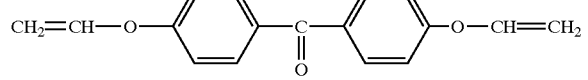
(I-18)
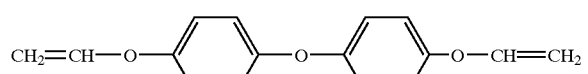
(I-19)
(I-20)
(I-21)
(I-22)
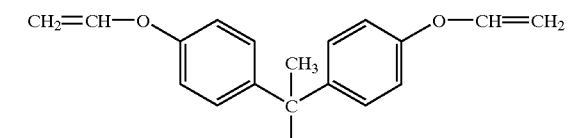
(I-23)
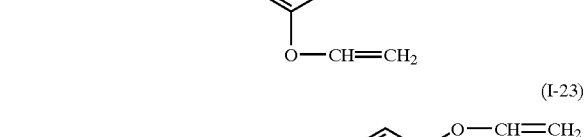

-continued

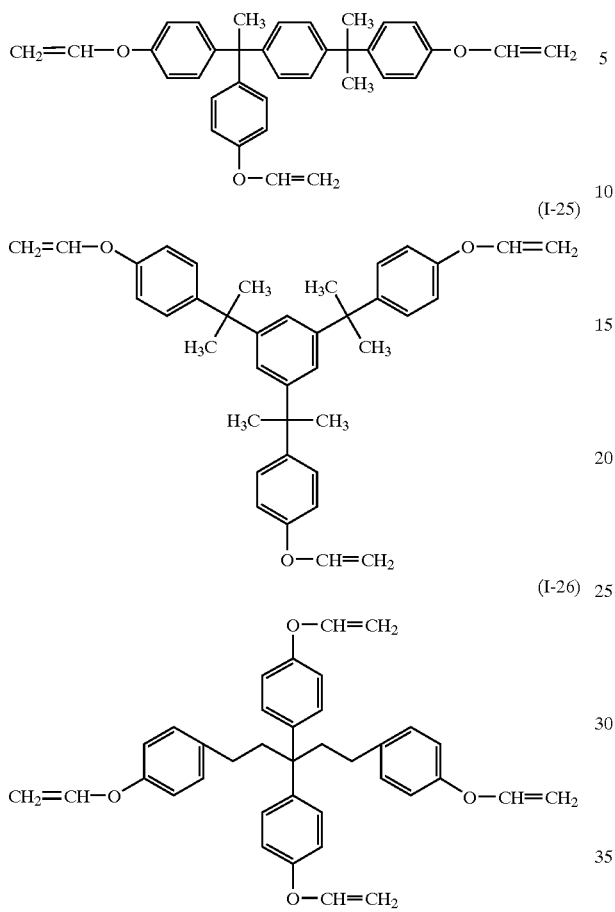

(I-24)
(I-25)
(I-26)
(I-27)
(I-28)
(I-29)

-continued

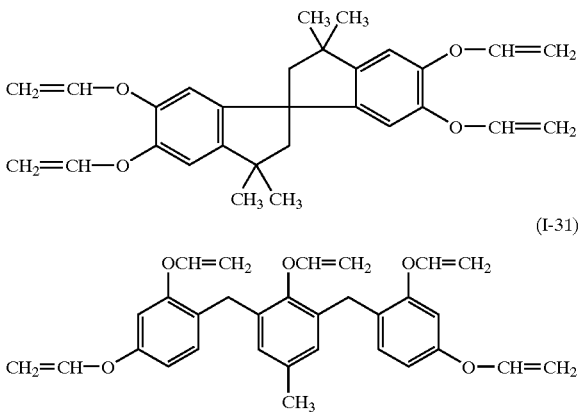

(I-30)
(I-31)

When B is —CO—O, the compound of general formula (II) above may be prepared by reacting a polycarboxylic acid with a halogenated alkyl vinyl ether. Illustrative, non-limiting examples of compounds having formula (II) in which B is —CO—O— include diethylene vinyl ether terephthalate, diethylene vinyl ether phthalate, diethylene vinyl ether isophthalate, dipropylene vinyl ether phthalate, dipropylene vinyl ether terephthalate, dipropylene vinyl ether isophthalate, diethylene vinyl ether maleate, diethylene vinyl ether fumarate, and diethylene vinyl ether itaconate.

Examples of alkenyl ether group-containing compounds which are highly suitable for use in the invention include alkenyl ether group-containing compounds prepared by reacting an active hydrogen-bearing alkenyl ether compound of general formula (III), (IV), or (V) below, for example, with an isocyanate group-bearing compound.

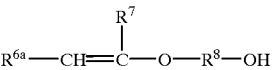

(III)

(IV)

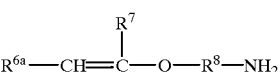

(V)

In these formulas, $R^{6a}$, $R^7$, and $R^8$ are as defined above.

When B is —NHCO—O— or —NHCONH—, the compound of general formula (II) above can be prepared by using isocyanate group-bearing compounds including those mentioned in Handbook of Crosslinking Agents, Taisei K. K., 1981. Illustrative examples include polyisocyanate compounds such as triphenylmethane triisocyanate, diphenylmethane diisocyanate, tolylene diisocyanate, the dimer of 2,4-tolylene diisocyanate, naphthalene-1,5-diisocyanate, o-tolylene diisocyanate, polymethylene polyphenyl isocyanate, and hexamethylene diisocyanate; and polyisocyanate adducts such as the adduct of tolylene diisocyanate and trimethylolpropane, the adduct of hexamethylene diisocyanate and water, and the adduct of xylene diisocyanate and trimethylolpropane. Various compounds with terminal alkenyl ether groups may be obtained by reacting the above-mentioned isocyanate group-bearing compounds with the active hydrogen-bearing alkenyl ether compounds. Illustrative, non-limiting examples of such compounds include those of the following formulas (II-1) to (II-11)

(II-1)
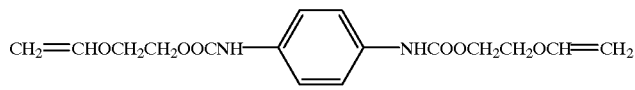
(II-2)
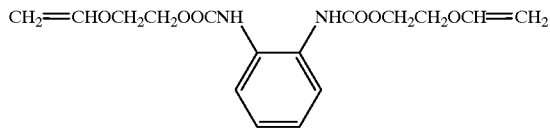
(II-3)
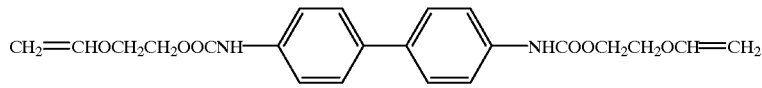
(II-4)
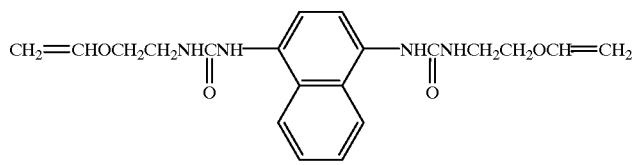
(II-5)
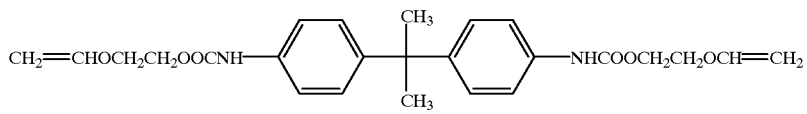
(II-6)
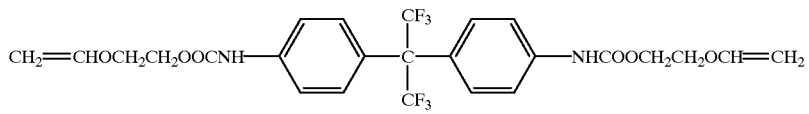
(II-7)
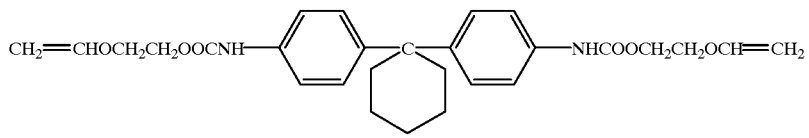
(II-8)
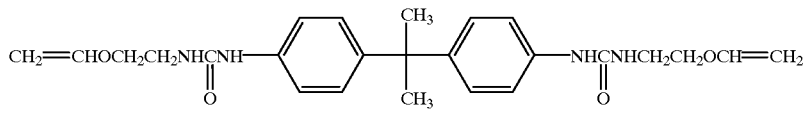
(II-9)
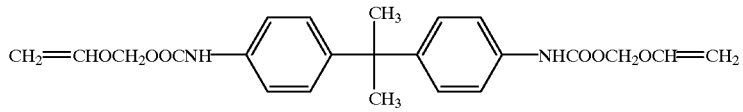
(II-10)
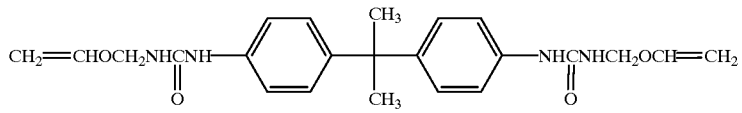
(II-11)
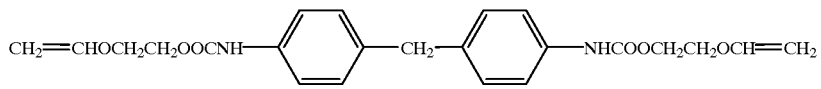

In the first method discussed above, the hydrogen atoms on the phenolic hydroxyl groups of polymers having recurring units of general formula (1'), terminated with P, having a weight average molecular weight of 1,000 to 500,000 and preferably having a molecular weight distribution of 1.0 to 1.5 are reacted with p1 moles of an alkenyl ether compound of general formula (I) or (II) and q1 moles of a compound of general formula (7a), per mole of all the hydroxyl groups on the polymer, so as give polymers having recurring units of general formulas (5a'-1) to (5a'-7) below and terminated with P, for example. It is noted that the end groups P of the polymers may be further reacted with compounds of general formula (7a). In the formulas below, m+n=y, and h, k, m, n, x, y, p1, p2, q1, q2, $R^1$, $R^2$, $R^9$, $R^{10}$, $R^{11}$, and Q are as defined above.

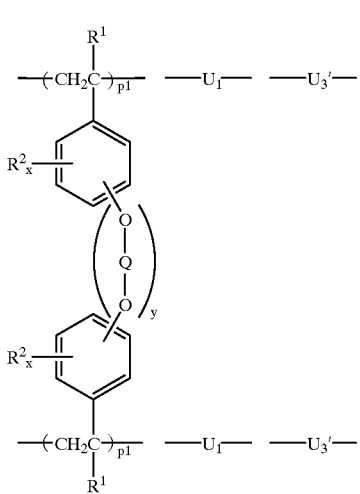

(5a'-1)

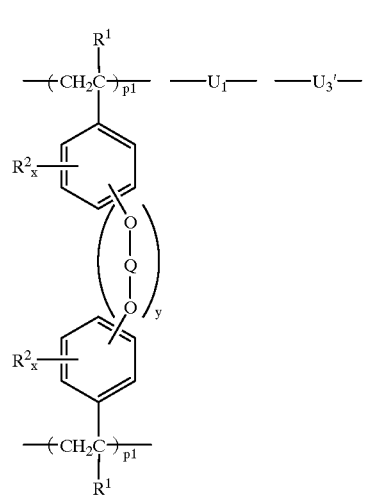

(5a'-2)

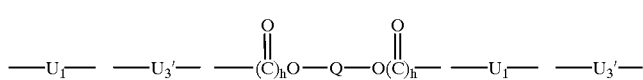

(5a'-3)

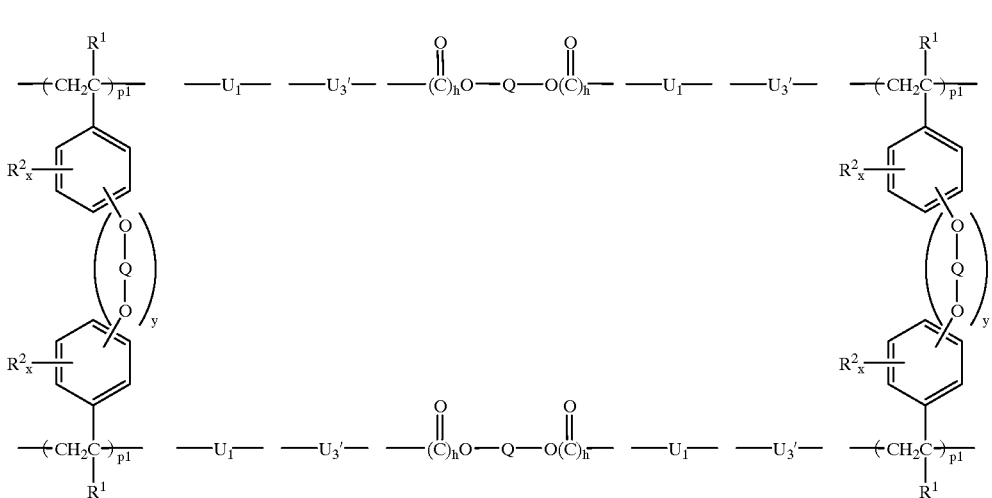

(5a'-4)

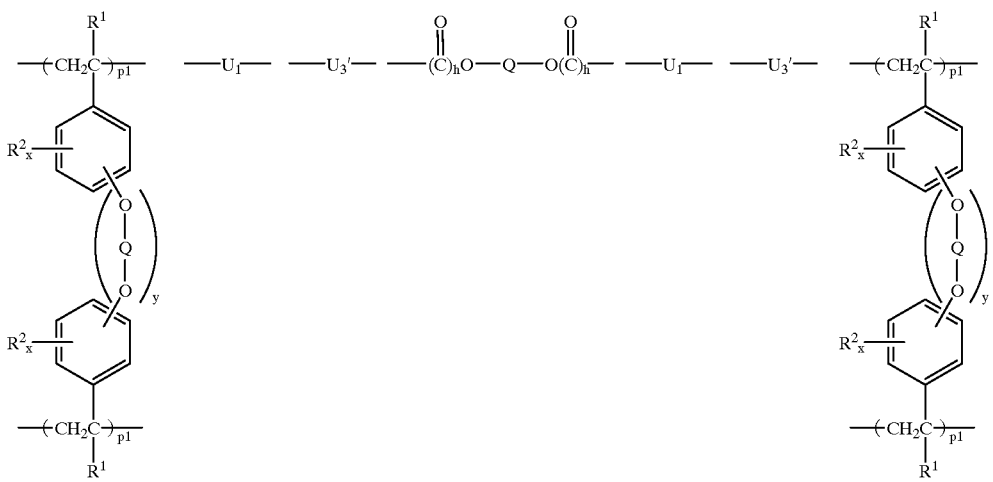
(5a'-5)
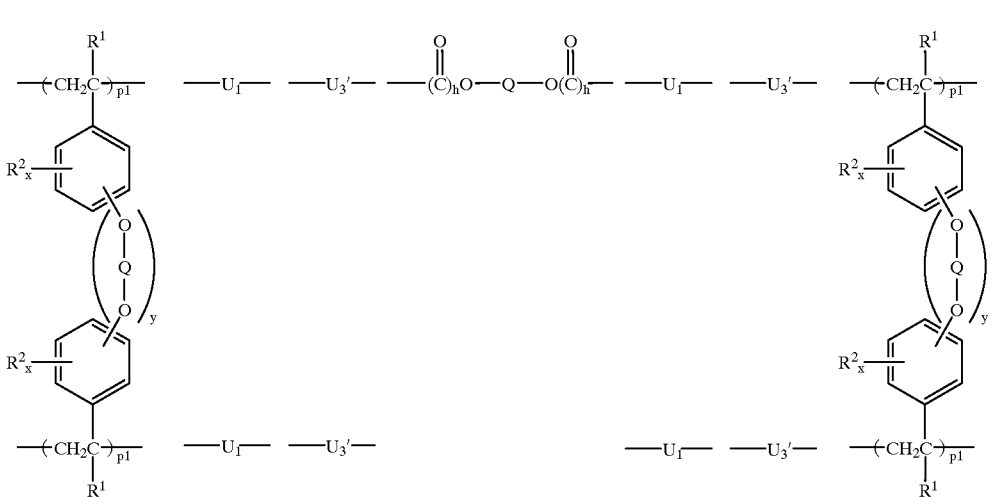
(5a'-6)
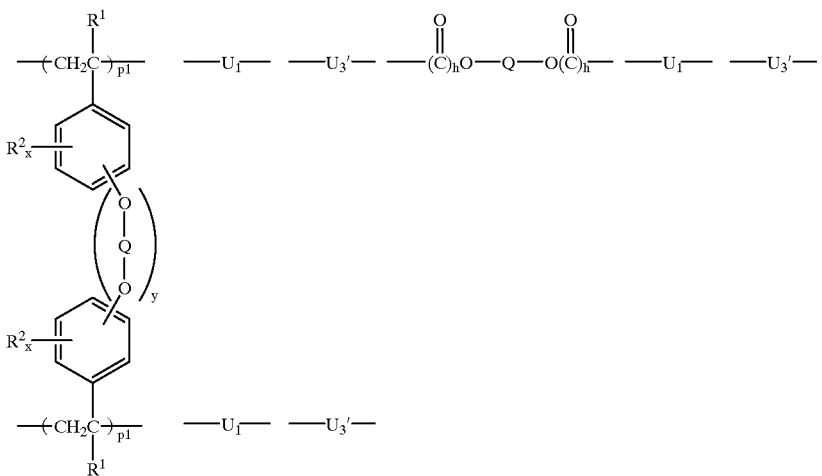
(5a'-7)

In the above formulas, $U_1$ and $U_3'$ represent the units shown below.

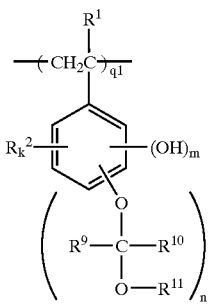

$U_1$

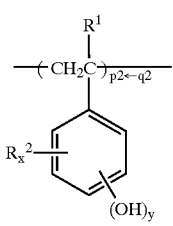

$U_3'$

In the first method, reaction is preferably carried out in a solvent in the presence of an acid. The reaction solvent is preferably a polar aprotic solvent such as dimethylformamide, dimethylacetamide, tetrahydrofuran, or ethyl acetate. These may be used alone or as mixtures of two or more thereof. Preferable examples of the acid catalyst include hydrochloric acid, sulfuric acid, trifluoromethanesulfonic acid, p-toluenesulfonic acid, methanesulfonic acid, trifluoroacetic acid, and pyridinium p-toluenesulfonate. The amount of the acid catalyst used is preferably 0.1 to 10 mol % based on the moles of the entire phenolic hydroxyl groups of the polymer having general formula (1). The reaction temperature is −20 to 100° C., and preferably 0 to 60° C., and the reaction time is 0.2 to 100 hours, and preferably 0.5 to 20 hours.

Where two types of reaction are carried out in a contiguous manner without once isolating an intermediate product, the order of addition of the alkenyl ether compound of formula (I) or (II) and the compound of formula (7a) is not critical. Preferably, the compound of formula (7a) is first added and after reaction proceeds to a full extent, the alkenyl ether compound of formula (I) or (II) is added. If the alkenyl ether compound of formula (I) or (II) and the compound of formula (7a) are simultaneously added or if the alkenyl ether compound of formula (I) or (II) is first added, then some of reactive sites of the alkenyl ether compound of formula (I) or (II) can be hydrolyzed with water in the reaction system whereby there is formed a polymer of complex structure which is difficult to control its physical properties.

Second method

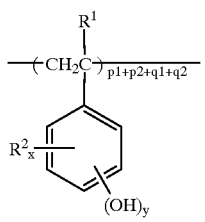

(1')

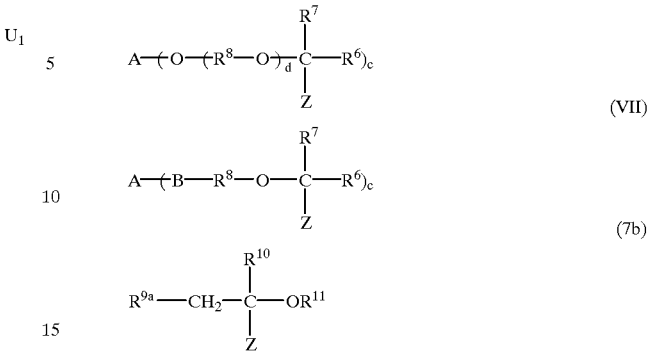

Here, $R^1$, $R^2$, $R^6$ to $R^{11}$, x, y, p1, p2, q1, q2, A, B, c, and d are as defined above, and z is a halogen atom such as Cl, Br or I.

It is understood that the compounds of formulas (VI), (VII) and (7b) can be produced by reacting the compounds of formulas (I), (II) and (7a) with hydrogen chloride, hydrogen bromide or hydrogen iodide, respectively.

In the second method, polymers comprising recurring units of formula (1'), terminated with P, and having a weight average molecular weight of 1,000 to 500,000 and preferably a dispersity of 1.0 to 1.5are reacted with p1 moles of a halogenated alkyl ether compound of formula (VI) or (VII) and q1 moles of a compound of formula (7b) per mole of the phenolic hydroxyl group in the polymer to be reacted, thereby forming polymers having recurring units of the formulas (5a'-1) to (5a'-7) shown above and terminated with P. It is noted that the end groups P of the polymers may be further reacted with a compound of formula (7b).

In the second method, reaction is preferably carried out in a solvent in the presence of a base. The reaction solvent used herein is preferably selected from aprotic polar solvents such as acetonitrile, acetone, dimethylformamide, dimethylacetamide, tetrahydrofuran, and dimethylsulfoxide, and mixtures thereof. The base used herein is preferably selected from triethylamine, pyridine, diisopropylamine and potassium carbonate. The amount of the base used is preferably at least (p1+q1) moles per mole of the phenolic hydroxyl group in the polymer of formula (1') to be reacted. Reaction is preferably carried out at a temperature of −50° C. to 100° C., more preferably 0° C. to 60° C. The reaction time is generally about ½ to 100 hours, preferably 1 to 20 hours.

It is acceptable to take a reaction sequence of first reacting a polymer having recurring units of formula (1') and terminated with P with a compound of formula (7a) or (7b) to form a polymer having recurring units of the following general formula (10) and terminated with P, isolating the polymer of formula (10), and then crosslinking the polymer of formula (10) using a compound of formula (I), (II), (VI) or (VII).

(10)

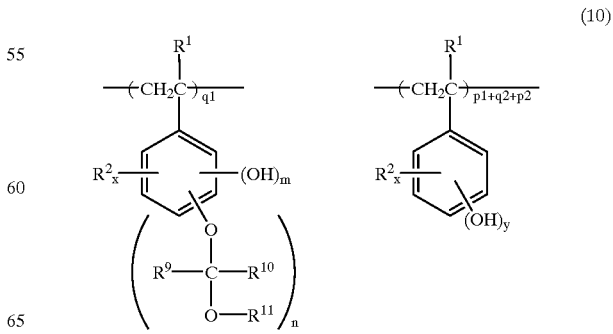

Furthermore, by introducing another acid labile group into the polymers having recurring units of formulas (5a'-1) to (5a'-7) and terminated with P, which are obtained by the first or second method, polymers having recurring units of formulas (5'-1) to (5'-7) and terminated with P can be produced if necessary. This is done by reacting the polymer of formula (5a'-1) to (5a'-7) with q2 moles of a dialkyl dicarbonate compound or alkoxycarbonylalkyl halide per mole of the phenolic hydroxyl group in the original polymer having recurring units of formula (1') and terminated with P to introduce an acid labile group of the following general formula (8); or by reacting the polymer of formula (5a'-1) to (5a'-7) with a tert-alkyl halide, trialkylsilyl halide or oxoalkyl compound to introduce an acid labile group.

Preferably the introduction of an acid labile group of formula (8) is carried out in a solvent in the presence of a base. The reaction solvent used herein is preferably selected from aprotic polar solvents such as acetonitrile, acetone, dimethylformamide, dimethylacetamide, tetrahydrofuran, and dimethylsulfoxide, and mixtures thereof. The base used herein is preferably selected from triethylamine, pyridine, imidazole, diisopropylamine and potassium carbonate. The amount of the base used is preferably at least q2 moles per mole of the phenolic hydroxyl group in the original polymer of formula (1'). Reaction is preferably carried out at a temperature of 0° C. to 100° C., more preferably 0° C. to 60° C. The reaction time is generally about 10 minutes to 100 hours, preferably 1 to 10 hours.

Examples of the dialkyl dicarbonate compound include di-tert-butyl dicarbonate and di-tert-amyl dicarbonate. Examples of the alkoxycarbonylalkyl halide include tert-butoxycarbonylmethyl chloride, tert-amyloxycarbonylmethyl chloride, tert-butoxycarbonylmethyl bromide, tert-butoxycarbonylethyl chloride, ethoxyethoxycarbonylmethyl chloride, ethoxyethoxycarbonylmethyl bromide, tetrahydropyranyloxycarbonylmethyl chloride, tetrahydropyranyloxycarbonylmethyl bromide, tetrahydrofuranyloxycarbonylmethyl chloride, and tetrahydrofuranyloxycarbonylmethyl bromide. Examples of the trialkylsilyl halide include trimethylsilyl chloride, triethylsilyl chloride, and dimethyl-tert-butylsilyl chloride.

Furthermore, if necessary, the polymer having recurring units of formula (5a'-1) to (5a'-7) and terminated with P, which is obtained by the first or second method, can be tert-alkylated or oxoalkylated by reacting the polymer with q2 moles of a tert-alkylating compound or oxoalkyl compound per mole of the phenolic hydroxyl group in the original polymer having recurring units of formula (1') and terminated with P.

Preferably this reaction is carried out in a solvent in the presence of an acid. The reaction solvent used herein is preferably selected from aprotic polar solvents such as dimethylformamide, dimethylacetamide, tetrahydrofuran, and ethyl acetate, and mixtures thereof. The acid used herein is preferably selected from hydrochloric acid, sulfuric acid, trifluoromethanesulfonic acid, p-toluenesulfonic acid, methanesulfonic acid, trifluoroacetic acid, and pyridinium p-toluenesulfonate. The amount of the acid catalyst used is preferably 0.1 to 10 mol % based on the moles of the phenolic hydroxyl groups in the original polymer having recurring units of formula (1') and terminated with P, the hydroxyl groups represented by $R^5$ in formula (2) and the hydroxyl groups in formula (3). Reaction is preferably carried out at a temperature of −20° C. to 100° C., more preferably 0° C. to 60° C. The reaction time is generally about 10 minutes to 100 hours, preferably ½ to 20 hours.

Examples of the tert-alkylating compound include isobutene, 2-methyl-1-butene, and 2-methyl-2-butene. Examples of the oxoalkyl compound include α-angelica lactone, 2-cyclohexen-1-one, and 5,6-dihydro-2H-pyran-2-one.

Apart from the route of once forming a polymer of formula (5a'-1) to (5a'-7), it is possible to directly introduce an acid labile group of formula (8), tertiary alkyl group, trialkylsilyl group or oxoalkyl group into a polymer comprising recurring units of the following general formula (5b'-1) to (5b'-7) and terminated with P, and optionally further introduce an acid labile group of formula (7).

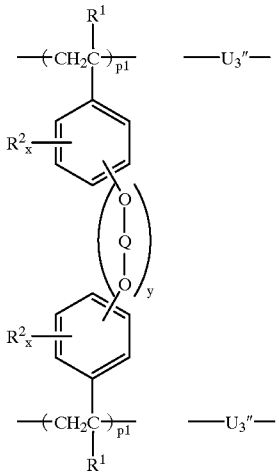

(5b'-1)

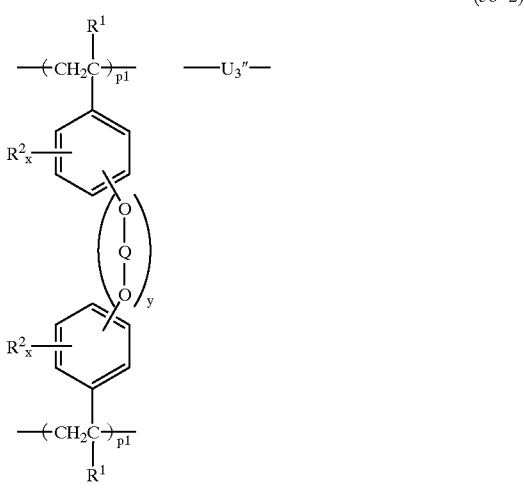

(5b'-2)

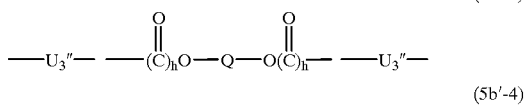

(5b'-3)

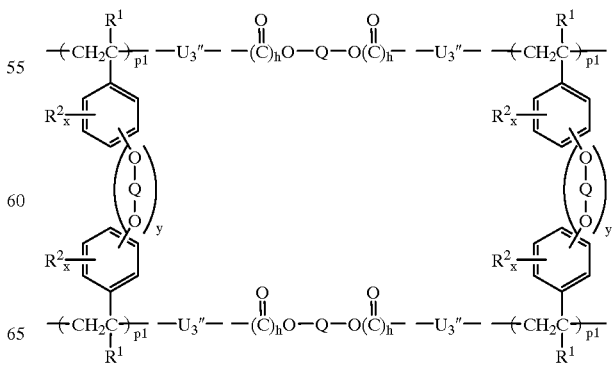

(5b'-4)

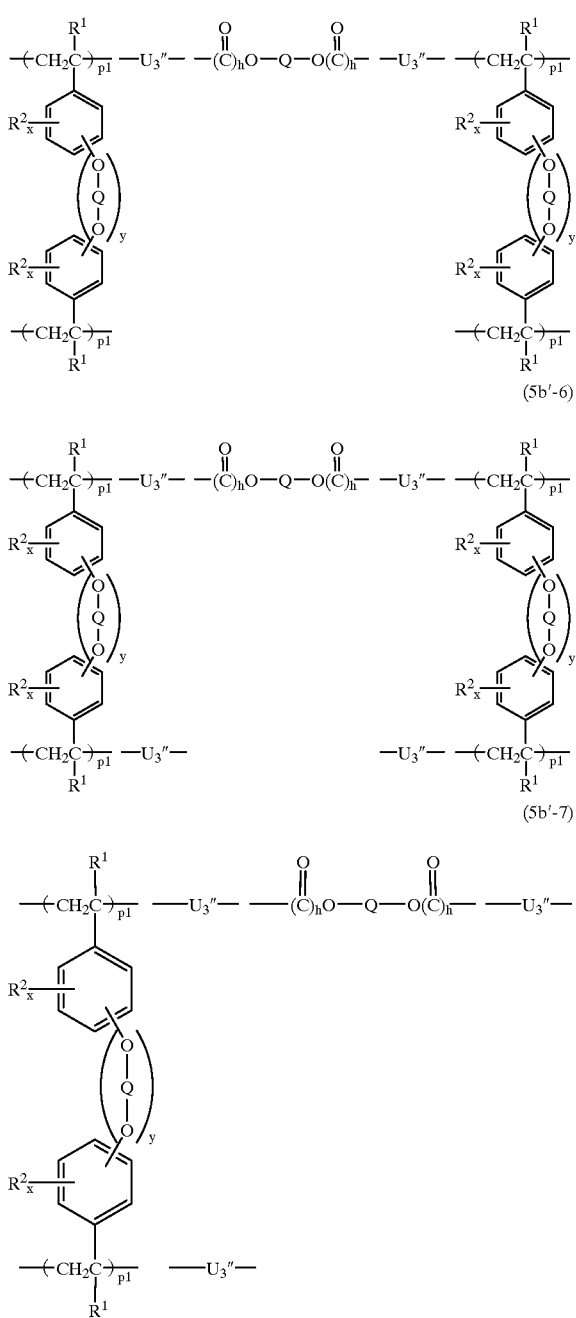

In these formulas, $R^1$, $R^2$, Q, p1, p2, q1, q2, h, x, and y are each as defined above. $U_3'$ represents the units shown below.

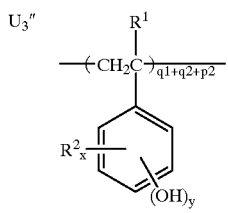

It is possible to introduce not only one, but even two or more different acid labile groups represented by $R^3$ into the polymer of the invention. In this case, first q1 moles of an acid labile group are introduced as described above per mole of all the hydroxyl groups on the polymer having recurring units of formula (1') and terminated with P, then q2 moles of a different acid labile group are introduced by the same method, thereby giving a polymer in which these two types of acid labile groups are introduced. By suitable repetition of this operation, a polymer in which an even greater number of types of acid labile groups are introduced can be produced.

Composition

The chemically amplified positive resist composition of the present invention uses the above-described polymer as the base resin. More particularly, the resist composition of the invention contain the following components:

(A) an organic solvent,
(B) a base resin in the form of a polymer of formula (1) above, preferably formula (5), and
(C) a photoacid generator.

In addition to above components (A) to (C), the resist composition may further include one or more of the following components (D) to (I):

(D) another base resin other than component (B) which is a polymer comprising recurring units of general formula (9):

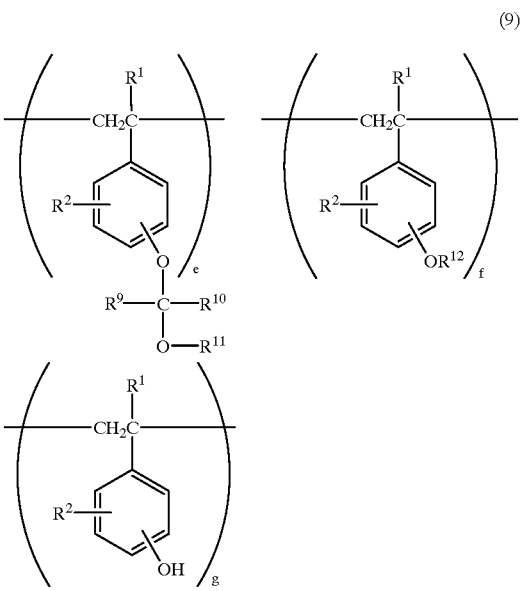

wherein $R^1$, $R^2$, $R^9$, $R^{10}$, and $R^{11}$ are as defined above; $R^{12}$ is an acid labile group other than $-CR^9R^{10}OR^{11}$, letters e and f are 0 or positive numbers and g is a positive number, satisfying e+f+g=1, $0 \leq e/(e+f+g) \leq 0.5$, and $0.4 \leq g/(e+f+g) \leq 0.9$, some of the hydrogen atoms of phenolic hydroxyl groups being replaced by at least one type of acid labile group in an average proportion of 0 mol % to 80 mol % of the entirety, the polymer having a weight average molecular weight of 3,000 to 300,000, wherein the polymer of formula (9) may be crosslinked within a molecule and/or between molecules with a crosslinking group having a C—O—C linkage resulting from reaction of phenolic hydroxyl groups therein with an alkenyl ether compound or halogenated alkyl ether compound, and the amount of the acid labile group and the crosslinking group combined is on the average from more than 0 mol % to 80 mol % of the entirety of hydrogen atoms in the phenolic hydroxyl groups in formula (9) wherein e=0, f=0, and g=1;

(E) a dissolution regulator;
(F) a basic compound;
(G) an aromatic compound having a ≡C—COOH group within the molecule;
(H) an UV absorber; and
(I) an acetylene alcohol derivative.

The organic solvent used as component (A) in the invention may be any organic solvent in which the photoacid generator, base resin, dissolution regulator, and other components are soluble. Illustrative, non-limiting, examples of the organic solvent include ketones such as cyclohexanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate. These solvents may be used alone or in combinations of two or more thereof. Of the above organic solvents, preferred are diethylene glycol dimethyl ether, 1-ethoxy-2-propanol and ethyl lactate, in which the photoacid generator is most soluble, and propylene glycol monomethyl ether acetate which is safe, and mixtures thereof.

The amount of the organic solvent used is preferably about 200 to 1,000 parts, more preferably about 400 to 800 parts by weight per 100 parts by weight of the base resin consisting of components (B) and (D) combined.

Suitable examples of the photoacid generator serving as component (C) include onium salts of general formula (11) below, diazomethane derivatives of formula (12), glyoxime derivatives of formula (13), μ-ketosulfone derivatives, disulfone derivatives, nitrobenzylsulfonate derivatives, sulfonic acid ester derivatives, and imidoyl sulfonate derivatives.

(R$^{30}$)$_b$M$^+$K$^-$ (11)

In the formula, R$^{30}$ is a straight, branched or cyclic alkyl of 1 to 12 carbon atoms, an aryl of 6 to 12 carbon atoms, or an aralkyl of 7 to 12 carbon atoms; M$^+$ is iodonium or sulfonium; K$^-$ is a non-nucleophilic counter-ion; and the letter b is 2 or 3.

Illustrative examples of alkyl groups represented by R$^{30}$ include methyl, ethyl, propyl, butyl, cyclohexyl, 2-oxocyclohexyl, norbornyl, and adamantyl. Exemplary aryl groups include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary aralkyl groups include benzyl and phenethyl. Examples of the non-nucleophilic counter-ion represented by K$^-$ include halide ions such as chloride and bromide; fluoroalkylsulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; and alkylsulfonate ions such as mesylate and butanesulfonate.

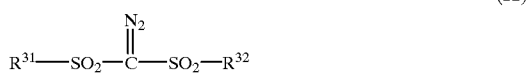
(12)

In the formula, R$^{31}$ and R$^{32}$ are straight, branched or cyclic alkyl or halogenated alkyl groups of 1 to 12 carbon atoms, aryl or halogenated aryl groups of 6 to 12 carbon atoms, or aralkyl groups of 7 to 12 carbon atoms.

Illustrative examples of alkyl groups represented by R$^{31}$ and R$^{32}$ include methyl, ethyl, propyl, butyl, amyl, cyclopentyl, cyclohexyl, norbornyl, and adamantyl. Exemplary halogenated alkyl groups include trifluoromethyl, 1,1,1-trifluoroethyl, 1,1,1-trichloroethyl, and nonafluorobutyl. Exemplary aryl groups include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary halogenated aryl groups include fluorobenzene, chlorobenzene, and 1,2,3,4,5-pentafluorobenzene. Exemplary aralkyl groups include benzyl and phenethyl.

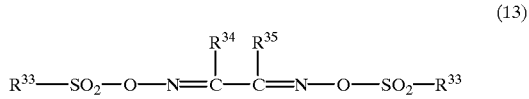
(13)

In the formula, R$^{33}$, R$^{34}$, and R$^{35}$ are straight, branched or cyclic alkyl or halogenated alkyl groups of 1 to 12 carbon atoms, aryl or halogenated aryl groups of 6 to 12 carbon atoms, or aralkyl groups of 7 to 12 carbon atoms. R$^{34}$ and R$^{35}$ may together form a cyclic structure with the proviso that if they form a cyclic structure, each is a straight or branched alkylene group of 1 to 6 carbon atoms.

The alkyl, halogenated alkyl, aryl, halogenated aryl, and aralkyl groups represented by R$^{33}$, R$^{34}$, and R$^{35}$ are exemplified by the same groups mentioned above for R$^{31}$ and R$^{32}$. Examples of alkylene groups represented by R$^{34}$ and R$^{35}$ include methylene, ethylene, propylene, butylene, and hexylene.

Illustrative examples of the photoacid generator include:
onium salts such as diphenyliodonium trifluoromethanesulfonate, (p-tert-butoxyphenyl) phenyliodonium trifluoromethanesulfonate, diphenyliodonium p-toluenesulfonate, (p-tert-butoxyphenyl) phenyliodonium p-toluenesulfonate, triphenylsulfonium trifluoromethanesulfonate, (p-tert-butoxyphenyl)diphenylsulfonium trifluoromethanesulfonate, bis(p-tert-butoxyphenyl)phenylsulfonium trifluoromethanesulfonate, tris(p-tert-butoxyphenyl) sulfonium trifluoromethanesulfonate, triphenylsulfonium p-toluenesulfonate, (p-tert-butoxyphenyl) diphenylsulfonium p-toluenesulfonate, bis(p-tert-butoxyphenyl)phenylsulfonium p-toluenesulfonate, tris (p-tert-butoxyphenyl)sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl)sulfonium trifluoromethanesulfonate, cyclohexylmethyl(2-oxocyclohexyl)sulfonium p-toluenesulfonate, dimethylphenylsulfonium trifluoromethanesulfonate, dimethylphenylsulfonium p-toluenesulfonate, dicyclohexylphenylsulfonium trifluoromethanesulfonate, and dicyclohexylphenylsulfonium p-toluenesulfonate;

diazomethane derivatives such as bis(benzenesulfonyl)diazomethane, bis(p-toluenesulfonyl)diazomethane, bis(xylenesulfonyl)diazomethane, bis(cyclohexylsulfonyl)diazomethane, bis(cyclopentylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane, bis(tert-butylsulfonyl)diazomethane, bis(n-amylsulfonyl)diazomethane, bis(isoamylsulfonyl)diazomethane, bis(sec-amylsulfonyl)diazomethane, bis(tert-amylsulfonyl)diazomethane, 1-cyclohexylsulfonyl-1-(tert-butylsulfonyl)diazomethane, 1-cyclohexylsulfonyl-1-(tert-amylsulfonyl)diazomethane, and 1-tert-amylsulfonyl-1-(tert-butylsulfonyl)diazomethane;

glyoxime derivatives such as bis-o-(p-toluene-sulfonyl)-α-dimethylglyoxime, bis-o-(p-toluenesulfonyl)-α-diphenylglyoxime, bis-o-(p-toluenesulfonyl)-α-dicyclohexylglyoxime, bis-o-(p-toluenesulfonyl)-2,3-pentanedioneglyoxime, bis-o-(p-toluenesulfonyl)-2-methyl-3,4-pentanedioneglyoxime, bis-o-(n-butanesulfonyl)-α-dimethylglyoxime, bis-o-(n-butanesulfonyl)-α-diphenylglyoxime, bis-o-(n-butanesulfonyl)-α-dicyclohexylglyoxime, bis-o-(n-butanesulfonyl)-2,3-pentanedioneglyoxime, bis-o-(n-butanesulfonyl)-2-methyl-3,4-pentanedioneglyoxime, bis-o-(methanesulfonyl)-α-dimethylglyoxime, bis-o-(trifluoromethanesulfonyl)-α-dimethylglyoxime, bis-o-(1,1,1-trifluoroethanesulfonyl)-α-dimethylglyoxime, bis-o-(tert-butanesulfonyl)-α-dimethylglyoxime, bis-o-(perfluorooctanesulfonyl)-α-dimethylglyoxime, bis-o-(cyclohexanesulfonyl)-α-dimethylglyoxime, bis-o-(benzenesulfonyl)-α-dimethylglyoxime, bis-o-(p-fluorobenzenesulfonyl)-α-dimethylglyoxime, bis-o-(p-tert-butylbenzenesulfonyl)-α-dimethylglyoxime, bis-o-(xylenesulfonyl)-α-dimethylglyoxime, and bis-o-(camphorsulfonyl)-α-dimethylglyoxime;

β-ketosulfone derivatives such as 2-cyclohexylcarbonyl-2-(p-toluenesulfonyl)propane and 2-isopropylcarbonyl-2-(p-toluenesulfonyl)propane;

disulfone derivatives such as diphenyl disulfone and dicyclohexyl disulfone;

nitrobenzyl sulfonate derivatives such as 2,6-dinitrobenzyl p-toluenesulfonate and 2,4-dinitrobenzyl p-toluenesulfonate;

sulfonic acid ester derivatives such as 1,2,3-tris(methanesulfonyloxy)benzene, 1,2,3-tris(trifluoromethanesulfonyloxy)benzene, and 1,2,3-tris(p-toluenesulfonyloxy)benzene; and imidoyl sulfonate derivatives such as phthalimidoyl triflate, phthalimidoyl tosylate, 5-norbornene-2,3-dicarboxyimidoyl triflate, 5-norbornene-2,3-dicarboxyimidoyl tosylate, and 5-norbornene-2,3-dicarboxyimidoyl n-butylsulfonate.

Preferred among these photoacid generators are onium salts such as triphenylsulfonium trifluoromethanesulfonate, (p-tert-butoxyphenyl)diphenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, and tris(p-tert-butoxyphenyl)sulfonium p-toluenesulfonate; diazomethane derivatives such as bis(benzenesulfonyl)diazomethane, bis(p-toluenesulfonyl)diazomethane, bis(cyclohexylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane, and bis(tert-butylsulfonyl)diazomethane; and glyoxime derivatives such as bis-o-(p-toluenesulfonyl)-α-dimethylglyoxime and bis-o-(n-butanesulfonyl)-α-dimethylglyoxime. These photoacid generators may be used singly or in combinations of two or more thereof. Onium salts are effective for improving rectangularity, while diazomethane derivatives and glyoxime derivatives are effective for reducing standing waves. The combination of an onium salt with a diazomethane or a glyoxime derivative allows for fine adjustment of the profile.

The photoacid generator is added in an amount of 0.2 to 15 parts by weight, and especially 0.5 to 8 parts by weight, per 100 parts by weight of all the base resins. At less than 0.2 part, the amount of acid generated during exposure would be too low and the sensitivity and resolution are poor, whereas the addition of more than 15 parts would lower the transmittance of the resist and results in a poor resolution.

Component (D) is a base resin other than the polymer of component (B) described above. The other base resin is preferably a polymer having recurring units of the following general formula (9) and having a weight average molecular weight of from 3,000 to 300,000. Including component (D) is advantageous because it enables free control of the pattern dimensions and the pattern configuration.

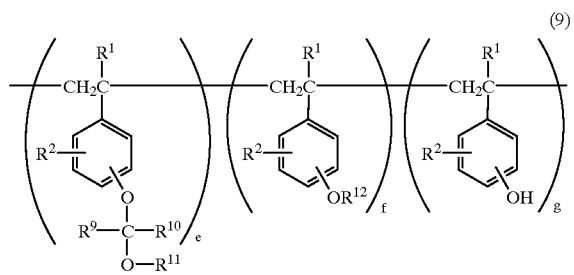

In this formula, $R^1$, $R^2$, $R^9$, $R^{10}$, and $R^{11}$ are as defined above, $R^{12}$ is an acid labile group other than —$CR^9R^{10}OR^{11}$, and the letters e and f are each 0 or a positive number, and g is a positive number, satisfying e+f+g=1, $0 \leq e/(e+f+g) \leq 0.5$, and $0.4 \leq g/(e+f+g) \leq 0.9$.

The polymer of formula (9) may be crosslinked within a molecule and/or between molecules with a crosslinking group having a C—O—C linkage resulting from reaction of phenolic hydroxyl groups therein with an alkenyl ether compound or halogenated alkyl ether compound. The amount of the acid labile group and the crosslinking group combined is on the average from more than 0 mol % to 80 mol % of the entirety of hydrogen atoms in the phenolic hydroxyl groups in formula (9) wherein e=0, f=0, and g=1.

This polymer must have a weight average molecular weight in a range of from 3,000 to 300,000, and preferably from 5,000 to 30,000. At a weight average molecular weight of less than 3,000, the resist has a poor thermal stability, whereas above 300,000, the alkali solubility is too low to provide an acceptable resolution.

When the base resin serving as component (D) has a broad molecular weight dispersity (Mw/Mn), both low molecular weight and high molecular weight polymers are present. Too much low molecular weight polymer results in a decreased thermal stability, while too much high molecular weight polymer makes this base resin insufficiently soluble in alkali, which can lead to footing at the end of pattern formation. Therefore, given that these effects of molecular weight and molecular weight distribution tend to increase as the pattern rule becomes smaller, to obtain a resist suitable for a fine pattern rule, the base resin should preferably have a narrow molecular weight dispersity of 1.0 to 2.5, and especially 1.0 to 1.5.

The other baser resin as component (D) and the base resin as component (B) are preferably formulated in a ratio of from 0:100 to 90:10, and especially 0:100 to 50:50. When the base resin (D) is formulated in an amount greater than this weight ratio, the desirable effects of the base resin (B) (comprised of the P-terminated polymer) are not achieved.

The resist composition of the invention may also include, as component (E), a dissolution regulator for enhancing the contrast. The dissolution regulator is a compound having an average molecular weight within a range of 100 to 1,000, and preferably 150 to 800, and having on the molecule at least two phenolic hydroxyl groups, in which an average of from 0 to 100 mol % of all the hydrogen atoms on the phenolic hydroxyl groups have been replaced with acid labile groups.

The degree of substitution of the hydrogen atoms on the phenolic hydroxyl groups with acid labile groups is on average at least 0 mol %, and preferably at least 30 mol %, of all the phenolic hydroxyl groups. The upper limit is 100 mol %, and preferably 80 mol %.

Preferable examples of such compounds having two or more phenolic hydroxyl groups include those of formulas (i) to (xi) below.

(i)
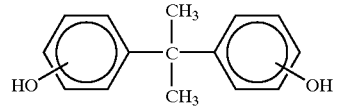

(ii)
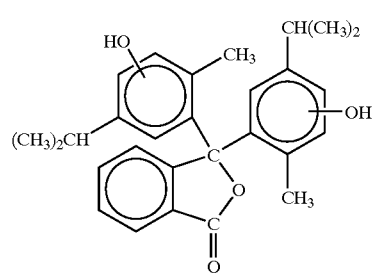

(iii)
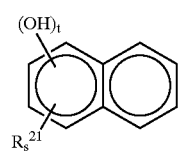

(iv)
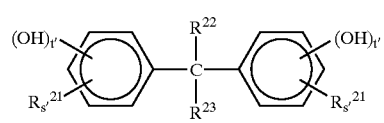

(v)
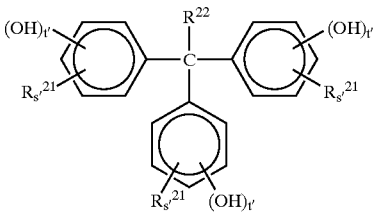

(vi)
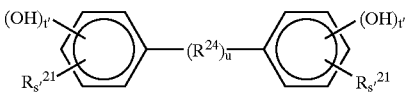

(vii)
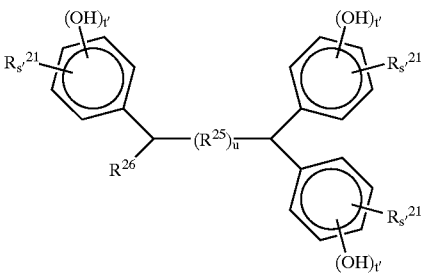

(viii)
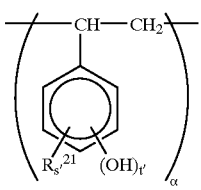

(ix)
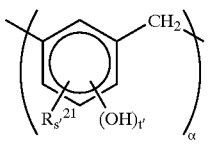

(x)
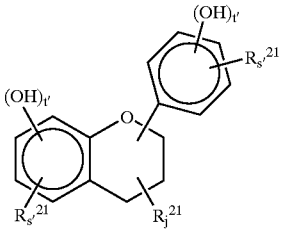

(xi)
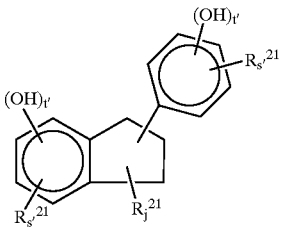

In these formulas, $R^{21}$ and $R^{22}$ are each hydrogen or a straight or branched alkyl or alkenyl of 1 to 8 carbon atoms; $R^{23}$ is hydrogen, a straight or branched alkyl or alkenyl of 1 to 8 carbon atoms, or —$(R^{27})_h$—COOH; $R^{24}$ is —$(CH_2)_i$— (where i=2 to 10), an arylene of 6 to 10 carbon atoms, carbonyl, sulfonyl, an oxygen atom, or a sulfur atom; $R^{25}$ is an alkylene of 1 to 10 carbon atoms, an arylene of 6 to 10 carbon atoms, carbonyl, sulfonyl, an oxygen atom, or a sulfur atom; $R^{26}$ is hydrogen, a straight or branched alkyl or alkenyl of 1 to 8 carbon atoms, or a hydroxyl-substituted phenyl or naphthyl; $R^{27}$ is a straight or branched alkylene of 1 to 10 carbon atoms; the letter j is an integer from 0 to 5; u and h are each 0 or 1; s, t, s', t', s", and t" are each numbers which satisfy s+t=8, s'+t'=5, and s"+t"=4, and are such that each phenyl skeleton has at least one hydroxyl group; and α is a number such that the molecular weight of the compounds of formula (viii) or (ix) is from 100 to 1,000.

In the above formulas, suitable examples of $R^{21}$ and $R^{22}$ include hydrogen, methyl, ethyl, butyl, propyl, ethynyl, and cyclohexyl; suitable examples of $R^{23}$ include the same groups as for $R^{21}$ and $R^{22}$, as well as —COOH and —CH$_2$COOH; suitable examples of $R^{24}$ include ethylene, phenylene, carbonyl, sulfonyl, oxygen, and sulfur; suitable examples of $R^{25}$ include methylene as well as the same groups as for $R^{24}$; and suitable examples of $R^{26}$ include hydrogen, methyl, ethyl, butyl, propyl, ethynyl, cyclohexyl, and hydroxylsubstituted phenyl or naphthyl.

Exemplary acid labile groups on the dissolution regulator include groups of general formula (7) or (8) above, tertiary alkyl groups of 4 to 20 carbon atoms, trialkylsilyl groups in which each of the alkyls has 1 to 6 carbon atoms, and oxoalkyl groups of 4 to 20 carbon atoms.

The compound serving here as the dissolution regulator, in which phenolic hydroxyl groups have been partially substituted with acid labile groups, may be formulated in an amount of 0 to 50 parts, preferably 5 to 50 parts, and more preferably 10 to 30 parts by weight, per 100 parts by weight of the base resin, and may be used singly or as a mixture of two or more thereof. An amount of less than 5 parts may fail to yield an improved resolution, whereas the use of more than 50 parts would lead to thinning of the patterned film, and thus a decline in resolution.

The dissolution regulators can be prepared by chemically reacting acid labile groups with a compound having phenolic hydroxyl groups in the same manner as described earlier for the base resin.

Instead of, or in addition to, the above-described dissolution regulator, the resist composition of the invention may include, as another dissolution regulator, a partially substituted compound having a weight average molecular weight of more than 1,000 and up to 3,000, and having phenolic hydroxyl groups on the molecule, in which an average of 0% to 60% of all the hydrogen atoms on the phenolic hydroxyl groups have been substituted with acid labile groups.

The compound in which the phenolic hydroxyl group hydrogens are partially substituted with these acid labile groups is preferably one or more selected from among compounds having recurring units of general formula (14) below and a weight average molecular weight of more than 1,000 and up to 3,000.

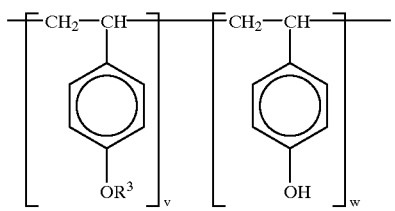

(14)

In the formula, $R^3$ is an acid labile group, and v and w are respectively numbers satisfying $0 \leq v/(v+w) \leq 0.6$.

Suitable examples of the acid labile groups in the other dissolution regulator include groups of general formula (7) or (8), tertiary alkyl groups of 4 to 20 carbon atoms, trialkylsilyl groups in which each of the alkyls has 1 to 6 carbon atoms, and oxoalkyl groups of 4 to 20 carbon atoms.

Advantageously, the other dissolution regulator just described is formulated in an amount such that the total amount of dissolution regulator, including the dissolution regulator described earlier, is 0 to 50 parts, preferably 0 to 30 parts, and more preferably at least 1 part by weight, per 100 parts by weight of the base resins.

The other dissolution regulator can be prepared by chemically reacting acid labile groups with a compound having phenolic hydroxyl groups in the same manner as described earlier for the base resin.

The basic compound used as component (F) is preferably a compound capable of suppressing the rate of diffusion when the acid generated by the photoacid generator diffuses within the resist film. The inclusion of this type of basic compound holds down the rate of acid diffusion within the resist film, resulting in better resolution. In addition, it suppresses changes in sensitivity following exposure, thus reducing substrate and environment dependence, as well as improving the exposure latitude and the pattern profile.

Examples of basic compounds suitable for use as component (F) include primary, secondary, and tertiary aliphatic amines, mixed amines, aromatic amines, heterocyclic amines, carboxyl group-bearing nitrogenous compounds, sulfonyl group-bearing nitrogenous compounds, hydroxyl group-bearing nitrogenous compounds, hydroxyphenyl group-bearing nitrogenous compounds, alcoholic nitrogenous compounds, amide derivatives, and imide derivatives. Of these, aliphatic amines are especially preferred.

Examples of suitable primary aliphatic amines include ammonia, methylamine, ethylamine, n-propylamine, isopropylamine, n-butylamine, iso-butylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, di-iso-propylamine, di-n-butylamine, di-iso-butylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, tri-iso-propylamine, tri-n-butylamine, tri-iso-butylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine. Examples of suitable aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6- dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridone, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable carboxyl group-bearing nitrogenous compounds include aminobenzoic acid, indolecarboxylic acid, and amino acid derivatives (e.g. nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of suitable sulfonyl group-bearing nitrogenous compounds include 3-pyridinesulfonic acid and pyridinium p-toluenesulfonate. Examples of suitable hydroxyl group-bearing nitrogenous compounds, hydroxyphenyl group-bearing nitrogenous compounds, and alcoholic nitrogenous compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide. Examples of suitable amide derivatives include formamide, N-methylformamide, N,N-dimethylformamide, acetamide, N-methylacetamide, N,N-dimethylacetamide, propionamide, and benzamide. Suitable imide derivatives include phthalimide, succinimide, and maleimide.

In addition, basic compounds of the following general formulas (15) and (16) may also be included.

(15)

(16)

In the formulas, $R^{41}$, $R^{42}$ $R^{43}$ $R^{47}$ and $R^{48}$ are independently straight, branched or cyclic alkylenes of 1 to 20 carbon atoms; $R^{44}$, $R^{45}$, $R^{46}$, $R^{49}$ and $R^{50}$ are hydrogen, alkyls of 1 to 20 carbon atoms, or amino; $R^{44}$ and $R^{45}$, $R^{45}$ and $R^{46}$, $R^{44}$ and $R^{46}$, $R^{44}$ with $R^{45}$ and $R^{46}$, and $R^{49}$ and $R^{50}$ may bond together to form rings; and S, T and U are each integers from 0 to 20, with the proviso that hydrogen is excluded from $R^{44}$, $R^{45}$, $R^{46}$, $R^{49}$ and $R^{50}$ when S, T and U are equal to 0.

The alkylene groups represented by $R^{41}$, $R^{42}$, $R^{43}$, $R^{47}$ and $R^{48}$ preferably have 1 to 20 carbon atoms, more preferably 1 to 10 carbon atoms, and most preferably 1 to 8 carbon atoms. Examples include methylene, ethylene, n-propylene, isopropylene, n-butylene, isobutylene, n-pentylene, isopentylene, hexylene, nonylene, decylene, cyclopentylene, and cyclohexylene.

The alkyl groups represented by $R^{44}$, $R^{45}$, $R^{46}$, $R^{49}$ and $R^{50}$ preferably have 1 to 20 carbon atoms, more preferably 1 to 8 carbon atoms, and most preferably 1 to 6 carbon atoms, and may be straight, branched or cyclic. Examples include methyl, ethyl, n-propyl, isopropyl, n-butyl, isobutyl, tert-butyl, n-pentyl, isopentyl, hexyl, nonyl, decyl, dodecyl, tridecyl, cyclopentyl, and cyclohexyl.

Where $R^{44}$ and $R^{45}$, $R^{45}$ and $R^{46}$, $R^{44}$ and $R^{46}$, $R^4$ with $R^{45}$ and $R^{46}$, and $R^{49}$ and $R^{50}$ form rings, the rings preferably have 1 to 20 carbon atoms, more preferably 1 to 8 carbon atoms, and most preferably 1 to 6 carbon atoms, and may have branching alkyl groups of 1 to 6 carbon atoms, and especially 1 to 4 carbon atoms.

S, T, and U are each integers from 0 to 20, preferably from 1 to 10, and more preferably from 1 to 8.

Illustrative examples of the compounds of formulas (15) and (16) include tris{2-(methoxymethoxy)ethyl}amine, tris{2-(methoxyethoxy)ethyl}amine, tris[2-{(2-methoxyethoxy)methoxy}ethyl]amine, tris{2-(2-methoxyethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris[2-{(2-hydroxyethoxy)ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4, 1-aza-15-crown-5, and 1-aza-18-crown-6. Especially preferred basic compounds are tertiary amines, aniline derivatives, pyrrolidine derivatives, pyridine derivatives, quinoline derivatives, amino acid derivatives, hydroxyl group-bearing nitrogenous compounds, hydroxyphenyl group-bearing nitrogenous compounds, alcoholic nitrogenous compounds, amide derivatives, imide derivatives, tris{2-(methoxymethoxy)ethyl}amine, tris{2-(2-methoxyethoxy)ethyl}amine, tris[2-{(2-methoxyethoxy)methyl}ethyl]amine, and 1-aza-15-crown-5.

The above-described basic compound may be used singly or in combinations of two or more thereof, and is preferably formulated in an amount of 0.01 to 2 parts, and especially 0.01 to 1 part by weight, per 100 parts by weight of all the base resins. At less than 0.01 part, the desired effects of the basic compound would not be apparent, while the use of more than 2 parts would result in too low a sensitivity.

Exemplary, non-limiting aromatic compounds bearing a ≡C—COOH group (preferably —$R^{57}$—COOH wherein $R^{57}$ is a straight or branched alkylene group having 1 to 10 carbon atoms) which may be formulated as component (G) include one or more compounds selected from Groups I and II below. Including component (G) improves the PED stability of the resist and ameliorates edge roughness on nitride film substrates.

Group I:

Compounds in which some or all of the hydrogen atoms on the phenolic hydroxyl groups of the compounds of general formulas (17) to (26) below have been replaced with —$R^{57}$—COOH (wherein $R^{57}$ is a straight or branched alkylene of 1 to 10 carbon atoms), and in which the molar ratio C/(C+D) of phenolic hydroxyl groups (C) to ≡C—COOH groups (D) in the molecule is from 0.1 to 1.0.

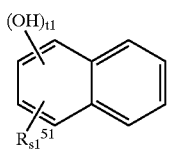

(17)

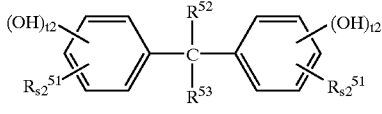

(18)

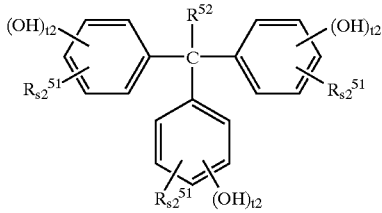

(19)

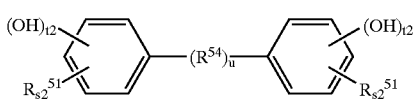

(20)

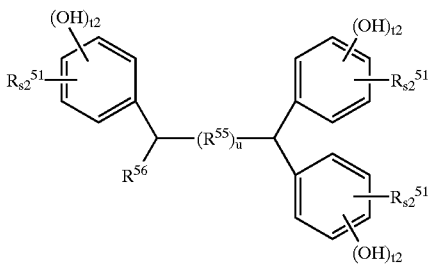

(21)

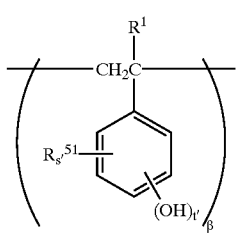

(22)

-continued

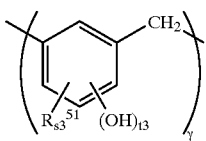

(23)

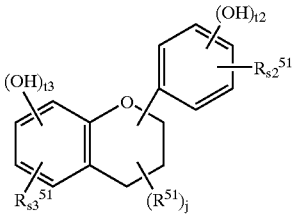

(24)

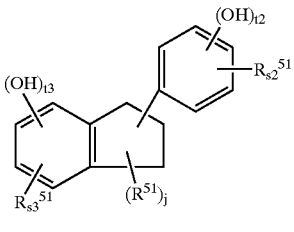

(25)

(26)

In these formulas, $R^1$ is hydrogen or methyl; $R^{51}$ and $R^{52}$ are each hydrogen or a straight or branched alkyl or alkenyl of 1 to 8 carbon atoms; $R^{53}$ is hydrogen, a straight or branched alkyl or alkenyl of 1 to 8 carbon atoms, or a $(R^{57})_h$—COOR' group (R' being hydrogen or —$R^{57}$—COOH); $R^{54}$ is —$(CH_2)_i$— (where i is 2 to 10), an arylene of 6 to 10 carbon atoms, carbonyl, sulfonyl, an oxygen atom, or a sulfur atom; $R^{55}$ is an alkylene of 1 to 10 carbon atoms, an arylene of 6 to 10 carbon atoms, carbonyl, sulfonyl, an oxygen atom, or a sulfur atom; $R^{56}$ is hydrogen, a straight or branched alkyl or alkenyl of 1 to 8 carbon atoms, or a hydroxyl-substituted phenyl or naphthyl; $R^{57}$ is a straight or branched alkylene of 1 to 10 carbon atoms; $R^{58}$ is hydrogen, a straight or branched alkyl or alkenyl of 1 to 8 carbon atoms, or a —$R^{57}$—COOH group; the letter j is an integer from 0 to 5; u and h are each 0 or 1; s1, t1, s2, t2, s3, t3, s4, and t4 are each numbers which satisfy s1+t1=8, s2+t2=5, s3+t3=4, and s4+t4=6, and are such that each phenyl skeleton has at least one hydroxyl group; β is a number such that the weight average molecular weight of the compound of formula (21) is from 1,000 to 5,000; and γ is a number such that the weight average molecular weight of the compound of formula (22) is from 1,000 to 10,000.

Group II:

Compounds of general formulas (27) and (28) below.

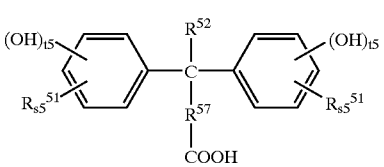

(27)

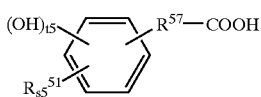 (28)

In these formulas, $R^{51}$, $R^{52}$, and $R^{57}$ are as defined above; and s5 and t5 are numbers which satisfy $s5 \leqq 0$, $t5 \leqq 0$, and $s5+t5=5$.

Illustrative, non-limiting examples of compounds suitable as above component (G) include compounds of the general formulas III-1 to III-14 and IV-1 to IV-6 below.

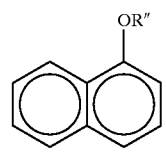 (III-1)

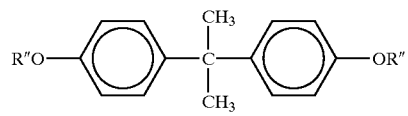 (III-2)

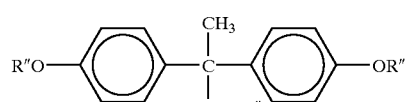 (III-3)

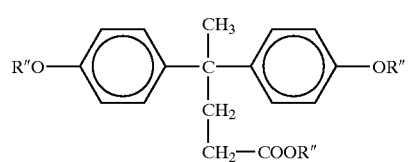 (III-4)

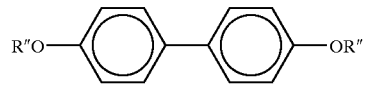 (III-5)

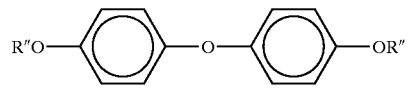 (III-6)

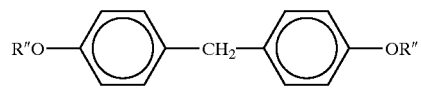 (III-7)

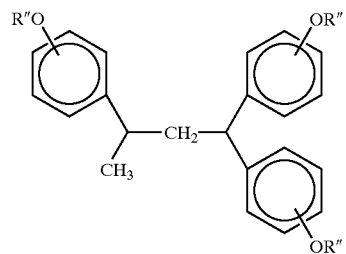 (III-8)

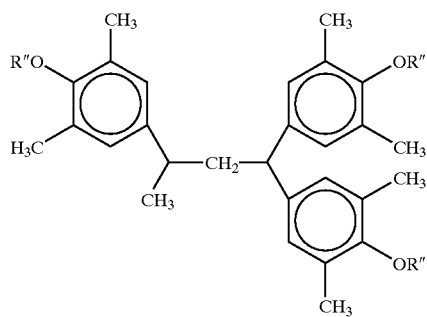 (III-9)

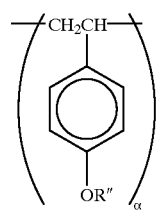 (III-10)

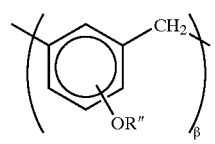 (III-11)

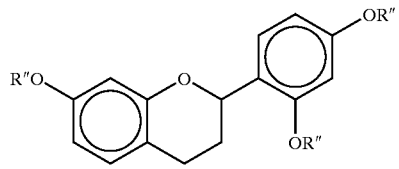 (III-12)

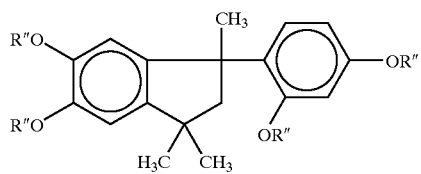 (III-13)

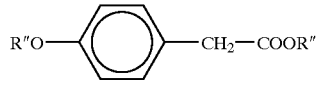 (III-14)

In the above formulas, R" is hydrogen or a $CH_2COOH$ group such that the $CH_2COOH$ group accounts for 10 to 100 mol % of R" in each compound, α and β are as defined above.

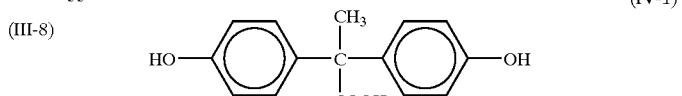 (IV-1)

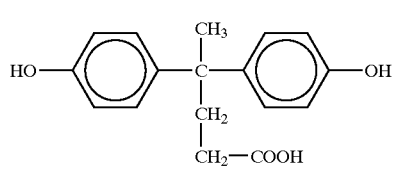 (IV-2)

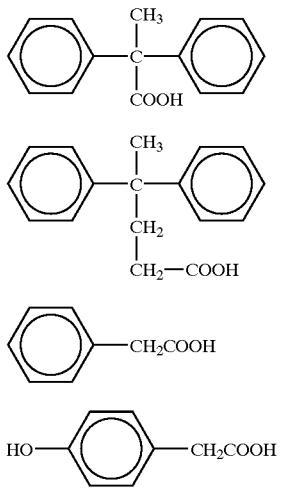

(IV-3)

(IV-4)

(IV-5)

(IV-6)

The aromatic compound bearing a ≡C—COOH group within the molecule may be used singly or as combinations of two or more thereof.

The aromatic compound bearing a ≡C—COOH group within the molecule is added in an amount ranging from 0.1 to 5 parts, and preferably 1 to 3 parts by weight, per 100 parts by weight of the base resin. At less than 0.1 part, sufficient improvement would not be achieved with regard to either footing on nitride film substrates or PED improvement. On the other hand, at more than 5 parts, the resolution of the resist material would be unacceptably low.

The resist composition of the invention may further include an UV absorber of component (H) which is typically a compound having a molar absorbance of not more than 10,000 at a wavelength of 248 nm. The inclusion of the UV absorber allows the resist composition to be designed and controlled to have a suitable transmittance for substrates of differing reflectances.

Illustrative examples of the UV absorber include fused polycyclic hydrocarbon derivatives such as pentalene, indene, naphthalene, azulene, heptalene, biphenylene, indacene, fluorene, phenalene, phenanthrene, anthracene, fluoranthene, acephenanthrylene, aceanthrylene, triphenylene, pyrene, chrysene, pleiadene, picene, perylene, pentaphene, pentacene, benzophenanthrene, anthraquinone, anthrone, benzanthrone, 2,7-dimethoxynaphthalene, 2-ethyl-9,10-dimethoxyanthracene, 9,10-dimethylanthracene, 9-ethoxyanthracene, 1,2-naphthoquinone, 9-fluorene, and the compounds of general formulas (29) and (30) below; fused heterocyclic derivatives such as thioxanthene-9-one, thianthrene, and dibenzothiophene; benzophenone derivatives such as 2,3,4-trihydroxybenzophenone, 2,3,4,4'-tetrahydroxybenzophenone, 2,4-dihydroxybenzophenone, 3,5-dihydroxybenzophenone, 4,4'-dihydroxybenzophenone, and 4,4'-bis(dimethylamino)benzophenone; and squaric acid derivatives such as squaric acid and dimethyl squarate.

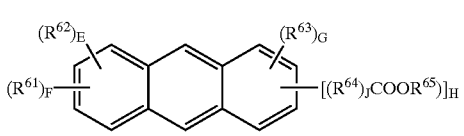

(29)

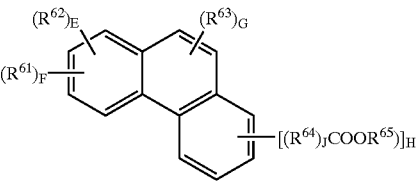

(30)

In the formulas, $R^{61}$ to $R^{63}$ are independently hydrogen, straight or branched alkyl, straight or branched alkoxy, straight or branched alkoxyalkyl, straight or branched alkenyl, or aryl. $R^{64}$ is a substituted or unsubstituted divalent aliphatic hydrocarbon group which may contain an oxygen atom, a substituted or unsubstituted divalent alicyclic hydrocarbon group which may contain an oxygen atom, a substituted or unsubstituted divalent aromatic hydrocarbon group which may contain an oxygen atom, or an oxygen atom. Also, $R^{65}$ is an acid labile group; the letter J is 0 or 1; E, F, and G are each 0 or integers from 1 to 9; H is a positive integer from 1 to 10; and E+F+G+H≦10.

More particularly, in above formulas (29) and (30), $R^{61}$ to $R^{63}$ are independently hydrogen, straight or branched alkyl, straight or branched alkoxy, straight or branched alkoxyalkyl, straight or branched alkenyl, or aryl. Preferable examples of the straight or branched alkyl groups include those having 1 to 10 carbon atoms, such as methyl, ethyl, n-propyl, isopropyl, n-butyl, sec-butyl, tert-butyl, hexyl, cyclohexyl, and adamantyl; of these, the use of methyl, ethyl, isopropyl, or tert-butyl is especially preferred. Preferable examples of straight or branched alkoxy groups include those having 1 to 8 carbon atoms, such as methoxy, ethoxy, propoxy, isopropoxy, n-butoxy, sec-butoxy, tert-butoxy, hexyloxy, and cyclohexyloxy; of these, the use of methoxy, ethoxy, isopropoxy, and tert-butoxy is especially preferred. Preferable examples of the straight or branched alkoxyalkyl groups include those having 2 to 10 carbon atoms, such as methoxymethyl, 1-ethoxyethyl, 1-ethoxypropyl, 1-propoxyethyl, and tert-butoxyethyl; of these, the use of methoxymethyl, 1-ethoxyethyl, 1-ethoxypropyl, and 1-propoxyethyl is especially preferred. Preferable examples of the straight or branched alkenyl groups Include those having 2 to 4 carbon atoms, such as vinyl, propenyl, allyl, and butenyl. Preferable examples of the aryl groups include those having 6 to 14 carbon atoms, such as phenyl, xylyl, toluyl, and cumenyl.

$R^{64}$ is a substituted or unsubstituted divalent aliphatic hydrocarbon group which may contain an oxygen atom, a substituted or unsubstituted divalent alicyclic hydrocarbon group which may contain an oxygen atom, a substituted or unsubstituted divalent aromatic hydrocarbon group which may contain an oxygen atom, or an oxygen atom; and J in the formula is 0 or 1. When J is 0, the —$R^{64}$— linkage is a single bond.

Preferable examples of substituted or unsubstituted divalent aliphatic hydrocarbon groups which may contain an oxygen atom include those having 1 to 10 carbon atoms, such as methylene, ethylene, n-propylene, isopropylene, n-butylene, sec-butylene, —CH$_2$O—, —CH$_2$CH$_2$O—, and —CH$_2$OCH$_2$—. Of these, methylene, ethylene, —CH$_2$O—, and —CH$_2$CH$_2$O— are preferable.

Preferable examples of substituted or unsubstituted divalent alicyclic hydrocarbon groups which may contain an oxygen atom include those having 5 to 10 carbon atoms, such as 1,4-cyclohexylene, 2-oxacyclohexan-1,4-ylene, and 2-thiacyclohexan-1,4-ylene.

Preferable examples of substituted or unsubstituted divalent aromatic hydrocarbon groups which may contain an oxygen atom include those having 6 to 14 carbon atoms, such as o-phenylene, p-phenylene, 1,2-xylen-3,6-ylene, toluen-2,5-ylene, and 1-cumen-2,5-ylene; and allylalkylene groups having 6 to 14 carbon atoms, such as —CH$_2$Ph—, —CH$_2$PhCH$_2$—, —CH$_2$Ph—, and —OCH$_2$PhCH$_2$O— (wherein Ph stands for phenylene).

R$^{65}$ is an acid labile group, the term "acid labile group" referring here to a moiety in which a carboxyl group has been substituted with one or more functional groups cleavable in the presence of an acid. This maybe any moiety which cleaves in the presence of an acid to liberate an alkali-soluble functional group, although moieties having general formula (31a), (31b), or (31c) below are preferred.

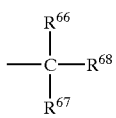
(31a)

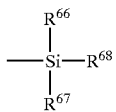
(31b)

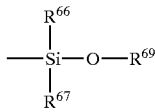
(31c)

In the formulas, R$^{66}$ to R$^{69}$ are independently hydrogen or a straight or branched alkyl, straight or branched alkoxy, straight or branched alkoxyalkyl, straight or branched alkenyl, or aryl, any of which groups may have a carbonyl on the chain thereof, provided that R$^{66}$ to R$^{69}$ are not all hydrogen. R$^{66}$ and R$^{67}$ may bond together to form a ring. R$^{69}$ is a straight or branched alkyl, straight or branched alkoxyalkyl, straight or branched alkenyl, or aryl, any of which may have a carbonyl on the chain thereof. R$^{69}$ may bond with R$^{66}$ to form a ring.

These straight or branched alkyl, straight or branched alkoxy, straight or branched alkoxyalkyl, straight or branched alkenyl, and aryl groups are exemplified by the same groups mentioned above for R$^{61}$ to R$^{63}$.

Examples of rings formed by the combination of R$^{66}$ and R$^{67}$ in formula (31a) include those having 4 to 10 carbon atoms, such as cyclohexylidene, cyclopentylidene, 3-oxocyclohexylidene, 3-oxo-4-oxacyclohexylidene, and 4-methylcyclohexylidene.

Examples of rings formed by the combination of R$^{66}$ and R$^{67}$ in formula (31b) include those having 3 to 9 carbon atoms, such as 1-silachlorohexylidene, 1-silacyclopentylidene, 3-oxo-1-silacyclopentylidene, and 4-methyl-1-silacyclopentylidene.

Examples of rings formed by the combination of R$^{69}$ and R$^{66}$ in formula (31c) include those having 4 to 10 carbon atoms, such as 2-oxacyclohexylidene, 2-oxacyclopentylidene, and 2-oxa-4-methylcyclohexylidene.

Exemplary groups represented by the formula (31a) include tertiary alkyl groups having 4 to 10 carbon atoms, such as tert-amyl, 1,1-dimethylethyl, 1,1-dimethylbutyl, 1-ethyl-1-methylpropyl, and 1,1-diethylpropyl; and 3-oxoalkyl groups, such as 1,1-dimethyl-3-oxobutyl, 3-oxocyclohexyl, and 1-methyl-3-oxo-4-oxacyclohexyl.

Exemplary groups represented by the formula (31b) include trialkylsilyl groups having 3 to 10 carbon atoms, such as trimethylsilyl, ethyldimethylsilyl, dimethylpropylsilyl, diethylmethylsilyl, triethylsilyl, and tert-butyldimethylsilyl.

Exemplary groups represented by the formula (31c) include groups having 2 to 8 carbon atoms, such as 1-methoxymethyl, 1-methoxyethyl, 1-ethoxyethyl, 1-ethoxypropyl, 1-ethoxyisobutyl, 1-n-propoxyethyl, 1-tert-butoxyethyl, 1-n-butoxyethyl, 1-isobutoxyethyl, 1-tert-pentoxyethyl, 1-cyclohexyloxyethyl, 1-(2'-n-butoxyethoxy)ethyl, 1-(2'-ethylhexyloxy)ethyl, 1-{4'-(acetoxymethyl)cyclohexylmethyloxy}ethyl, 1-{4'-(tert-butoxycarbonyloxymethyl)cyclohexylmethyloxy}ethyl, 2-methoxy-2-methylethyl, 1-ethoxypropyl, dimethoxymethyl, diethoxymethyl, tetrahydrofuranyl, and tetrahydropyranyl.

In above formulas (29) and (30), E, F and G are each 0 or positive integers from 1 to 9, and H is a positive integer from 1 to 10, so as to satisfy E+F+G+H≦10.

Preferable examples of compounds represented by formulas (29) and (30) include the compounds shown in formulas (32a) to (32j) below.

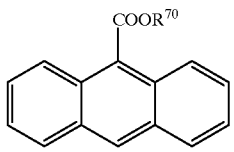
(32a)

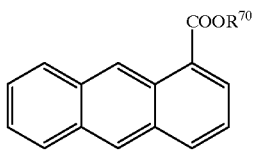
(32b)

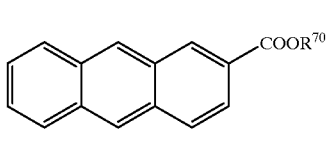
(32c)

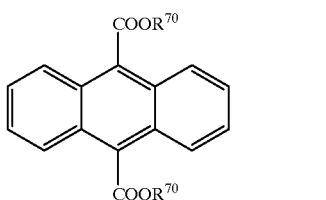
(32d)

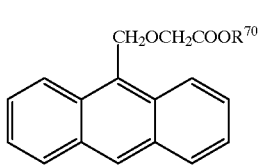
(32e)

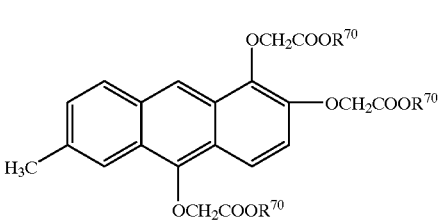
(32f)

-continued

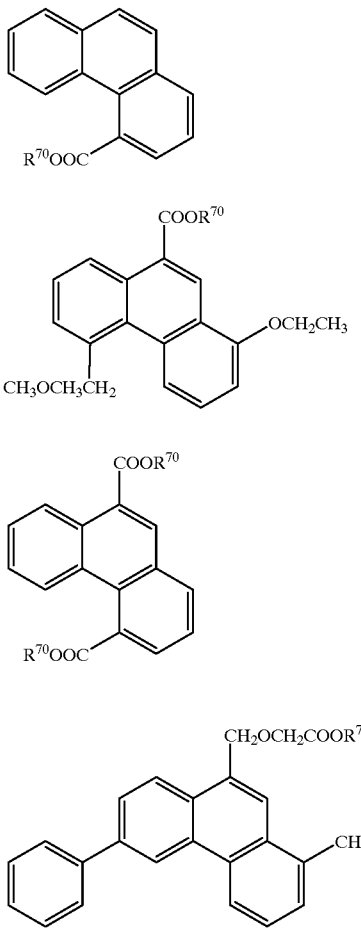

(32g)

(32h)

(32i)

(32j)

In these formulas, $R^{70}$ is an acid labile group.

Further examples of the UV absorber include diarylsulfoxide derivatives such as bis(4-hydroxyphenyl)sulfoxide, bis(4-tert-butoxyphenyl)sulfoxide, bis(4-tert-butoxycarbonyloxyphenyl)sulfoxide, and bis[4-(1-ethoxyethoxy)phenyl]sulfoxide; diarylsulfone derivatives such as bis(4-hydroxyphenyl)sulfone, bis(4-tert-butoxyphenyl)sulfone, bis(4-tert-butoxycarbonyloxyphenyl)sulfone, bis[4-(1-ethoxyethoxy)phenyl]sulfone, and bis[4-(1-ethoxypropoxy)phenyl]sulfone; diazo compounds such as benzoquinonediazide, naphthoquinonediazide, anthraquinonediazide, diazofluorene, diazotetralone, and diazophenanthrone; and quinonediazide group-containing compounds such as the complete or partial ester compounds of naphthoquinone-1,2-diazide-5-sulfonate chloride with 2,3,4-trihydroxybenzophenone, and the complete or partial ester compounds of 2-diazide-4-sulfonate chloride with 2,4,4'-trihydroxybenzophenone.

Preferable examples of the UV absorber include tert-butyl 9-anthracenecarboxylate, tert-amyl 9-anthracenecarboxylate, tert-methoxymethyl 9-anthracenecarboxylate, tert-ethoxyethyl 9-anthracenecarboxylate, tert-tetrahydropyranyl 9-anthracenecarboxylate, tert-tetrahydrofuranyl 9-anthracenecarboxylate, and partial ester compounds of naphthoquinone-1,2-diazide-5-sulfonate chloride with 2,3,4-trihydroxybenzophenone.

The UV absorber used as component (H) is included in an amount of preferably 0 to 10 parts, more preferably 0.5 to 10 parts, and even more preferably 1 to 5 parts by weight, per 100 parts by weight of the base resin.

The resist composition of the invention may additionally include, as component (I), an acetylene alcohol derivative for the purpose of enhancing the shelf stability.

Examples of compounds preferred for use as the acetylene alcohol derivative include those having general formulas (33) and (34) below.

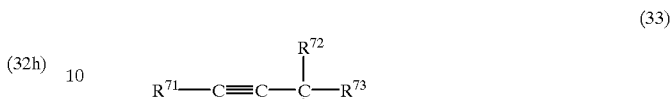

(33)

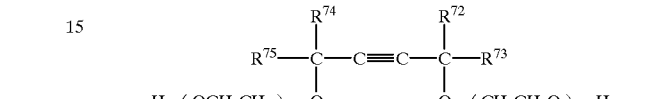

(34)

In the formulas, $R^{71}$, $R^{72}$, $R^{73}$, $R^{74}$, and $R^{75}$ are each hydrogen or a straight, branched, or cyclic alkyl of 1 to 8 carbon atoms; and X and Y are each 0 or a positive integer, satisfying $0 \leq X \leq 30$, $0 \leq Y \leq 30$, and $0 \leq X+Y \leq 40$.

Preferable examples of the acetylene alcohol derivative include Surfynol 61, Surfynol 82, Surfynol 104, Surfynol 104E, Surfynol 104H, Surfynol 104A, Surfynol TG, Surfynol PC, Surfynol 440, Surfynol 465, and Surfynol 485 from Air Products and Chemicals Inc., and Olfin E1004 from Nisshin Chemical Industry K. K.

The acetylene alcohol derivative is added in an amount of preferably 0.01 to 2% by weight, and more preferably 0.02 to 1% by weight, per 100% by weight of the resist composition. Less than 0.01% by weight would be ineffective for improving coating characteristics and shelf stability, whereas more than 2% by weight would result in a resist having a low resolution.

The resist composition of the invention may include, as an optional ingredient, a surfactant which is commonly used for improving the coating characteristics. Optional ingredients may be added in conventional amounts so long as this does not compromise the objects of the invention.

A nonionic surfactant is preferred, examples of which include perfluoroalkyl polyoxyethylene ethanols, fluorinated alkyl esters, perfluoroalkylamine oxides, and fluorinated organosiloxane compounds. Illustrative examples include Florade FC-430 and FC-431 from Sumitomo 3M Ltd., Surflon S-141, S-145, S-381 and S-383 from Asahi Glass Co., Ltd., Unidyne DS-401, DS-403, and DS-451 from Daikin Industries Ltd., Megafac F-8151, F-171, F-172, F-173 and F-177 from Dainippon Ink & Chemicals, Inc., and X-70-092 and X-70-093 from Shin-Etsu Chemical Co., Ltd. Preferred surfactants include Florade FC-430 from Sumitomo 3M Ltd. and X-70-093 from Shin-Etsu Chemical Co., Ltd.

Pattern formation using the chemical amplification positive resist composition of the invention may be carried out by a known lithographic technique. For example, the resist composition may be applied onto a substrate such as a silicon wafer by spin coating or the like to form a resist film having a thickness of 0.5 to 2.0 µm, which is then pre-baked on a hot plate at 60 to 150° C. for 1 to 10 minutes, and preferably at 80 to 120° C. for 1 to 5 minutes. A patterning mask having the desired pattern may then be placed over the resist film, and the film exposed through the mask to an electron beam or to high-energy radiation such as deep-UV rays having a wavelength below 300 nm, an excimer laser, or x-rays in a dose of about 1 to 20 mJ/cm², and preferably about 10 to 100 mJ/cm$^2$, then post-exposure baked (PEB) on a hot plate at 60 to 150° C. for 1 to 5 minutes, and preferably at 80 to 120° C. for 1 to 3 minutes. Finally, development may be carried out using as the developer an aqueous alkali solution, such as 0.1 to 5%, and preferably 2 to 3%, tetramethylammonium hydroxide (TMAH), this being done by a conventional method such as dipping, puddling, or spraying for a period of 0.1 to 3 minutes, and preferably 0.5 to 2 minutes. These steps result in the formation of the desired pattern on the substrate. Of the various types of high-energy radiation that may be used, the resist composition of the invention is best suited to fine pattern formation with, in particular, deep-UV rays having a wavelength of 193 to 254 nm, an excimer laser, x-rays, or an electron beam. The desired pattern may not be obtainable outside the upper and lower limits of the above range.

The chemical amplification type positive working resist composition comprising the polymer of the invention is sensitive to high-energy radiation, has excellent sensitivity, resolution, and plasma etching resistance, and provides a resist pattern of outstanding thermal stability and reproducibility. Moreover, the resulting pattern is less prone to overhang formation and has an excellent dimensional controllability. The additional formulation of an acetylene alcohol derivative improves shelf stability. Because these features of the inventive resist composition enable its use particularly as a resist having a low absorption at the exposure wavelength of a KrF excimer laser, a finely defined pattern having sidewalls perpendicular to the substrate can easily be formed, making the resist ideal as a micropatterning material in VLSI fabrication.

EXAMPLE

Examples of the present invention are given below by way of illustration and not by way of limitation.

Synthesis Example 1

Synthesis of Carboxylic Acid-terminated Poly(p-1-ethoxyethoxystyrene-p-tert-butoxycarbonyloxystyrene-p-hydroxystyrene)

A 2-liter flask was charged with 700 ml of tetrahydrofuran as a solvent and 7×10$^{-3}$ mol of sec-butyl lithium as an initiator. 100 g of p-tert-butoxystyrene was added to this mixture at −78° C., which was stirred for 1 hour for polymerization. The reaction solution turned red. For converting into carboxylic acid terminals, the polymerization was terminated by adding 1.4×10$^{-2}$ mol of tert-butyl chloroacetate to the reaction solution.

Next, the reaction mixture was poured into methanol whereupon the resulting polymer precipitated. The precipitate was separated and dried, yielding 99 g of a white polymer (tert-butyl carboxylate-terminated poly(p-tert-butoxystyrene)). This polymer had a weight average molecular weight of 1.4×10$^4$ g/mol as measured by the light scattering method. With respect to the molecular weight distribution as determined from a GPC elution curve, the polymer was found to have a high monodispersity (Mw/Mn=1.07).

The resulting tert-butyl carboxylate-terminated poly(p-tert-butoxystyrene), 90 g, was dissolved in 900 ml of acetone. With a minor amount of conc. hydrochloric acid added, the solution was stirred at 60° C. for 7 hours. This was poured into water whereupon the resulting polymer precipitated. Subsequent washing and drying yielded 60 g of a polymer. The polymer had a weight average molecular weight of 1.0×10$^4$ g/mol. Based on the observation in $^1$H-NMR of no peak attributable to a tert-butyl group and the presence of C=O at 170 ppm in $^{13}$C-NMR, this polymer was found to be a carboxylic acid-terminated polyhydroxystyrene having a narrow dispersity.

The resulting carboxylic acid-terminated polyhydroxystyrene, 1,000 g, was dissolved in 1,000 ml of tetrahydrofuran, and a catalytic amount of p-toluenesulfonic acid was added thereto. With stirring at 30° C., 30 g of ethyl vinyl ether was added. After 1 hour of reaction, the reaction solution was neutralized with conc. aqueous ammonia. The neutralized reaction solution was added dropwise to 10 liters of water whereupon a white solid precipitated. The solid was filtered and dissolved in 500 ml of acetone. This was added dropwise to 10 liters of water, followed by filtration and vacuum drying. On $^1$H-NMR analysis of the resulting polymer, it was found that 27% of the hydrogen atoms of hydroxyl groups in the carboxylic acid-terminated polyhydroxystyrene had been ethoxyethylated.

The resulting partially ethoxyethoxylated carboxylic acid-terminated polyhydroxystyrene, 50 g, was dissolved in 500 ml of pyridine. With stirring at 45° C., 7 g of di-tert-butyl dicarbonate was added thereto. After 1 hour of reaction, the reaction solution was added dropwise to 3 liters of water whereupon a white solid precipitated. The solid was filtered and dissolved in 50 ml of acetone. This was added dropwise to 2 liters of water, followed by filtration and vacuum drying. The resulting polymer had the structure represented by rational formula (Polym.1), shown later. On $^1$H-NMR analysis of the polymer, it was found that 27% of the hydrogen atoms of hydroxyl groups in the carboxylic acid-terminated polyhydroxystyrene had been ethoxyethylated and 8% of the hydrogen atoms had been converted into t-BOC. The weight average molecular weight (Mw) and the dispersity (Mw/Mn) of the polymer are shown in Table 1.

Synthesis Example 2

Synthesis of Carboxylic Acid-terminated poly(p-1-ethoxypropoxystyrene-p-tert-butoxycarbonyloxystyrene-p-hydroxystyrene)

A carboxylic acid-terminated polyhydroxystyrene was obtained as in Synthesis Example 1 except that the termination was effected with $CO_2$.

The carboxylic acid-terminated polyhydroxystyrene, 50 g, was dissolved in 500 ml of tetrahydrofuran, and a catalytic amount of p-toluenesulfonic acid was added thereto. With stirring at 40° C., 27 g of ethoxypropenyl ether was added. After 12 hours of reaction, the reaction solution was neutralized with conc. aqueous ammonia. The neutralized reaction solution was added dropwise to 10 liters of water whereupon a white solid precipitated. The solid was filtered and dissolved in 500 ml of acetone. This was added dropwise to 10 liters of water, followed by filtration and vacuum drying. On $^1$H-NMR analysis of the resulting polymer, it was found that 24% of the hydrogen atoms of hydroxyl groups in the carboxylic acid-terminated polyhydroxystyrene had been ethoxypropylated.

The resulting partially ethoxypropoxylated, carboxylic acid-terminated polyhydroxystyrene, 50 g, was dissolved in 500 ml of pyridine. With stirring at 45° C., 8 g of di-tert-butyl dicarbonate was added thereto. After 1 hour of reaction, the reaction solution was added dropwise to 3 liters of water whereupon a white solid precipitated. The solid was filtered and dissolved in 50 ml of acetone. This was added dropwise to 2 liters of water, followed by filtration and vacuum drying. The resulting polymer had the structure represented by rational formula (Polym.2), shown later. On $^1$H-NMR analysis of the polymer, it was found that 24% of the hydrogen atoms of hydroxyl groups in the carboxylic acid-terminated polyhydroxystyrene had been ethoxypropylated and 11% of the hydrogen atoms had been converted into t-BOC. The weight average molecular weight (Mw) and the dispersity (Mw/Mn) of the polymer are shown in Table 1.

Synthesis Example 3

Synthesis of Alcohol-terminated Poly(p-1-ethoxyethoxy-styrene-p-tert-butoxycarbonyloxystyrene-p-hydroxystyrene)

A 2-liter flask was charged with 700 ml of tetrahydrofuran as a solvent and 7×10$^{-3}$ mol of sec-butyl lithium as an initiator. 100 g of p-tert-butoxystyrene was added to this mixture at −78° C., which was stirred for 1 hour for polymerization. The reaction solution turned red. For converting into alcohol terminals, 1.4×10$^{-2}$ mol of ethylene oxide was added to the polymerization solution.

Next, the reaction mixture was poured into methanol whereupon the resulting polymer precipitated. The precipitate was separated and dried, yielding 99 g of a white polymer (alcohol-terminated poly(p-tert-butoxystyrene)). This polymer had a weight average molecular weight of 1.4×10$^4$ g/mol as measured by the light scattering method. With respect to the molecular weight distribution as determined from a GPC elution curve, the polymer was found to have a high monodispersity (Mw/Mn=1.07).

The resulting alcohol-terminated poly(p-tert-butoxystyrene), 90 g, was dissolved in 900 ml of acetone. With a minor amount of conc. hydrochloric acid added, the solution was stirred at 60° C. for 7 hours. This was poured into water whereupon the resulting polymer precipitated. Subsequent washing and drying yielded 60 g of a polymer. The polymer had a weight average molecular weight of 1.0×10$^4$ g/mol. Based on the observation in $^1$H-NMR of no peak attributable to a tert-butyl group and the presence of CH$_2$—OH at 4.17–4.28 ppm in $^1$H-NMR and 58 ppm in $^{13}$C-NMR, this polymer was found to be an alcohol-terminated polyhydroxystyrene having a narrow dispersity.

The resulting alcohol-terminated polyhydroxystyrene, 100 g, was dissolved in 1,000 ml of dimethylformamide, and a catalytic amount of pyridinium p-toluenesulfonate was added thereto. With stirring at 30° C., 30 g of ethyl vinyl ether was added. After 16 hours of reaction, the reaction solution was neutralized with conc. aqueous ammonia. The neutralized reaction solution was added dropwise to 10 liters of water whereupon a white solid precipitated. The solid was filtered and dissolved in 500 ml of acetone. This was added dropwise to 10 liters of water, followed by filtration and vacuum drying. On $^1$H-NMR analysis of the resulting polymer, it was found that 27% of the hydrogen atoms of hydroxyl groups in the alcohol-terminated polyhydroxystyrene had been ethoxyethylated.

The resulting partially ethoxyethoxylated, alcohol-terminated polyhydroxystyrene, 50 g, was dissolved in 500 ml of pyridine. With stirring at 45° C., 7 g of di-tert-butyl dicarbonate was added thereto. After 1 hour of reaction, the reaction solution was added dropwise to 3 liters of water whereupon a white solid precipitated. The solid was filtered and dissolved in 500 ml of acetone. This was added dropwise to 2 liters of water, followed by filtration and vacuum drying. The resulting polymer had the structure represented by rational formula (Polym.3), shown later. On $^1$H-NMR analysis of the polymer, it was found that 27% of the hydrogen atoms of hydroxyl groups in the alcohol-terminated polyhydroxystyrene had been ethoxyethylated and 8% of the hydrogen atoms had been converted into t-BOC. The weight average molecular weight (Mw) and the dispersity (Mw/Mn) of the polymer are shown in Table 1.

Synthesis Example 4

Synthesis of Triphenyl-terminated Poly(p-1-ethoxypropoxy-styrene-p-hydroxystyrene)

A 2-liter flask was charged with 1,000 ml of tetrahydrofuran as a solvent and 2.4×10$^{-2}$ mol of sec-butyl lithium as an initiator. 300 g of p-tert-butoxystyrene was added to this mixture at −78° C., which was stirred for 1 hour for polymerization. The reaction solution turned red. For converting into triphenyl terminals, the polymerization was terminated by adding 3.0×10$^{-2}$ mol of triphenylmethyl chloride to the reaction solution.

Next, the reaction mixture was poured into methanol whereupon the resulting polymer precipitated. The precipitate was separated and dried, yielding 298 g of a white polymer (triphenyl-terminated poly(p-tert-butoxystyrene)). This polymer had a weight average molecular weight of 1.4×10$^4$ g/mol as measured by the light scattering method. With respect to the molecular weight distribution as determined from a GPC elution curve, the polymer was found to have a high monodispersity (Mw/Mn=1.10).

The resulting triphenyl-terminated poly(p-tert-butoxystyrene), 190 g, was dissolved in 1,000 ml of acetone. With a minor amount of conc. hydrochloric acid added, the solution was stirred at 60° C. for 7 hours. This was poured into water whereupon the resulting polymer precipitated. Subsequent washing and drying yielded 125 g of a polymer. The polymer had a weight average molecular weight of 9,500 g/mol. Based on the observation in $^1$H-NMR of no peak attributable to a tert-butyl group and the presence of triphenyl in $^1$H-NMR, this polymer was found to be a triphenyl-terminated polyhydroxystyrene having a narrow dispersity.

The resulting triphenyl-terminated polyhydroxystyrene, 100 g, was dissolved in 700 ml of tetrahydrofuran, and a catalytic amount of methanesulfonic acid was added thereto. With stirring at 20° C., 25 g of ethoxypropenyl ether was added. After 2 hours of reaction, the reaction solution was neutralized with conc. aqueous ammonia. The neutralized reaction solution was added dropwise to 10 liters of water whereupon a white solid precipitated. The solid was filtered and dissolved in 500 ml of acetone. This was added dropwise to 10 liters of water, followed by filtration and vacuum drying. The resulting polymer had the structure represented by rational formula (Polym.4), shown later. On $^1$H-NMR analysis of the polymer, it was found that 26% of the hydrogen atoms of hydroxyl groups in the triphenylterminated polyhydroxystyrene had been ethoxypropylated. The weight average molecular weight (Mw) and the dispersity (Mw/Mn) of the polymer are shown in Table 1.

Synthesis Example 5

Synthesis of Alcohol Carboxylic Acid-terminated Poly(p-1-ethoxypropoxystyrene-p-hydroxystyrene)

A 2-liter flask was charged with 2,000 ml of tetrahydrofuran as a solvent and 1.3×10$^{-2}$ mol of naphthalene sodium as an initiator. 200 g of p-tert-butoxystyrene was added to this mixture at −78° C., which was stirred for 1 hour for polymerization. The reaction solution turned red. For converting into carboxylic acid terminals, polymerization termination was effected by adding $1.5\times10^{-2}$ mol of carbon dioxide gas dissolved in tetrahydrofuran to the reaction solution. Additionally, for converting into hydroxy terminals, the polymerization termination was effected with $1\times10^{-2}$ mol of trimethoxyborane in tetrahydrofuran added, and thereafter, $1\times10^{-2}$ mol of acetic acid and $1.5\times10^{-2}$ mol of aqueous hydrogen peroxide were added.

Next, the reaction mixture was poured into methanol whereupon the resulting polymer precipitated. The precipitate was separated and dried, yielding 198 g of a white polymer (alcohol carboxylic acid-terminated poly(p-tert-butoxystyrene)). This polymer had a weight average molecular weight of $1.6\times10^4$ g/mol as measured by the light scattering method. With respect to the molecular weight distribution as determined from a GPC elution curve, the polymer was found to have a high monodispersity (Mw/Mn=1.05).

The resulting alcohol carboxylic acid-terminated poly(p-tert-butoxystyrene), 190 g, was dissolved in 1,000 ml of acetone. With a minor amount of conc. hydrochloric acid added, the solution was stirred at 60° C. for 7 hours. This was poured into water whereupon the resulting polymer precipitated. Subsequent washing and drying yielded 125 g of a polymer. The polymer had a weight average molecular weight of 9,500 g/mol. Based on the observation in $^1$H-NMR of no peak attributable to a tert-butyl group, the presence of C=O at 170 ppm in $^{13}$C-NMR, and the presence of $CH_2$—OH at 4.17–4.28 ppm in $^1$H-NMR and at 58 ppm in $^{13}$C-NMR, this polymer was found to be an alcohol carboxylic acid-terminated polyhydroxystyrene having a narrow dispersity.

In a 2-liter flask, 100 g of the resulting alcohol carboxylic acid-terminated polyhydroxystyrene was dissolved in 700 ml of tetrahydrofuran, and a catalytic amount of methanesulfonic acid was added thereto. With stirring at 20° C., 30 g of ethoxypropenyl ether was added. After 2 hours of reaction, the reaction solution was neutralized with conc. aqueous ammonia. The neutralized reaction solution was added dropwise to 10 liters of water whereupon a white solid precipitated. The solid was filtered and dissolved in 500 ml of acetone. This was added dropwise to 10 liters of water, followed by filtration and vacuum drying. The resulting polymer had the structure represented by rational formula (Polym.5), shown later. On $^1$H-NMR analysis of the polymer, it was found that 28% of the hydrogen atoms of hydroxyl groups in the alcohol carboxylic acid-terminated polyhydroxystyrene had been ethoxypropylated. The weight average molecular weight (Mw) and the dispersity (Mw/Mn) of the polymer are shown in Table 1.

Synthesis Example 6

Synthesis of Carboxylate-terminated, Triethylene Glycol Divinyl Ether-crosslinked Poly(p-1-ethoxyethoxystyrene-p-hydroxystyrene)

A 2-liter flask was charged with 1,000 ml of tetrahydrofuran as a solvent and $1.6\times10^{-2}$ mol of sec-butyl lithium as an initiator. 200 g of p-tert-butoxystyrene was added to this mixture at −78° C., which was stirred for 1 hour for polymerization. The reaction solution turned red. For converting into carboxylate terminals, the polymerization was terminated by adding $1.4\times10^{-2}$ mol of ethyl chlorocarbonate to the reaction solution.

Next, the reaction mixture was poured into methanol whereupon the resulting polymer precipitated. The precipitate was separated and dried, yielding 198 g of a white polymer (carboxylate-terminated poly(p-tert-butoxystyrene)). This polymer had a weight average molecular weight of $1.2\times10^4$ g/mol as measured by the light scattering method. With respect to the molecular weight distribution as determined from a GPC elution curve, the polymer was found to have a high monodispersity (Mw/Mn=1.03).

The resulting carboxylate-terminated poly(p-tert-butoxystyrene), 190 g, was dissolved in 900 ml of acetone. With a minor amount of conc. hydrochloric acid added, the solution was stirred at 60° C. for 7 hours. This was poured into water whereupon the resulting polymer precipitated. Subsequent washing and drying yielded 60 g of a polymer. The polymer had a weight average molecular weight of 8,500 g/mol. Based on the observation in $^1$H-NMR of no peak attributable to a tert-butyl group and the presence of C=O at 170 ppm in $^{13}$C-NMR, this polymer was found to be a carboxylate-terminated polyhydroxystyrene having a narrow dispersity.

In a 2-liter flask, 100 g of the carboxylate-terminated polyhydroxystyrene was dissolved in 1,000 ml of dimethylformamide, and a catalytic amount of p-toluenesulfonic acid was added thereto. With stirring at 20° C., 4 g of triethylene glycol divinyl ether was added, followed by 1 hour of reaction. Then 22 g of ethyl-vinyl ether and 4 g of triethylene glycol divinyl ether were added, followed by 1 hour of reaction. The reaction solution was neutralized with conc. aqueous ammonia. The neutralized reaction solution was added dropwise to 10 liters of water whereupon a white solid precipitated. The solid was filtered and dissolved in 500 ml of acetone. This was added dropwise to 10 liters of water, followed by filtration and vacuum drying. The resulting polymer had the structure represented by rational formula (Polym.6), shown later. On $^1$H-NMR analysis of the polymer, it was found that 30% of the hydrogen atoms of hydroxyl groups in the carboxylate-terminated polyhydroxystyrene had been ethoxyethylated and 3% crosslinked. The weight average molecular weight (Mw) of the polymer are shown in Table 1.

Synthesis Example 7

Synthesis of Alcohol-terminated, 1,4-di-vinyloxymethylcyclohexane-crosslinked poly(p-1-ethoxyethoxystyrene-p-tert-butoxycarbonyloxystyrene-p-hydroxystyrene)

A 2-liter flask was charged with 3,000 ml of tetrahydrofuran as a solvent and $2.1\times10^{-3}$ mol of sec-butyl lithium as an initiator. 300 g of p-tert-butoxystyrene was added to this mixture at −78° C., which was stirred for 1 hour for polymerization. The reaction solution turned red. For converting into alcohol terminals, the polymerization was terminated by adding $1.0\times10^{-1}$ mol of ethylene oxide to the reaction solution.

Next, the reaction mixture was poured into methanol whereupon the resulting polymer precipitated. The precipitate was separated and dried, yielding 295 g of a white polymer (alcohol-terminated poly(p-tert-butoxy-styrene)). This polymer had a weight average molecular weight of $1.4\times10^4$ g/mol as measured by the light scattering method. With respect to the molecular weight distribution as determined from a GPC elution curve, the polymer was found to have a high monodispersity (Mw/Mn=1.05).

The resulting alcohol-terminated poly(p-tert-butoxystyrene), 200 g. was dissolved in 2,000 ml of acetone. With a minor amount of conc. hydrochloric acid added, the solution was stirred at 60° C. for 7 hours. This was poured into water whereupon the resulting polymer precipitated. Subsequent washing and drying yielded 130 g of a polymer. The polymer had a weight average molecular weight of $1.0 \times 10^4$ g/mol. Based on the observation in $^1$H-NMR of no peak attributable to a tert-butyl group and the presence of $CH_2$—OH at 4.17–4.28 ppm in $^1$H-NMR and 58 ppm in $^{13}$C-NMR, this polymer was found to be an alcohol-terminated polyhydroxystyrene having a narrow dispersity.

In a 2-liter flask, 100 g of the alcohol-terminated polyhydroxystyrene was dissolved in 1,000 ml of dimethylformamide, and a catalytic amount of p-toluenesulfonic acid was added thereto. With stirring at 20° C., 15 g of ethyl vinyl ether and 9 g of 1,4-di-vinyloxymethylcyclohexane were added. After 1 hour of reaction, the reaction solution was neutralized with conc. aqueous ammonia. The neutralized reaction solution was added dropwise to 10 liters of water whereupon a white solid precipitated. The solid was filtered and dissolved in 500 ml of acetone. This was added dropwise to 10 liters of water, followed by filtration and vacuum drying. On $^1$H-NMR and $^{13}$C-NMR analysis of the resulting polymer, it was found that 18% of the hydrogen atoms of hydroxyl groups in the alcohol-terminated polyhydroxystyrene had been ethoxyethylated and 4% crosslinked.

The partially crosslinked, alcohol-terminated, ethoxyethoxylated polyhydroxystyrene, 50 g, was dissolved in 500 ml of pyridine. With stirring at 45° C., 12 g of di-tert-butyl dicarbonate was added thereto. After 1 hour of reaction, the reaction solution was added dropwise to 3 liters of water whereupon a white solid precipitated. The solid was filtered and dissolved in 50 ml of acetone. This was added dropwise to 2 liters of water, followed by filtration and vacuum drying. The resulting polymer had the structure represented by rational formula (Polym.7), shown later. On $^1$H-NMR analysis of the polymer, it was found that 18% of the hydrogen atoms of hydroxyl groups in the alcohol-terminated polyhydroxystyrene had been ethoxyethylated, 4% crosslinked, and 10% of the hydrogen atoms had been tert-butoxycarbonylated. The weight average molecular weight (Mw) of the polymer are shown in Table 1.

Synthesis Example 8

Synthesis of Carboxylic Acid-terminated, 1,2-Ethane Diol Divinyl Ether-crosslinked Poly(p-1-ethoxyethoxystyrene-p-hydroxystyrene)

A carboxylic acid-terminated polyhydroxystyrene was obtained as in Synthesis Example 1 except that the termination was effected with $CO_2$.

The carboxylic acid-terminated polyhydroxystyrene, 200 g, was dissolved in 2,000 ml of tetrahydrofuran, and 4 g of methanesulfonic acid was added thereto. With stirring at 30° C., 44 g of 2-chloro-2-ethoxyethyl was added, followed by 3 hours of reaction. Then 10 g of 1,2-ethane diol divinyl ether was added, followed by 0.5 hour of reaction. The reaction solution was neutralized with conc. aqueous ammonia. The reaction solution was solvent exchanged with ethyl acetate and was purified six times by liquid—liquid extraction using pure water and a small amount of acetone. This was followed by solvent exchange into acetone, then dropwise addition to 20 liters of pure water, yielding a white solid. The solid was collected by filtration, washed twice with pure water, then collected again by filtration and vacuum dried. The resulting polymer had the structure represented by rational formula (Polym.8), shown later. On $^1$H-NMR and $^{13}$C-NMR analysis of the polymer, it was found that 20% and 4% of the hydrogen atoms of hydroxyl groups in the carboxylic acid-terminated polyhydroxystyrene had been ethoxyethylated and crosslinked, respectively, and 20% of the carboxylic acid terminals had been ethoxyethylated. The weight average molecular weight (Mw) of the polymer are shown in Table 1.

Synthesis Example 9

Synthesis of Alcohol-terminated, 1,4-dimethylcyclohexyldichloroethylether-crosslinked poly(p-1-ethoxypropoxysty-rene-p-tert-butoxycarbonyloxystyrene-p-hydroxystyrene)

A 2-liter flask was charged with 1,000 ml of tetrahydrofuran as a solvent and $5 \times 10^{-3}$ mol of sec-butyl lithium as an initiator. 100 g of p-tert-butoxystyrene was added to this mixture at −78° C., which was stirred for 1 hour for polymerization. The reaction solution turned red. For converting into alcohol terminals, the polymerization was terminated by adding $5 \times 10^{-2}$ mol of ethylene oxide to the reaction solution.

Next, the reaction mixture was poured into methanol whereupon the resulting polymer precipitated. The precipitate was separated and dried, yielding 99 g of a white polymer (alcohol-terminated poly(p-tert-butoxystyrene)). This polymer had a weight average molecular weight of $1.9 \times 10^4$ g/mol as measured by the light scattering method. With respect to the molecular weight distribution as determined from a GPC elution curve, the polymer was found to have a high monodispersity (Mw/Mn=1.09).

The resulting alcohol-terminated poly(p-tert-butoxystyrene), 90 g, was dissolved in 1,000 ml of acetone. With a minor amount of conc. hydrochloric acid added, the solution was stirred at 60° C. for 7 hours. This was poured into water whereupon the resulting polymer precipitated. Subsequent washing and drying yielded 60 g of a polymer. The polymer had a weight average molecular weight of $1.0 \times 10^4$ g/mol. Based on the observation in $^1$H-NMR of no peak attributable to a tert-butyl group and the presence of $CH_2$—OH at 4.17–4.28 ppm in $^1$H-NMR and 58 ppm in $^{13}$C-NMR, this polymer was found to be an alcohol-terminated polyhydroxystyrene having a narrow dispersity.

In a 2-liter flask, 50 g of the alcohol-terminated polyhydroxystyrene was dissolved in 1,000 ml of tetrahydrofuran, and 3.9 g of methanesulfonic acid was added thereto. With stirring at 30° C., 9 g of 2-chloro-2-ethoxypropyl was added, followed by 3 hours of reaction. Then 4 g of 1,4-dimethylcyclohexyl dichloroethyl ether was added, followed by 0.5 hour of reaction. The reaction solution was neutralized with conc. aqueous ammonia. The reaction solution was solvent exchanged with ethyl acetate and was purified six times by liquid-liquid extraction using pure water and a small amount of acetone. This was followed by solvent exchange into acetone, then dropwise addition to 20 liters of pure water, yielding a white solid. The solid was collected by filtration, washed twice with pure water, then collected again by filtration and vacuum dried.

The partially crosslinked, alcohol-terminated, ethoxypropoxylated polyhydroxystyrene, 50 g, was dissolved in 300 g of pyridine. With stirring at 40° C., 4 g of di-tert-butyl dicarbonate was added thereto. After 1 hour of reaction, the reaction solution was added dropwise to 10 liters of water whereupon a white solid precipitated. The solid was filtered and dissolved in 200 ml of acetone. This was added dropwise to 2 liters of water, followed by filtration and vacuum drying. The resulting polymer had the structure represented by rational formula (Polym.9), shown later. On $^1$H-NMR and $^{13}$C-NMR analysis of the polymer, it was found that 19%, 5%, and 4% of the hydrogen atoms of hydroxyl groups in the alcohol-terminated polyhydroxystyrene had been ethoxypropoxylated, tert-butoxycarbonylated, and crosslinked, respectively, and 19% and 4% of the alcohol terminals had been ethoxypropoxylated and crosslinked, respectively. The weight average molecular weight (Mw) of the polymer are shown in Table 1.

Synthesis Example 10

Synthesis of Both End Carboxylic Acid-terminated, 1,4-butane Diol Divinyl Ether-crosslinked Poly(p-1-ethoxyethoxystyrene-p-tert-butoxycarbonyloxystyrene-p-hydroxystyrene)

A 2-liter flask was charged with 2,000 ml of tetrahydrofuran as a solvent and $3 \times 10^{-3}$ mol of naphthalene sodium as a both end initiator. 100 g of p-tert-butoxystyrene was added to this mixture at −78° C., which was stirred for 1 hour for polymerization. The reaction solution turned red. For converting into carboxylic acid dual terminals, the polymerization was terminated by adding $2 \times 10^{-1}$ mol of carbon dioxide in tetrahydrofuran to the reaction solution.

Next, the reaction mixture was poured into methanol whereupon the resulting polymer precipitated. The precipitate was separated and dried, yielding 99 g of a white polymer (both end carboxylic acid-terminated poly(p-tert-butoxystyrene)). This polymer had a weight average molecular weight of $1.5 \times 10^4$ g/mol as measured by the light scattering method. With respect to the molecular weight distribution as determined from a GPC elution curve, the polymer was found to have a high monodispersity (Mw/Mn=1.15).

The resulting both end carboxylic acid-terminated poly (p-tert-butoxystyrene), 90 g, was dissolved in 900 ml of acetone. With a minor amount of conc. hydrochloric acid added, the solution was stirred at 60° C. for 7 hours. This was poured into water whereupon the resulting polymer precipitated. Subsequent washing and drying yielded 60 g of a polymer. The polymer had a weight average molecular weight of $1.0 \times 10^4$ g/mol. Based on the observation in $^1$H-NMR of no peak attributable to a tert-butyl group and the presence of C=O at 170 ppm in $^{13}$C-NMR, this polymer was found to be a both end carboxylic acid-terminated polyhydroxystyrene having a narrow dispersity.

In a 2-liter flask, 90 g of the both end carboxylic acid-terminated polyhydroxystyrene was dissolved in 1,000 ml of tetrahydrofuran, and 1 g of methanesulfonic acid was added thereto. With stirring at 30° C., 21 g of 2-chloro-2-ethoxyethyl was added, followed by 1 hour of reaction. Then 7 g of 1,4-butane diol divinyl ether was added, followed by 0.5 hour of reaction. The reaction solution was neutralized with conc. aqueous ammonia. The reaction solution was solvent exchanged with ethyl acetate and was purified six times by liquid-liquid extraction using pure water. This was followed by solvent exchange into acetone, then dropwise addition to 20 liters of pure water, yielding a white solid. The solid was collected by filtration, washed twice with pure water, then collected again by filtration and vacuum dried.

The partially ethoxyethoxylated, both end carboxylic acid-terminated polyhydroxystyrene, 50 g, was dissolved in 500 ml of pyridine. With stirring at 45° C., 7 g of di-tert-butyl dicarbonate was added thereto. After 1 hour of reaction, the reaction solution was added dropwise to 3 liters of water whereupon a white solid precipitated. The solid was filtered and dissolved in 50 ml of acetone. This was added dropwise to 2 liters of water, followed by filtration and vacuum drying. The resulting polymer had the structure represented by rational formula (Polym.10), shown later. On $^1$H-NMR and $^{13}$C-NMR analysis of the polymer, it was found that 25%, 5%, and 5.5% of the hydrogen atoms of hydroxyl groups in the both end carboxylic acid-terminated polyhydroxystyrene had been ethoxyethylated, tert-butoxycarbonylated, and crosslinked, respectively, and a total of 25% of the carboxylic acid one terminals and both terminals had been ethoxyethylated. The weight average molecular weight (Mw) of the polymer are shown in Table 1.

Synthesis Example 11

Synthesis of Hydroxyl-terminated, Propylene Glycol Divinyl Ether-crosslinked Poly(p-n-butoxyethoxystyrene-p-hydroxystyrene)

A 2-liter flask was charged with 3,000 ml of tetrahydrofuran as a solvent and $1 \times 10^{-2}$ mol of sec-butyl lithium as a both end initiator. 200 g of p-tert-butoxystyrene was added to this mixture at −78° C., which was stirred for 1 hour for polymerization. The reaction solution turned red. For converting into hydroxyl terminals, polymerization termination was effected by adding $1 \times 10^{-2}$ mol of trimethoxyborane in tetrahydrofuran to the reaction solution, effecting reaction for some time, and adding $1 \times 10^{-2}$ mol of acetic acid and $1.5 \times 10^{-2}$ mol of hydrogen peroxide in water.

Next, the reaction mixture was poured into methanol whereupon the resulting polymer precipitated. The precipitate was separated and dried, yielding 198 g of a white polymer (hydroxyl-terminated poly(p-tert-butoxystyrene)). This polymer had a weight average molecular weight of $2.1 \times 10^4$ g/mol as measured by the light scattering method. With respect to the molecular weight distribution as determined from a GPC elution curve, the polymer was found to have a high monodispersity (Mw/Mn=1.16).

The resulting hydroxyl-terminated poly(p-tert-butoxystyrene), 150 g, was dissolved in 900 ml of acetone. With a minor amount of conc. hydrochloric acid added, the solution was stirred at 60° C. for 7 hours. This was poured into water whereupon the resulting polymer precipitated. Subsequent washing and drying yielded 100 g of a polymer. The polymer had a weight average molecular weight of $1.4 \times 10^4$ g/mol. Based on the observation in $^1$H-NMR of no peak attributable to a tert-butyl group and the presence of CH$_2$—OH at 4.17–4.28 ppm in $^1$H-NMR and 58 ppm in $^{13}$C-NMR, this polymer was found to be a hydroxyl-terminated polyhydroxystyrene having a narrow dispersity.

In a 2-liter flask, 90 g of the hydroxyl-terminated polyhydroxystyrene was dissolved in 1,000 ml of tetrahydrofuran, and 1 g of methanesulfonic acid was added thereto. With stirring at 30° C., 21 g of 2-chloro-2-ethoxybutyl was added, followed by 1 hour of reaction. Then 7 g of propylene glycol divinyl ether was added, followed by 1 hour of reaction. The reaction solution was neutralized with conc. aqueous ammonia. The reaction solution was solvent exchanged with ethyl acetate and was purified six times by liquid-liquid extraction using pure water. This was followed by solvent exchange into acetone, then dropwise addition to 20 liters of pure water, yielding a white solid. The solid was collected by filtration, washed twice with pure water, then collected again by filtration and vacuum dried. The resulting polymer had the structure represented by rational formula (Polym.11), shown later. On $^1$H-NMR and $^{13}$C-NMR analysis of the polymer, it was found that 25% and 5.5% of the hydrogen atoms of hydroxyl groups in the hydroxyl-terminated polyhydroxystyrene had been butoxyethylated and crosslinked, respectively, and 6% of the hydroxyl groups had been butoxyethylated. The weight average molecular weight (Mw) of the polymer are shown in Table 1.

Synthesis Example 12

Synthesis of Both End Hydroxyl-terminated, 1,4-butane Diol Divinyl Ether-crosslinked Poly(p-n-butoxyethoxystyrene-p-hydroxystyrene)

A both end hydroxyl-terminated polyhydroxystyrene was obtained as in Synthesis Example 10 except that the termination was effected using chloromethylvinylether.

In a flask, 200 g of the both end hydroxyl-terminated polyhydroxystyrene was dissolved in 2,000 ml of tetrahydrofuran, and 4 g of methanesulfonic acid was added thereto. With stirring at 30° C., 44 g of 2-chloro-2-ethoxybutyl was added, followed by 3 hours of reaction. Then 10 g of 1,4-butane diol divinyl ether was added, followed by 0.5 hour of reaction. The reaction solution was neutralized with conc. aqueous ammonia. The reaction solution was solvent exchanged with ethyl acetate and was purified six times by liquid-liquid extraction using pure water and a small amount of acetone. This was followed by solvent exchange into acetone, then dropwise addition to 20 liters of pure water, yielding a white solid. The solid was collected by filtration, washed twice with pure water, then collected again by filtration and vacuum dried.

The resulting polymer had the structure represented by rational formula (Polym.12), shown later. On $^1$H-NMR and $^{13}$C-NMR analysis of the polymer, it was found that 20% and 4% of the hydrogen atoms of hydroxyl groups in the both end hydroxyl-terminated polyhydroxystyrene had been butoxyethoxylated and crosslinked, respectively, and a total of 20% of the hydroxyl one terminals and both terminals had been butoxyethylated. The weight average molecular weight (Mw) of the polymer are shown in Table 1.

The structures of the polymers obtained are shown in the rational formulas below. The respective degrees of substitution are given in Table 1. In the formulas shown below, R is a crosslinking group which intermolecularly or intramolecularly crosslinks the U units shown below, and (R) indicates that the crosslinking group R is in a bonded state.

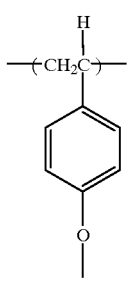

U

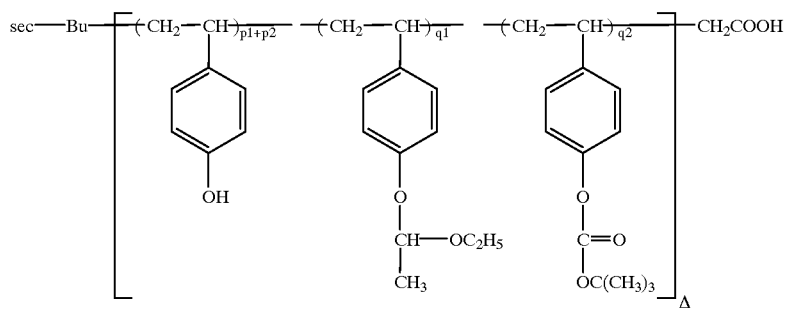

Polym.1

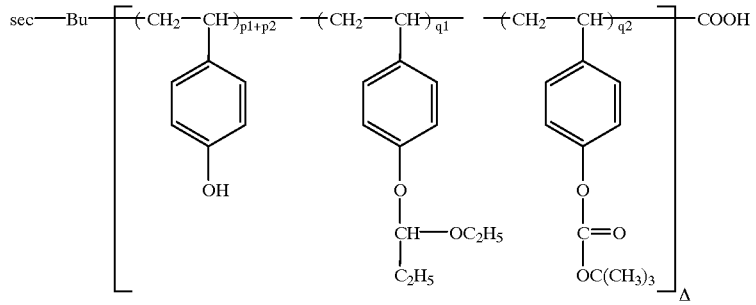

Polym.2

-continued
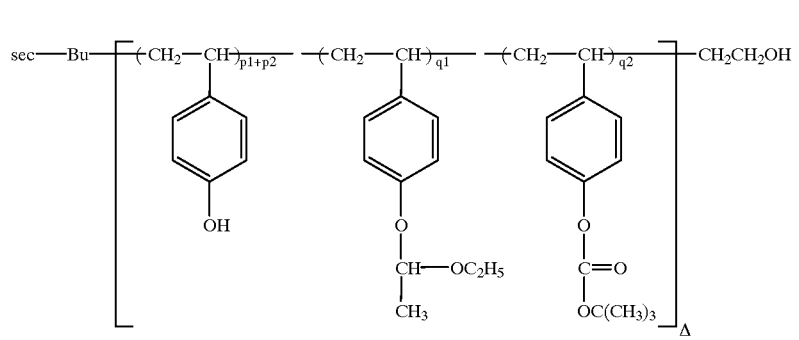
Polym.3
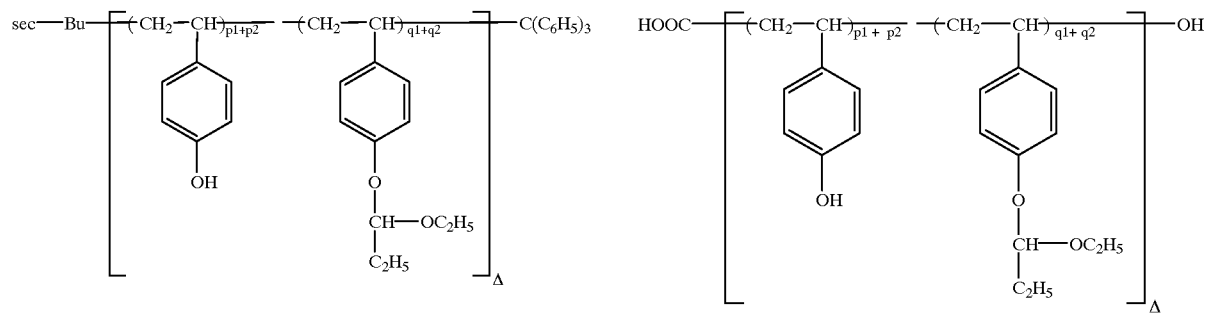
Polym.4
Polym.5
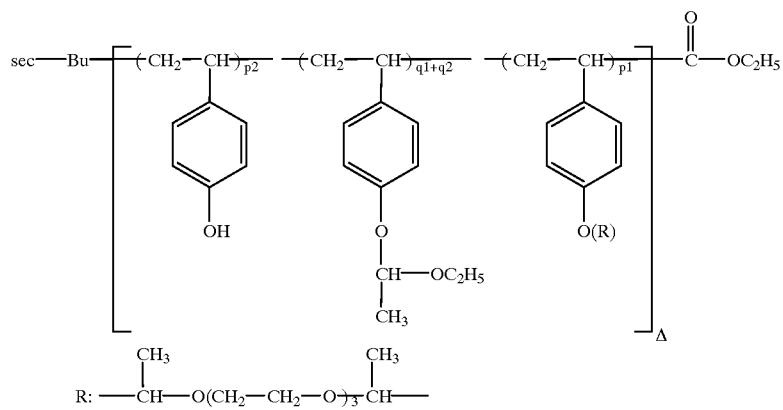
Polym.6
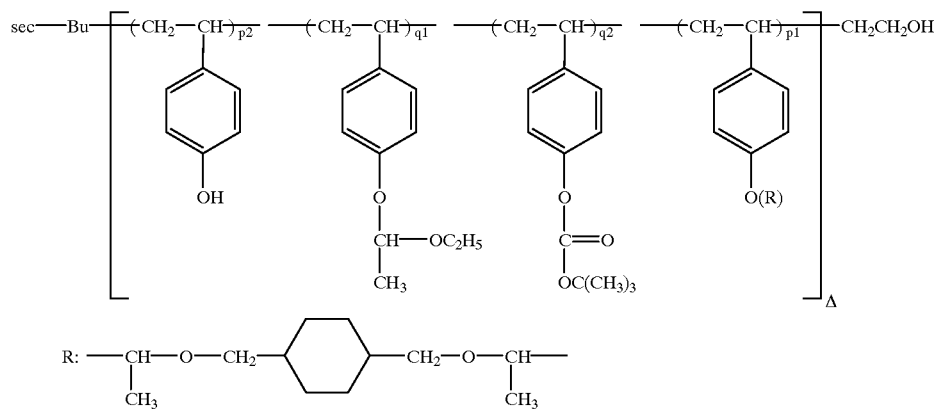
Polym.7

-continued
Polym.8
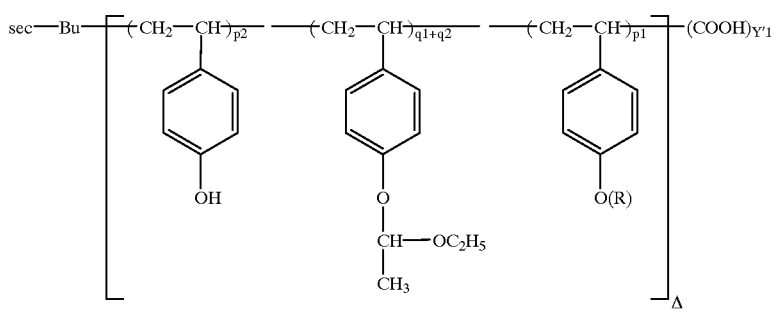
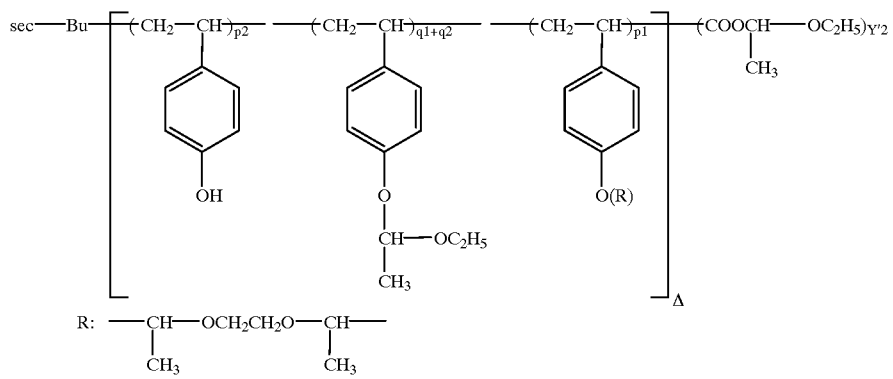
Polym.9
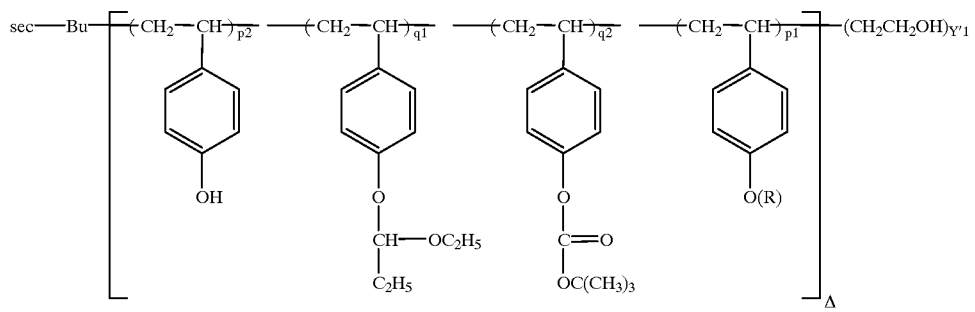
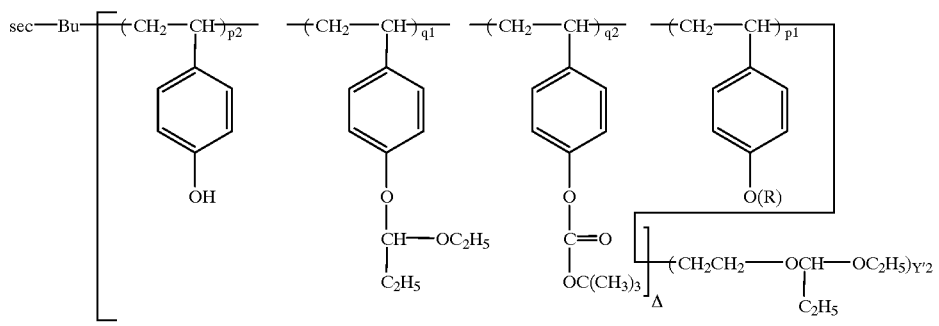

-continued
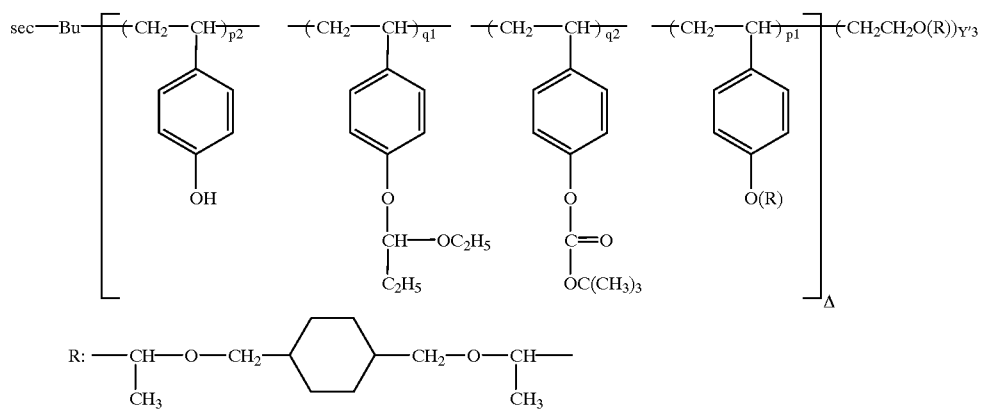
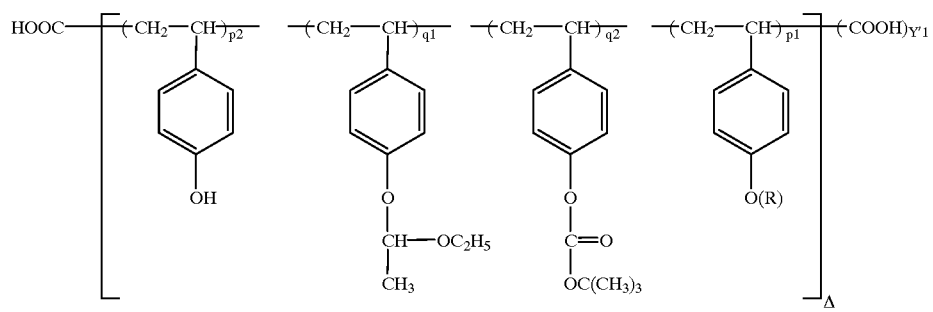
Polym.10
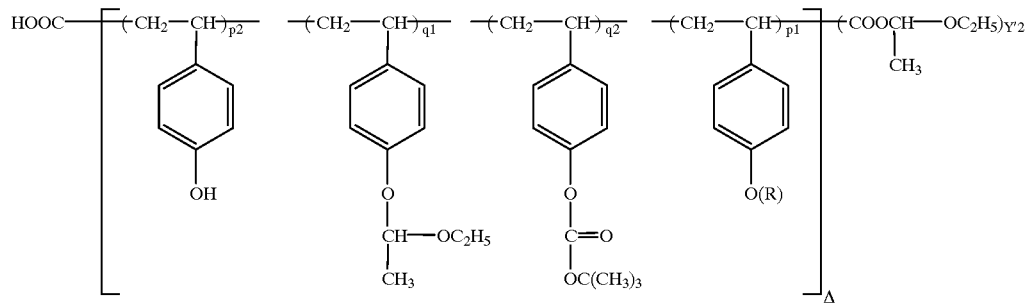
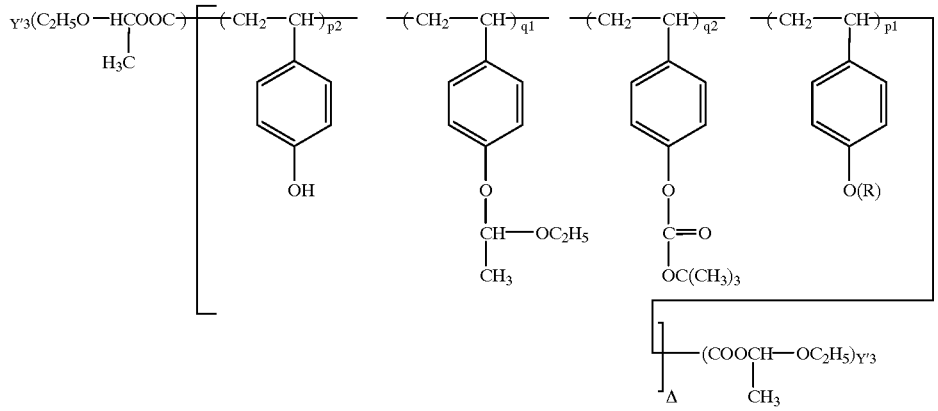

-continued
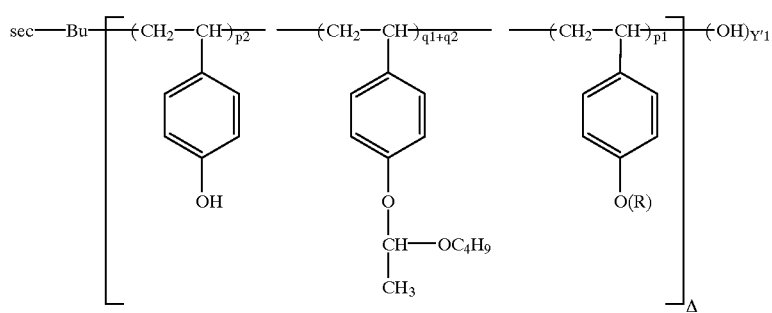
Polym.11
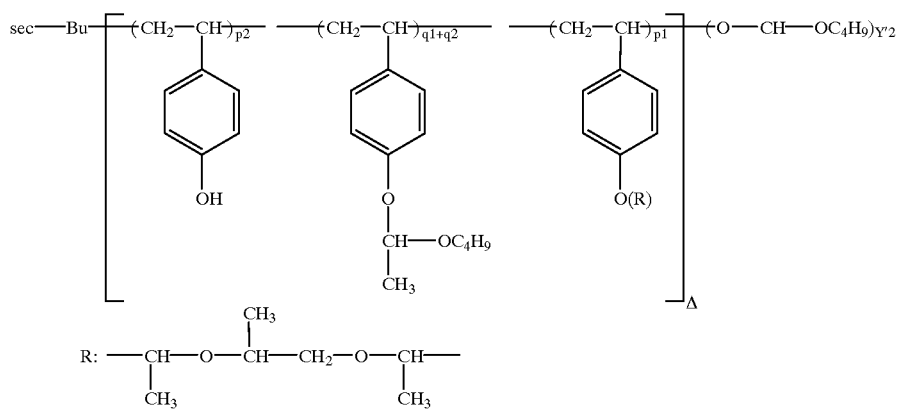
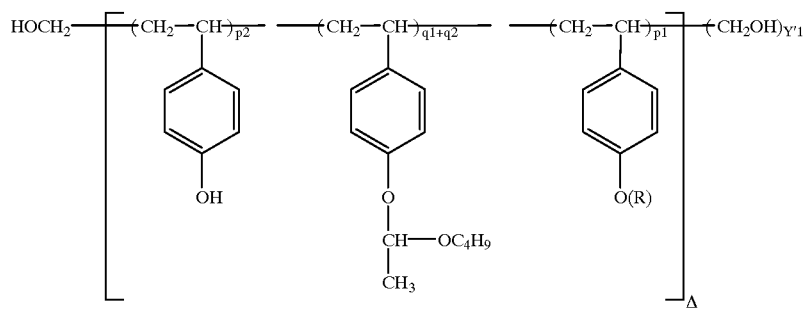
Polym.12
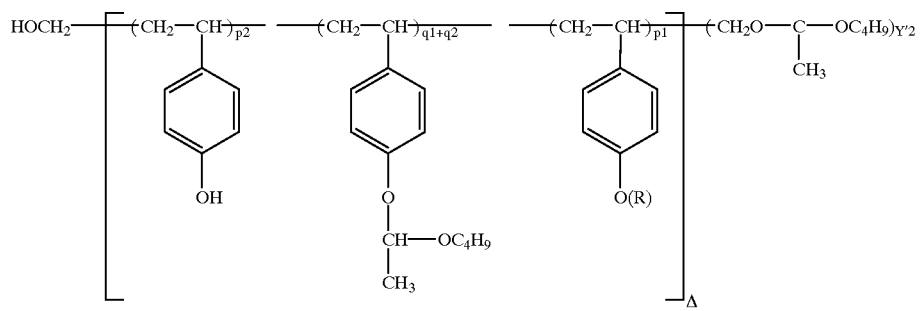

-continued

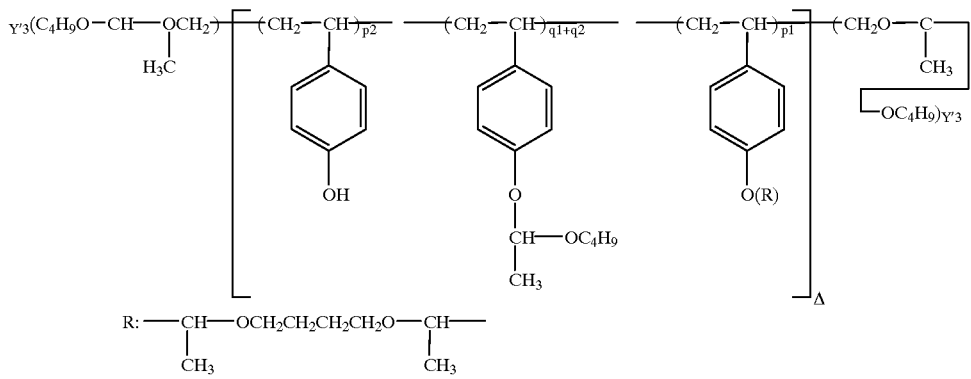

R: —CH—OCH₂CH₂CH₂CH₂O—CH—
      |                    |
      CH₃                  CH₃

TABLE 1

| Synthesis Example | Proportions (molar ratio) p1 | p2 | q1 | q2 | Proportions (molar ratio) Y'1 | Y'2 | Y'3 | Mw of PHS* | Mw/Mn of PHS* | Mw of polymer |
|---|---|---|---|---|---|---|---|---|---|---|
| 1 [Polym. 1] |  | 65 | 27 | 8 | — | — | — | — | 1.07 | 14500 |
| 2 [Polym. 2] |  | 65 | 24 | 11 | — | — | — | — | 1.06 | 15000 |
| 3 [Polym. 3] |  | 65 | 27 | 8 | — | — | — | — | 1.06 | 17500 |
| 4 [Polym. 4] |  | 74 | 26 |  | — | — | — | — | 1.10 | 12000 |
| 5 [Polym. 5] |  | 72 | 28 |  | — | — | — | — | 1.05 | 13000 |
| 6 [Polym. 6] | 3 | 67 | 30 |  | — | — | — | 8200 | 1.03 | 25700 |
| 7 [Polym. 7] | 4 | 68 | 18 | 10 | — | — | — | 9600 | 1.05 | 30000 |
| 8 [Polym. 8] | 4 | 76 | 20 |  | 80 | 20 | — | 9600 | 1.06 | 32000 |
| 9 [Polym. 9] | 4 | 72 | 19 | 5 | 77 | 19 | 4 | 13000 | 1.09 | 28000 |
| 10 [Polym. 10] | 5.5 | 64.5 | 25 | 5 | 75 | 25 |  | 10200 | 1.15 | 36000 |
| 11 [Polym. 11] | 5.5 | 69.5 | 25 |  | 75 | 25 | — | 14280 | 1.16 | 30000 |
| 12 [Polym. 12] | 4 | 72 | 24 |  | 80 | 20 | — | 9600 | 1.10 | 28000 |

*PHS: polyhydroxystyrene

Examples

Resist components selected from among the polymers obtained in the foregoing synthesis examples (Polym.1 to 12) as the base resin, the photoacid generators of the formulas (PAG 1 to 10), dissolution regulators of the formulas (DRR 1 and 2), basic compounds, and aromatic compounds bearing a ≡C—COOH group within the molecule and having the formulas (ACC 1 and 2), all the formulas being shown below, were dissolved in a solvent to form liquid resist compositions having the proportions shown in Tables 2 and 3. Where needed, 0.1 part of the surfactant Florade FC-430 from Sumitomo 3M Ltd. was added to improve film formability.

These compositions were each passed through a 0.1 μm Teflon filter to give the finished resist solution. This resist solution was spin-coated onto a silicon wafer, following which the coated silicon wafer was baked on a hot plate at 100° C. for 90 seconds. The thickness of the resist film was set at 0.55 μm.

The resist film was exposed through a patterning mask having the desired pattern using an excimer laser stepper (NSR-2005EX, from Nikon Corporation; NA=0.5), then baked at 110° C. for 90 seconds and developed for 60 seconds with a 2.38% solution of tetramethylammonium hydroxide in water, thereby giving a positive pattern.

The resist patterns obtained were evaluated as described below.

First, the sensitivity (Eth) was determined. Next, the optimal exposure dose (sensitivity: Eop) was defined as the dose which provides a 1:1 resolution at the top and bottom of a 0.24 μm line-and-space pattern. The resolution of the resist under evaluation was defined as the minimum line width of the lines and spaces that separated at this dose. The resolution was also examined when the time duration (PED) from exposure at the same dose to heat treatment was 2 hours. The shape of the resolved resist pattern was examined under a scanning electron microscope. The thermal stability test was carried out by heating this resist pattern on a hot plate at 130° C. for 10 minutes, and examining the change in the pattern shape before and after heating.

The resist compositions are shown in Tables 2 and 3, and the evaluation results in Examples are shown in Table 4.

(PAG. 1)
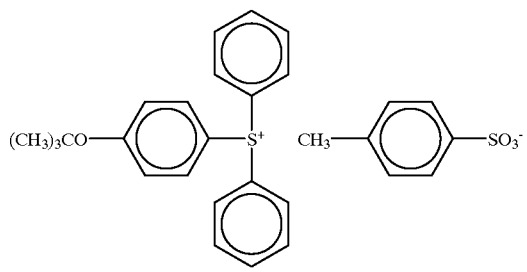
(PAG. 2)
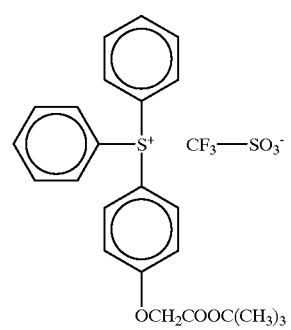
(PAG. 3)
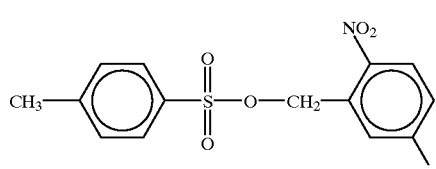
(PAG. 4)
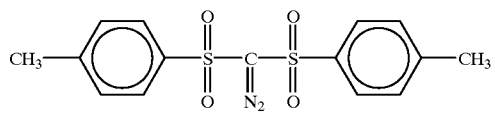
(PAG. 5)
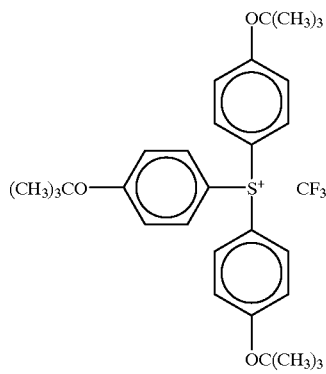
(PAG. 6)
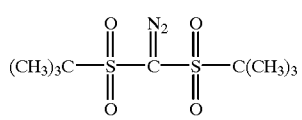
(PAG. 7)
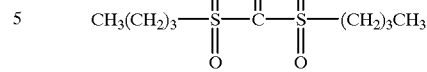
(PAG. 8)
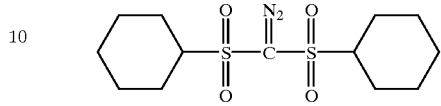
(PAG. 9)
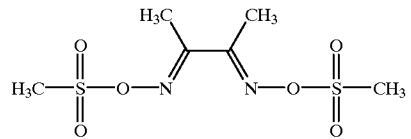
(PAG. 10)
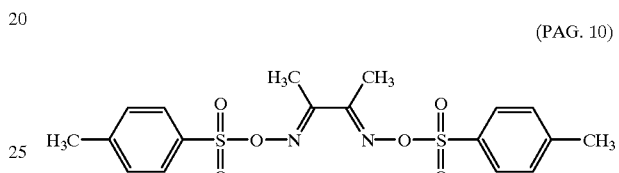
(DRR. 1)
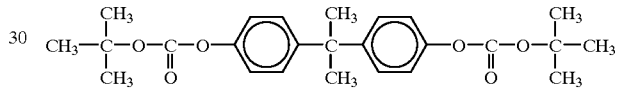
(DRR. 2)
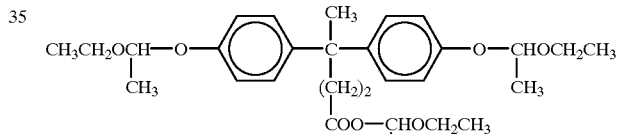
ACC. 1
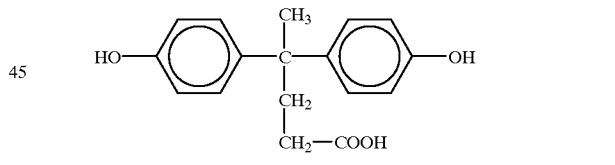
ACC. 2
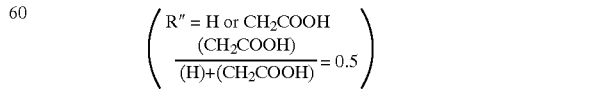

TABLE 2

Resist composition
(proportions in parts by weight appear in parentheses)

| Example | Base resin | Photoacid generator | Dissolution regulator | Basic compound | Other additives | Organic solvent |
|---|---|---|---|---|---|---|
| 1 | Polym. 1 (80) | PAG. 1 (2) | — | TEA (0.1) | — | PGMEA (400)/ EL (100) |
| 2 | Polym. 2 (80) | PAG. 2 (2) | DRR. 1 (4) | PEA (0.1) | ACC. 1 (0.1) | PGMEA (500) |
| 3 | Polym. 3 (80) | PAG. 3 (2) | — | TEA (0.1) | — | PGMEA (500) |
| 4 | Polym. 4 (80) | PAG. 1 (1) PAG. 3 (2) | — | TEA (0.1) | — | PGMEA (400)/ EL (100) |
| 5 | Polym. 5 (80) | PAG. 1 (1) PAG. 3 (2) | — | TMMEA (0.1) | — | PGMEA (400)/ EL (100) |
| 6 | Polym. 6 (80) | PAG. 4 (2) | — | TEA (0.1) | — | PGMEA (530) |
| 7 | Polym. 7 (80) | PAG. 5 (2) | — | TEA (0.1) | — | PGMEA (500) |
| 8 | Polym. 8 (80) | PAG. 2 (2) | — | TEA (0.1) | ACC. 2 (0.1) | PGMEA (500) |
| 9 | Polym. 9 (80) | PAG. 1 (1) PAG. 4 (2) | DRR. 2 (4) | TEA (0.1) | — | PGMEA (500) |
| 10 | Polym. 10 (80) | PAG. 1 (1) PAG. 3 (2) | — | TEA (0.1) | ACC. 1 (0.1) | PGMEA (500) |
| 11 | Polym. 11 (80) | PAG. 1 (1) PAG. 6 (2) | — | TEA (0.1) | — | PGMEA (500) |
| 12 | Polym. 12 (80) | PAG. 1 (1) PAG. 7 (2) | — | TEA (0.1) | — | PGMEA (500) |

TABLE 3

Resist composition
(proportions in parts by weight appear in parentheses)

| Example | Base resin | Photoacid generator | Dissolution regulator | Basic compound | Other additives | Organic solvent |
|---|---|---|---|---|---|---|
| 13 | Polym. 3 (80) | PAG. 1 (1) PAG. 4 (1) PAG. 9 (2) | — | TMMEA (0.1) | — | PGMEA (400)/ EL (100) |
| 14 | Polym. 4 (80) | PAG. 1 (1) PAG. 4 (1) PAG. 10 (2) | — | TMMEA (0.1) | — | PGMEA (400)/ EL (100) |
| 15 | Polym. 5 (80) | PAG. 1 (1) PAG. 4 (1) PAG. 8 (2) | — | TMMEA (0.1) | — | PGMEA (400)/ EL (100) |

TABLE 3-continued

| | Resist composition (proportions in parts by weight appear in parentheses) | | | | | |
|---|---|---|---|---|---|---|
| Example | Base resin | Photoacid generator | Dissolution regulator | Basic compound | Other additives | Organic solvent |
| 16 | Polym. 3 (80) | PAG. 1 (1) PAG. 8 (2) | — | TEA (0.1) | — | PGMEA (400)/ EL (100) |
| 17 | Polym. 1 (40) Polym. 3 (40) | PAG. 1 (1) PAG. 4 (1) PAG. 8 (2) | — | TEA (0.1) | — | PGMEA (400)/ EL (100) |
| 18 | Polym. 1 (60) Polym. 9 (20) | PAG. 4 (1) PAG. 8 (2) | — | TEA (0.1) | — | PGMEA (400)/ EL (100) |

PGMEA: propylene glycol monomethyl ether acetate
EL: ethyl lactate
TEA: triethanol amine
PEA: pyperidine ethanol amine
TMMEA: tris{2-(methoxymethoxy)ethyl}amine
TMEMEA: tris[2-{(2-methoxyethoxy)methoxy}ethyl]amine

TABLE 4

| | Sensitivity: | Resolution ($\mu$m) | | Immediate/ PED 2 hr. | Thermal |
|---|---|---|---|---|---|
| Example | Eop (mJ/cm$^2$) | Immediate | PED 2 hr. | profile | stability |
| 1 | 15 | 0.2 | 0.2 | rectangular | good |
| 2 | 20 | 0.2 | 0.2 | rectangular | good |
| 3 | 25 | 0.2 | 0.2 | rectangular | good |
| 4 | 23 | 0.2 | 0.2 | rectangular | good |
| 5 | 28 | 0.2 | 0.2 | rectangular | good |
| 6 | 24 | 0.2 | 0.2 | rectangular | good |
| 7 | 20 | 0.2 | 0.2 | rectangular | good |
| 8 | 14 | 0.2 | 0.2 | rectangular | good |
| 9 | 12 | 0.2 | 0.2 | rectangular | good |
| 10 | 20 | 0.2 | 0.2 | rectangular | good |
| 11 | 20 | 0.2 | 0.2 | rectangular | good |
| 12 | 15 | 0.2 | 0.2 | rectangular | good |
| 13 | 21 | 0.2 | 0.2 | rectangular | good |
| 14 | 22 | 0.2 | 0.2 | rectangular | good |
| 15 | 25 | 0.2 | 0.2 | rectangular | good |
| 16 | 23 | 0.2 | 0.2 | rectangular | good |
| 17 | 18 | 0.2 | 0.2 | rectangular | good |
| 18 | 19 | 0.2 | 0.2 | rectangular | good |

Good: No change in pattern shape before and after heating.

Next, 0.05% by weight, based on the overall composition, of the acetylene alcohol derivative Olfin E1004 (manufactured by Nisshin Chemical Industry K.K.) having the structural formula shown below was added to the resist compositions of Examples 6, 7, 8, and 9. The resulting resist compositions were examined for shelf stability, as determined based on the increase in particles (foreign matter). In an accelerated test involving storage at 40° C., the number of particles having a size of more than 0.3 $\mu$m in liquid was determined using a particle counter KL-20A (Rion K. K.) for counting particles in a liquid. The results are shown in Table 5.

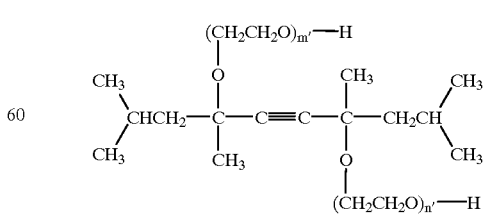

TABLE 5

|  | | Just after filtration (particles/ml) | After 4 months - Olfin not added (particles/ml) | After 4 months - Olfin added (particles/ml) |
|---|---|---|---|---|
| Example | 6 | 3 | 22 | 5 |
|  | 7 | 5 | 21 | 7 |
|  | 8 | 5 | 15 | 7 |
|  | 9 | 4 | 15 | 5 |

Japanese Patent Application No. 291677/1997 is incorporated herein by reference.

Although some preferred embodiments have been a described, many modifications and variations may be made thereto in light of the above teachings. It is therefore to be understood that the invention may be practiced otherwise than as specifically described without departing from the scope of the appended claims.

What is claimed is:

1. A styrene polymer represented by the following general formula (1), terminated with P, and having a weight average molecular weight of 1,000 to 500,000,

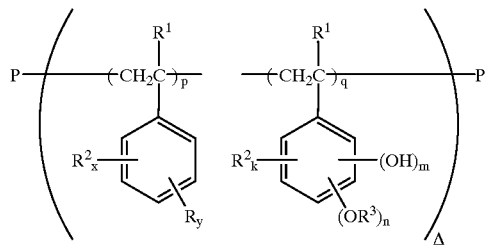

wherein R is hydroxyl or $OR^3$ groups, at least one of R groups being hydroxyl, $R^1$ is hydrogen or methyl, $R^2$ is a normal, branched or cyclic alkyl group of 1 to 30 carbon atoms, $R^3$ is an acid labile group, letter x is 0 or a positive integer, y is a positive integer, satisfying $x+y \leq 5$, k is 0 or a positive integer, m is 0 or a positive integer, n is a positive integer, satisfying $k+m+n \leq 5$, p and q are positive numbers satisfying $0 < q \leq 0.8$ and $p+q=1$, with the proviso that the $R^3$ groups may be the same or different when n is at least 2, $\Delta \leq$ is such a number that the polymer may have a weight average molecular weight of 1,000 to 500,000, P is normal, branched or cyclic alkyl or alkenyl groups of 1 to 30 carbon atoms, aromatic hydrocarbon groups of 6 to 50 carbon atoms, or groups of the following general formula (2), (3) or (4),

wherein $R^4$ is (r+1)-valence aliphatic hydrocarbon groups or alicyclic saturated hydrocarbon groups of 1 to 30 carbon atoms, or aromatic hydrocarbon groups of 6 to 50 carbon atoms, $R^5$ is normal, branched or cyclic alkyl groups of 1 to 30 carbon atoms, aromatic hydrocarbon groups of 6 to 50 carbon atoms, alkoxy groups of 1 to 30 carbon atoms, or hydroxyl, $R^{5a}$ is normal, branched or cyclic alkyl groups of 1 to 30 carbon atoms or aromatic hydrocarbon groups of 6 to 50 carbon atoms, letter h is 0 or 1, and letter r is a positive integer of 1 to 3, wherein the polymer of formula (1) may be crosslinked within a molecule and/or between molecules with a crosslinking group having a C—O—C linkage resulting from reaction of at least one of the phenolic hydroxyl groups represented by R in formula (1), the hydroxyl groups represented by $R^5$ in formula (2), and the hydroxyl groups in formula (3) with an alkenyl ether compound or halogenated alkyl ether compound, and the amount of the acid labile group and the crosslinking group combined is on the average from more than 0 mol % to 80 mol % of the entirety of hydrogen atoms in the phenolic hydroxyl groups in formula (1), the hydroxyl groups represented by $R^5$ in formula (2), and the hydroxyl groups in formula (3).

2. The polymer of claim 1 represented by the following general formula (5):

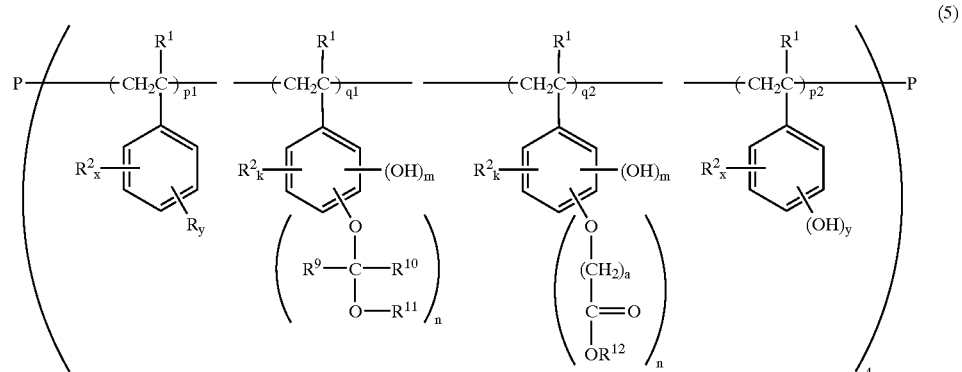

wherein R is hydroxyl or OR³ groups, at least one of the R groups being hydroxyl, $R^1$ is hydrogen or methyl, $R^2$ is a normal, branched or cyclic alkyl group of 1 to 30 carbon atoms, $R^3$ is an acid labile group, $R^9$ and $R^{10}$ are hydrogen or normal, branched or cyclic alkyl groups of 1 to 8 carbon atoms, $R^{11}$ is a monovalent hydrocarbon group of 1 to 18 carbon atoms which may have a hetero atom, or $R^9$ and $R^{10}$, $R^9$ and $R^{11}$, and $R^{10}$ and $R^{11}$, taken together, may form a ring, and each of $R^9$, $R^{10}$ and $R^{11}$ is a normal or branched alkylene group of 1 to 18 carbon atoms when they form a ring, $R^{12}$ is a tertiary alkyl group of 4 to 20 carbon atoms, a trialkylsilyl group whose alkyl groups each have 1 to 6 carbon atoms, an oxoalkyl group of 4 to 20 carbon atoms, or a group represented by —CR⁹R¹⁰OR¹¹, letter a is an integer of 0 to 6, p1 and p2 are positive numbers, q1 and q2 are 0 or positive numbers, satisfying 0<p1/(p1+q1+p2+q2)≦0.8, 0≦q1/(p1+q1+p2+q2)≦0.8, 0≦q2/(p1+q1+p2+q2)≦0.8, and p1+q1+p2+q2 32 1, q1 and q2 are not equal to 0 at the same time, x, y, k, m, n, Δ, and P are as defined above, wherein a hydrogen atom may be eliminated from at least one of the phenolic hydroxyl groups represented by R in formula (5), the hydroxyl groups represented by $R^5$ in formula (2), and the hydroxyl groups in formula (3) to leave an oxygen atom which is crosslinked with a crosslinking group having a C—O—C linkage of the following general formula (6a) or (6b) within a molecule and/or between molecules, and the amount of the acid labile group and the crosslinking group combined is on the average from more than 0 mol % to 80 mol % of the entirety of hydrogen atoms in the phenolic hydroxyl groups represented by R in formula (5), the hydroxyl groups represented by $R^5$ in formula (2), and the hydroxyl groups in formula (3),

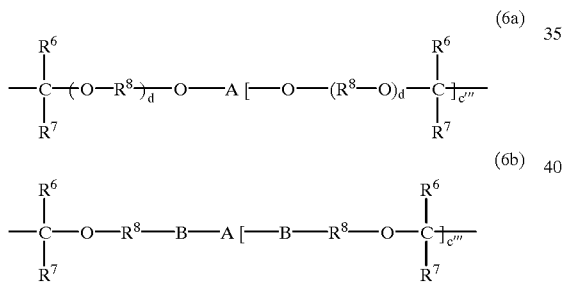

wherein $R^6$ and $R^7$ each are hydrogen or a normal, branched or cyclic alkyl group of 1 to 8 carbon atoms, or $R^6$ and $R^7$, taken together, may form a ring, with the proviso that each of $R^6$ and $R^7$ is a normal or branched alkylene group of 1 to 8 carbon atoms when they form a ring, $R^8$ is a normal, branched or cyclic alkylene group of 1 to 10 carbon atoms, letter d is 0 or an integer of 1 to 10, A is a c-valent aliphatic or alicyclic saturated hydrocarbon group, aromatic hydrocarbon group or heterocyclic group of 1 to 50 carbon atoms, which may have an intervening hetero atom and in which the hydrogen atom attached to a carbon atom may be partially replaced by a hydroxyl group, carboxyl group, acyl group or halogen atom, B is —CO—O—, —NHCO—O— or —NHCONH—, letter c is an integer of 2 to 8, and c' is an integer of 1 to 7.

3. The polymer of claim 1 wherein in formula (1) or (5), $R^3$ is at least one member from the group of the general formula (7) or (8), a tertiary alkyl group of 4 to 20 carbon atoms, a trialkylsilyl group whose alkyl groups each have 1 to 6 carbon atoms, or an oxoalkyl group of 4 to 20 carbon atoms,

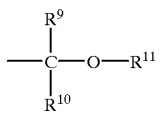

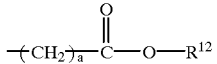

wherein $R^9$ and $R^{10}$ are independently hydrogen or normal, branched or cyclic alkyl groups of 1 to 8 carbon atoms, $R^{11}$ is a monovalent hydrocarbon group of 1 to 18 carbon atoms which may have a hetero atom, or $R^9$ and $R^{10}$; $R^9$ and $R^{11}$, and $R^{10}$ and $R^{11}$, taken together, may form a ring, and each of $R^9$, $R^{10}$ and $R^{11}$ is a normal or branched alkylene group of 1 to 18 carbon atoms when they form a ring, $R^{12}$ is a tertiary alkyl group of 4 to 20 carbon atoms, a trialkylsilyl group whose alkyl groups each have 1 to 6 carbon atoms, an oxoalkyl group of 4 to 20 carbon atoms, or a group represented by formula (7), and letter a is an integer of 0 to 6.

4. The polymer of claim 2 wherein the crosslinking group having a C—O—C linkage represented by the general formula (6a) or (6b) is represented by the following general formula (6a') or (6b'):

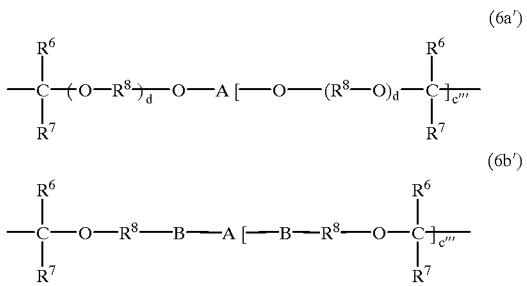

wherein $R^6$ and $R^7$ each are hydrogen or a normal, branched or cyclic alkyl group of 1 to 8 carbon atoms, or $R^6$ and $R^7$, taken together, may form a ring, with the proviso that each of $R^6$ and $R^7$ is a normal or branched alkylene group of 1 to 8 carbon atoms when they form a ring, $R^8$ is a normal, or branched or cyclic alkylene group of 1 to 10 carbon atoms, letter d is 0 or an integer of 1 to 5, A is a c"-valent normal, branched or cyclic alkylene, alkyltriyl or alkyltetrayl group of 1 to 20 carbon atoms or an arylene group of 6 to 30 carbon atoms, which may have an intervening hetero atom and in which the hydrogen atom attached to a carbon atom may be partially replaced by a hydroxyl group, carboxyl group, acyl group or halogen atom, B is —CO—O—, —NHCO—O— or —NHCONH—, letter c" is an integer of 2 to 4, and cm"' is an integer of 1 to 3.

5. A chemically amplified positive resist composition comprising
   (A) an organic solvent,
   (B) a base resin in the form of the polymer of any one of claims 1 to 4, and
   (C) a photoacid generator.

6. A styrene polymer according to claim 1, wherein $R^2$ is a normal, branched or cyclic alkyl group of 1 to 15 carbon atoms.

7. A styrene polymer according to claim 1, wherein $R^2$ is a normal, branched or cyclic alkyl group of 1 to 8 carbon atoms.

8. A styrene polymer according to claim 1, wherein $R^2$ is methyl, ethyl, propyl, isopropyl, n-butyl, isobutyl, tert-butyl, cyclohexyl or cyclopentyl.

9. A styrene polymer according to claim 1 wherein y is 1 to 3.

10. A styrene polymer according to claim 1 wherein y is 1 or 2.

11. A styrene polymer according to claim 1 wherein n is 1 or 2; and m is 0 or 1.

12. A styrene polymer according to claim 1 wherein P has 1 to 15 carbon atoms.

13. A styrene polymer according to claim 1 wherein P has 1 to 8 carbon atoms.

14. A styrene polymer according to claim 1 wherein P is an aromatic hydrocarbon group of 6 to 30 carbon atoms.

15. A styrene polymer according to claim 1 wherein P is an aromatic hydrocarbon group of 6 to 20 carbon atoms.

16. A styrene polymer according to claim 1 wherein P is a normal, branched, or cyclic alkyl or alkenyl group of methyl, ethyl, n-propyl, isopropyl, n-butyl, isobutyl, sec-butyl, tert-butyl, pentyl, hexyl, octyl, nonanyl, decyl, undecyl, dodecyl, tridecyl, pentadecyl, heptadecyl, nonadecyl, docosanyl, heptacosanyl, 2,2-dimethylbutyl, 2,3-dimethylbutyl, 2,2,3-trimethylbutyl, hexamethylethyl, decahydronaphthyl, cyclohexyl, dicyclohexyl, norbornyl, norpinyl, adamantyl, 1,3-dimethyladamantyl, cyclopentyl, vinyl, allyl, butenyl, hexenyl, or cyclohexenyl.

17. A styrene polymer according to claim 1 wherein P is an aromatic hydrocarbon group of phenyl, benzyl, tert-butylbenzyl, diphenyl, triphenyl, naphthyl, anthranyl, 1,2,3-tripentylbenzyl, or hexapentylbenzyl.

18. A styrene polymer according to claim 1, wherein P is created by polymerization stoppers.

19. A styrene polymer represented by the following general formula (1), terminated with P, and having a weight average molecular weight of 1,000 to 500,000,

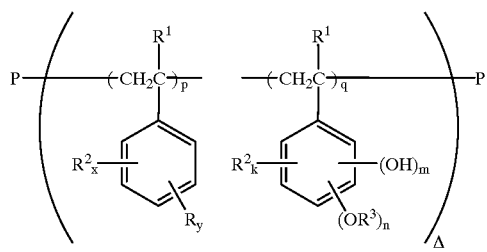

(1)

wherein R is hydroxyl or $OR^3$ groups, at least one of R groups being hydroxyl, $R^1$ is hydrogen or methyl, $R^2$ is a normal, branched or cyclic alkyl group of 1 to 30 carbon atoms, $R^3$ is an acid labile group, letter x is 0 or a positive integer, y is a positive integer, satisfying $x+y \leq 5$, k is 0 or a positive integer, m is 0 or a positive integer, n is a positive integer, satisfying $k+m+n \leq 5$, p and q are positive numbers satisfying $0 < q \leq 0.8$ and $p+q=1$, with the proviso that the $R^3$ groups may be the same or different when n is at least 2, $\Delta \leq$ is such a number that the polymer may have a weight average molecular weight of 1,000 to 500,000, P is created by polymerization stoppers and normal, branched or cyclic alkyl or alkenyl groups of 1 to 30 carbon atoms, aromatic hydrocarbon groups of 6 to 50 carbon atoms, or groups of the following general formula (2), (3) or (4),

 (2)

 (3)

 (4)

wherein $R^4$ is (r+1)-valence aliphatic hydrocarbon groups or alicyclic saturated hydrocarbon groups of 1 to 30 carbon atoms, or aromatic hydrocarbon groups of 6 to 50 carbon atoms, $R^5$ is normal, branched or cyclic alkyl groups of 1 to 30 carbon atoms, aromatic hydrocarbon groups of 6 to 50 carbon atoms, alkoxy groups of 1 to 30 carbon atoms, or hydroxyl, $R^{5a}$ is normal, branched or cyclic alkyl groups of 1 to 30 carbon atoms or aromatic hydrocarbon groups of 6 to 50 carbon atoms, letter h is 0 to 1, and letter r is a positive integer of 1 to 3, wherein the polymer of formula (1) may be crosslinked within a molecule and/or between molecules with a crosslinking group having a C—O—C linkage resulting from reaction of at least on of the phenolic hydroxyl groups represented by R in formula (1), the hydroxyl groups represented by $R^5$ in formula (2), and the hydroxyl groups in formula (3) with an alkenyl ether compound or halogenated alkyl ether compound, and the amount of the acid labile group and the crosslinking group combined is on the average from more than 0 mol % to 80 mol % of the entirety of hydrogen atoms in the phenolic hydroxyl groups in formula (1), the hydroxyl groups represented by $R^5$ in formula (2), and the hydroxyl groups in formula (3).

* * * * *